US010504966B2

(12) United States Patent
Seo et al.

(10) Patent No.: US 10,504,966 B2
(45) Date of Patent: Dec. 10, 2019

(54) LIGHT-EMITTING DEVICE COMPRISING TRANSPARENT CONDUCTIVE FILMS HAVING DIFFERENT THICKNESSES

(71) Applicant: Semiconductor Energy Laboratory Co., Ltd., Atsugi-shi, Kanagawa-ken (JP)

(72) Inventors: Satoshi Seo, Kanagawa (JP); Nobuharu Ohsawa, Kanagawa (JP); Toshiki Sasaki, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 15/695,308

(22) Filed: Sep. 5, 2017

(65) Prior Publication Data

US 2018/0019285 A1 Jan. 18, 2018

Related U.S. Application Data

(63) Continuation of application No. 14/710,115, filed on May 12, 2015, now Pat. No. 9,755,001.

(30) Foreign Application Priority Data

May 15, 2014 (JP) .................... 2014-101116

(51) Int. Cl.
*H01L 29/20* (2006.01)
*H01L 33/00* (2010.01)
(Continued)

(52) U.S. Cl.
CPC ........ *H01L 27/3211* (2013.01); *H01L 27/156* (2013.01); *H01L 27/3213* (2013.01);
(Continued)

(58) Field of Classification Search
CPC ..... H01L 27/3211–3218; H01L 33/405; H01L 33/42; H01L 33/44; H01L 51/504; H01L 51/5265; H01L 51/5278
See application file for complete search history.

(56) References Cited

U.S. PATENT DOCUMENTS 6,847,163 B1  1/2005  Tsutsui et al.
7,271,537 B2  9/2007  Matsuda et al.
(Continued)

FOREIGN PATENT DOCUMENTS

CN     102034850 A    4/2011
EP       1672962 A    6/2006
(Continued)

OTHER PUBLICATIONS

Kashiwabara.M et al., "29.5L: Late-News Paper: Advanced AM-OLED Display Based on White Emitter With Microcavity Structure", SID Digest '04 : SID International Symposium Digest of Technical Papers, 2004, vol. 35, pp. 1017-1019.

*Primary Examiner* — Matthew E. Gordon
(74) *Attorney, Agent, or Firm* — Fish & Richardson P.C.

(57) ABSTRACT

A light-emitting device includes a first light-emitting element emitting blue light, a second light-emitting element emitting green light, and a third light-emitting element emitting red light. A first reflective electrode and a first transparent conductive film, a second reflective electrode and a second transparent conductive film, and a third reflective electrode and a third transparent conductive film are stacked in the first to third light-emitting elements, respectively. A first light-emitting layer, a charge-generation layer, a second light-emitting layer, and an electrode are stacked in this order over each of the first transparent conductive film, the second transparent conductive film, and the third transparent conductive film. The electrode has functions of transmitting and reflecting light. The first to third reflective (Continued)

electrodes contain silver. The first transparent conductive film is thicker than the third transparent conductive film. The third transparent conductive film is thicker than the second transparent conductive film.

12 Claims, 21 Drawing Sheets

(51) Int. Cl.
 H01L 27/32 (2006.01)
 H01L 33/40 (2010.01)
 H01L 27/15 (2006.01)
 H01L 33/44 (2010.01)
 H01L 33/42 (2010.01)
 H01L 51/50 (2006.01)
 H01L 51/52 (2006.01)

(52) U.S. Cl.
 CPC ........... H01L 33/405 (2013.01); H01L 33/42 (2013.01); H01L 33/44 (2013.01); H01L 51/504 (2013.01); H01L 51/5265 (2013.01); H01L 51/5278 (2013.01); H01L 27/322 (2013.01); H01L 2251/558 (2013.01)

(56) References Cited

U.S. PATENT DOCUMENTS

| | | |
|---|---|---|
| 7,462,883 B2 | 12/2008 | Kumaki et al. |
| 7,554,265 B2 | 6/2009 | Godo et al. |
| 7,564,052 B2 | 7/2009 | Kumaki |
| 7,601,988 B2 | 10/2009 | Seo et al. |
| 7,851,989 B2 | 12/2010 | Noda |
| 7,893,427 B2 | 2/2011 | Kumaki et al. |
| 7,915,812 B2 | 3/2011 | Hasegawa |
| 7,973,319 B2 | 7/2011 | Kashiwabara et al. |
| 8,080,934 B2 | 12/2011 | Kido et al. |
| 8,415,686 B2 | 4/2013 | Kashiwabara et al. |
| 8,664,655 B2 | 3/2014 | Lee et al. |
| 8,789,968 B2 | 7/2014 | Ohsawa et al. |
| 8,957,442 B2 | 2/2015 | Seo et al. |
| 9,000,458 B2 | 4/2015 | Seo et al. |
| 9,006,755 B2 | 4/2015 | Seo et al. |
| 9,123,666 B2 | 9/2015 | Kashiwabara et al. |
| 9,172,058 B2 | 10/2015 | Lee et al. |
| 9,373,672 B2 | 6/2016 | Kashiwabara et al. |
| 9,450,209 B2 | 9/2016 | Seo et al. |
| 9,461,092 B2 | 10/2016 | Seo et al. |
| 9,627,453 B2 | 4/2017 | Kashiwabara et al. |
| 9,755,001 B2 * | 9/2017 | Seo ................. H01L 51/504 |
| 9,911,792 B2 | 3/2018 | Kashiwabara et al. |
| 9,935,158 B2 | 4/2018 | Seo et al. |
| 9,947,903 B2 | 4/2018 | Lee et al. |
| 10,084,156 B2 | 9/2018 | Seo et al. |
| 10,347,697 B2 | 7/2019 | Kashiwabara et al. |
| 2005/0218799 A1 | 10/2005 | Hamada |
| 2006/0163597 A1 | 7/2006 | Noda et al. |
| 2006/0284204 A1 | 12/2006 | Yamazaki et al. |
| 2007/0001570 A1 | 1/2007 | Nomura et al. |
| 2007/0069996 A1 | 3/2007 | Kuba et al. |
| 2007/0176161 A1 | 8/2007 | Seo et al. |
| 2011/0062475 A1 | 3/2011 | Cho |
| 2011/0073885 A1 * | 3/2011 | Kim ................. H01L 27/3211 |
| | | 257/89 |
| 2011/0187259 A1 | 8/2011 | Fukuda et al. |
| 2011/0187260 A1 | 8/2011 | Fukuda et al. |
| 2012/0205685 A1 | 8/2012 | Seo et al. |
| 2012/0205686 A1 | 8/2012 | Seo et al. |
| 2012/0205701 A1 | 8/2012 | Sasaki et al. |
| 2012/0206675 A1 | 8/2012 | Seo et al. |
| 2012/0223346 A1 | 9/2012 | Ohsawa et al. |
| 2012/0235126 A1 | 9/2012 | Yamazaki et al. |
| 2012/0256208 A1 | 10/2012 | Hatano |
| 2013/0207138 A1 | 8/2013 | Kashiwabara et al. |
| 2014/0284570 A1 * | 9/2014 | Jinta ................. H01L 27/3218 |
| | | 257/40 |
| 2018/0219048 A1 | 8/2018 | Seo et al. |
| 2018/0241010 A1 | 8/2018 | Lee et al. |

FOREIGN PATENT DOCUMENTS

| | | |
|---|---|---|
| EP | 2487719 A | 8/2012 |
| EP | 2509397 A | 10/2012 |
| EP | 2541602 A | 1/2013 |
| EP | 2975665 A | 1/2016 |
| EP | 3151302 A | 4/2017 |
| EP | 3413369 A | 12/2018 |
| EP | 3447816 A | 2/2019 |
| JP | 2005-116516 A | 4/2005 |
| JP | 2006-278258 A | 10/2006 |
| JP | 2006-302506 A | 11/2006 |
| JP | 2009-231274 A | 10/2009 |
| JP | 2011-165664 A | 8/2011 |
| JP | 2012-182122 A | 9/2012 |
| JP | 2012-182126 A | 9/2012 |
| JP | 2012-182127 A | 9/2012 |
| KR | 2011-0033750 A | 3/2011 |
| KR | 2012-0092507 A | 8/2012 |
| KR | 2012-0092510 A | 8/2012 |
| TW | 201242426 | 10/2012 |
| TW | 201301599 | 1/2013 |

* cited by examiner

LIGHT-EMITTING DEVICE COMPRISING TRANSPARENT CONDUCTIVE FILMS HAVING DIFFERENT THICKNESSES

CROSS-REFERENCE TO RELATED APPLICATIONS

This application is a continuation of U.S. application Ser. No. 14/710,115, filed May 12, 2015, now allowed, which claims the benefit of a foreign priority application filed in Japan as Serial No. 2014-101116 on May 15, 2014, both of which are incorporated by reference.

BACKGROUND OF THE INVENTION

1. Field of the Invention

One embodiment of the present invention relates to a light-emitting element in which a light-emitting layer capable of providing light emission by application of an electric field is provided between a pair of electrodes, and also relates to a light-emitting device, an electronic device, and a lighting device each including such a light-emitting element.

Note that one embodiment of the present invention is not limited to the above technical field. The technical field of one embodiment of the invention disclosed in this specification and the like relates to an object, a method, or a manufacturing method. In addition, one embodiment of the present invention relates to a process, a machine, manufacture, or a composition of matter. Specifically, examples of the technical field of one embodiment of the present invention disclosed in this specification include a semiconductor device, a display device, a liquid crystal display device, a light-emitting device, a lighting device, a power storage device, a storage device, a driving method thereof, and a manufacturing method thereof.

2. Description of the Related Art

In recent years, research and development have been extensively conducted on light-emitting elements utilizing electroluminescence (EL). In a basic structure of these light-emitting elements, a layer containing a light-emitting substance is provided between a pair of electrodes. By application of a voltage to this element, light emission from the light-emitting substance can be obtained.

Since the above light-emitting element is a self-luminous type, a light-emitting device using this light-emitting element has advantages such as high visibility, no necessity of a backlight, and low power consumption. The light-emitting device using the light-emitting element also has advantages in that it can be manufactured to be thin and lightweight and has high response speed.

In order to improve the extraction efficiency of light from a light-emitting element, a method has been proposed, in which a micro optical resonator (microcavity) structure utilizing a resonant effect of light between a pair of electrodes is used to increase the intensity of light having a specific wavelength (e.g., see Patent Document 1).

REFERENCE

[Patent Document]
[Patent Document 1] Japanese Published Patent Application No. 2012-182127

SUMMARY OF THE INVENTION

When a metal film with high reflectivity (e.g., a metal film containing silver) is used as one of a pair of electrodes in a micro optical resonator structure (hereinafter referred to as a microcavity structure) utilizing a resonant effect of light between the pair of electrodes, light might be scattered or absorbed in the vicinity of a surface of the metal film with high reflectivity under the influence of surface plasmon resonance (SPR), resulting in a lower light extraction efficiency.

In view of the above problems, an object of one embodiment of the present invention is to provide a novel light-emitting device. Another object is to provide a novel light-emitting device with a high emission efficiency and a low power consumption. Another object is to provide a method for manufacturing the novel light-emitting device.

Note that the description of the above objects does not disturb the existence of other objects. In one embodiment of the present invention, there is no need to achieve all the objects. Other objects will be apparent and can be derived from the description of the specification and the like.

One embodiment of the present invention is a light-emitting device including a first light-emitting element that emits blue light, a second light-emitting element that emits green light, and a third light-emitting element that emits red light. In the first light-emitting element, a first reflective electrode, a first transparent conductive film, a first light-emitting layer, a charge-generation layer, a second light-emitting layer, and an electrode are stacked in this order. In the second light-emitting element, a second reflective electrode, a second transparent conductive film, the first light-emitting layer, the charge-generation layer, the second light-emitting layer, and the electrode are stacked in this order. In the third light-emitting element, a third reflective electrode, a third transparent conductive film, the first light-emitting layer, the charge-generation layer, the second light-emitting layer, and the electrode are stacked in this order. The electrode has a function of transmitting light and a function of reflecting light. The first to third reflective electrodes each contain silver. The first transparent conductive film is thicker than the third transparent conductive film, and the third transparent conductive film is thicker than the second transparent conductive film. Details of the light-emitting device are described below.

One embodiment of the present invention is a light-emitting device emitting lights of a plurality of colors, which includes a first light-emitting element having a function of emitting blue light, a second light-emitting element having a function of emitting green light, and a third light-emitting element having a function of emitting red light. The first light-emitting element includes a first reflective electrode, a first transparent conductive film over the first reflective electrode, a first light-emitting layer over the first transparent conductive film, a charge-generation layer over the first light-emitting layer, a second light-emitting layer over the charge-generation layer, and an electrode over the second light-emitting layer. The second light-emitting element includes a second reflective electrode, a second transparent conductive film over the second reflective electrode, the first light-emitting layer over the second transparent conductive film, the charge-generation layer over the first light-emitting layer, the second light-emitting layer over the charge-generation layer, and the electrode over the second light-emitting layer. The third light-emitting element includes a third reflective electrode, a third transparent conductive film over the third reflective electrode, the first light-emitting layer over the third transparent conductive film, the charge-generation layer over the first light-emitting layer, the second light-emitting layer over the charge-generation layer, and the electrode over the second light-emitting layer. The electrode has a function of transmitting light and a function of reflecting light. The first to third reflective electrodes each contain silver. The first transparent conductive film has a first region, the second transparent conductive film has a second region, and the third transparent conductive film has a third region. The first region is thicker than the third region, and the third region is thicker than the second region.

In the above structure, preferably, the first light-emitting layer contains a first light-emitting substance that emits light of at least one of violet, blue, and blue green, and the second light-emitting layer contains a second light-emitting substance that emits light of at least one of green, yellow green, yellow, orange, and red. In that case, preferably, the optical path length between the first reflective electrode and the first light-emitting layer is greater than or equal to $3/4\lambda_B$. In addition, preferably, the optical path length between the second reflective electrode and the first light-emitting layer is less than $3/4\lambda_G$, and the optical path length between the third reflective electrode and the first light-emitting layer is less than $3/4\lambda_R$.

In each of the above structures, preferably, the optical path length between the second reflective electrode and the second light-emitting layer is around $3/4\lambda_G$, and the optical path length between the third reflective electrode and the second light-emitting layer is around $3/4\lambda_R$.

Another embodiment of the present invention is a light-emitting device emitting lights of a plurality of colors, which includes a first light-emitting element having a function of emitting blue light, a second light-emitting element having a function of emitting green light, a third light-emitting element having a function of emitting red light, and a fourth light-emitting element having a function of emitting yellow light. The first light-emitting element includes a first reflective electrode, a first transparent conductive film over the first reflective electrode, a first light-emitting layer over the first transparent conductive film, a charge-generation layer over the first light-emitting layer, a second light-emitting layer over the charge-generation layer, and an electrode over the second light-emitting layer. The second light-emitting element includes a second reflective electrode, a second transparent conductive film over the second reflective electrode, the first light-emitting layer over the second transparent conductive film, the charge-generation layer over the first light-emitting layer, the second light-emitting layer over the charge-generation layer, and the electrode over the second light-emitting layer. The third light-emitting element includes a third reflective electrode, a third transparent conductive film over the third reflective electrode, the first light-emitting layer over the third transparent conductive film, the charge-generation layer over the first light-emitting layer, the second light-emitting layer over the charge-generation layer, and the electrode over the second light-emitting layer. The fourth light-emitting element includes a fourth reflective electrode, a fourth transparent conductive film over the fourth reflective electrode, the first light-emitting layer over the fourth transparent conductive film, the charge-generation layer over the first light-emitting layer, the second light-emitting layer over the charge-generation layer, and the electrode over the second light-emitting layer. The electrode has a function of transmitting light and a function of reflecting light. The first to fourth electrodes each contain silver. The first transparent conductive film has a first region, the second transparent conductive film has a second region, the third transparent conductive film has a third region, and the fourth transparent conductive film has a fourth region. The first region is thicker than the third region, the third region is thicker than the fourth region, and the fourth region is thicker than the second region.

In the above structure, preferably, the first light-emitting layer contains a first light-emitting substance that emits blue light, and the second light-emitting layer contains a second light-emitting substance that emits light of at least one of green, yellow, and red. In that case, preferably, the optical path length between the first reflective electrode and the first light-emitting layer is greater than or equal to $3/4\lambda_B$. In addition, preferably, the optical path length between the second reflective electrode and the first light-emitting layer is less than $3/4\lambda_G$, the optical path length between the third reflective electrode and the first light-emitting layer is less than $3/4\lambda_R$, and the optical path length between the fourth reflective electrode and the first light-emitting layer is less than $3/4\lambda_Y$.

In each of the above structures, preferably, the optical path length between the second reflective electrode and the second light-emitting layer is around $3/4\lambda_G$, the optical path length between the third reflective electrode and the second light-emitting layer is around $3/4\lambda_R$, and the optical path length between the fourth reflective electrode and the second light-emitting layer is around $3/4\lambda_Y$.

In each of the above structures, preferably, a first optical element overlapping with the first light-emitting element, a second optical element overlapping with the second light-emitting element, and a third optical element overlapping with the third light-emitting element are provided; the first optical element has a function of transmitting blue light, the second optical element has a function of transmitting green light, and the third optical element has a function of transmitting red light.

One embodiment of the present invention also includes, in its category, an electronic device including the light-emitting device with any of the above structures and a housing or a touch sensor, or a lighting device including the light-emitting device with any of the above structures and a housing or a touch sensor. In addition, a light-emitting device in this specification refers to an image display device or a light source (including a lighting device). Furthermore, a light-emitting device includes, in its category, all of a module in which a light-emitting device is connected to a connector such as a flexible printed circuit (FPC) or a tape carrier package (TCP), a module in which a printed wiring board is provided on the tip of a TCP, and a module in which an integrated circuit (IC) is directly mounted on a light-emitting element by a chip on glass (COG) method.

According to one embodiment of the present invention, a novel light-emitting device can be provided. According to another embodiment of the present invention, a novel light-emitting device with a high emission efficiency and a low power consumption can be provided. According to another embodiment of the present invention, a method for manufacturing the novel light-emitting device can be provided.

Note that the description of these effects does not disturb the existence of other effects. One embodiment of the present invention does not necessarily achieve all the effects listed above. Other effects will be apparent and can be derived from the description of the specification, the drawings, the claims, and the like.

DETAILED DESCRIPTION OF THE INVENTION

Figure 1A:
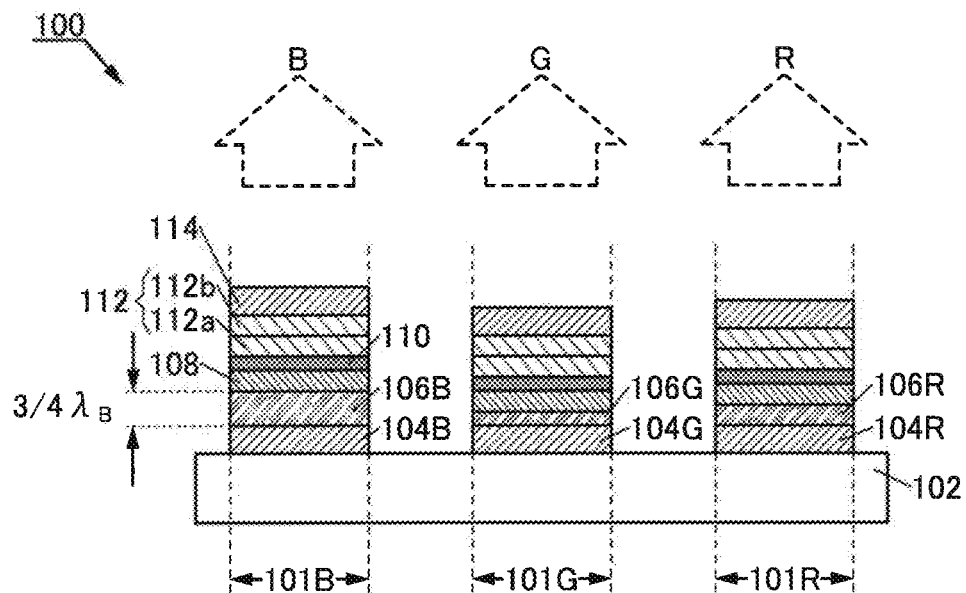
FIGS. 1A and 1B are cross-sectional views each illustrating a light-emitting device according to one embodiment of the present invention.

Embodiments of the present invention will be described in detail below with reference to the drawings. Note that the present invention is not limited to the following description, and the modes and details thereof can be modified in various ways without departing from the spirit and scope of the present invention. Accordingly, the present invention should not be interpreted as being limited to the content of the embodiments below.

Note that the position, the size, the range, or the like of each structure illustrated in drawings and the like is not accurately represented in some cases for easy understanding. Therefore, the disclosed invention is not necessarily limited to the position, the size, the range, or the like disclosed in the drawings and the like.

The ordinal numbers such as "first" and "second" in this specification and the like are used for convenience and do not denote the order of steps or the stacking order of layers. Therefore, for example, description can be made even when "first" is replaced with "second" or "third", as appropriate. In addition, the ordinal numbers in this specification and the like are not necessarily the same as those which specify one embodiment of the present invention.

In order to describe structures of the invention with reference to the drawings in this specification and the like, the same reference numerals are used in common for the same portions in different drawings.

In this specification and the like, blue light has at least one peak of emission spectrum in the wavelength range of greater than or equal to 420 nm and less than or equal to 480 nm, green light has at least one peak of emission spectrum in the wavelength range of greater than or equal to 500 nm and less than 550 nm, yellow light has at least one peak of emission spectrum in the wavelength range of greater than or equal to 550 nm and less than or equal to 580 nm, and red light has at least one peak of emission spectrum in the wavelength range of greater than or equal to 600 nm and less than or equal to 740 nm.

In this specification and the like, a transparent conductive film transmits visible light and has conductivity. Examples of the transparent conductive film include an oxide conductor film typified by an indium tin oxide (ITO) film, an oxide semiconductor film, and an organic conductive film containing an organic substance. Examples of the organic conductive film containing an organic substance include a film containing a composite material in which an organic compound and an electron donor (donor) are mixed and a film containing a composite material in which an organic compound and an electron acceptor (acceptor) are mixed. The resistivity of the transparent conductive film is preferably lower than or equal to $1 \times 10^5$ Ω·cm, more preferably lower than or equal to $1 \times 10^4$ Ω·cm.

In this specification and the like, the terms "film" and "layer" can be interchanged with each other depending on the case or circumstances. For example, the term "conductive layer" can be changed into the term "conductive film" in some cases. Also, the term "insulating film" can be changed into the term "insulating layer" in some cases.

Embodiment 1

In this embodiment, a light-emitting device according to one embodiment of the present invention and a method for manufacturing the light-emitting device will be described below with reference to FIGS. 1A and 1B, FIGS. 2A and 2B, FIG. 3, FIGS. 4A and 4B, FIG. 5, FIG. 6, FIG. 7, FIGS. 8A to 8D, and FIGS. 9A and 9B.

Structural Example 1 of Light-Emitting Device

FIG. 1A is a cross-sectional view illustrating an example of a light-emitting device according to one embodiment of the present invention. A light-emitting device 100 illustrated in FIG. 1A includes a first light-emitting element 101B having a function of emitting blue light, a second light-emitting element 101G having a function of emitting green light, and a third light-emitting element 101R having a function of emitting red light.

The first light-emitting element 101B includes a first reflective electrode 104B, a first transparent conductive film 106B over the first reflective electrode 104B, a first light-emitting layer 108 over the first transparent conductive film 106B, a charge-generation layer 110 over the first light-emitting layer 108, a second light-emitting layer 112 over the charge-generation layer 110, and a semi-transmissive and semi-reflective electrode 114 over the second light-emitting layer 112. The second light-emitting element 101G includes a second reflective electrode 104G, a second transparent conductive film 106G over the second reflective electrode 104G, the first light-emitting layer 108 over the second transparent conductive film 106G, the charge-generation layer 110 over the first light-emitting layer 108, the second light-emitting layer 112 over the charge-generation layer 110, and the semi-transmissive and semi-reflective electrode 114 over the second light-emitting layer 112. The third light-emitting element 101R includes a third reflective electrode 104R, a third transparent conductive film 106R over the third reflective electrode 104R, the first light-emitting layer 108 over the third transparent conductive film 106R, the charge-generation layer 110 over the first light-emitting layer 108, the second light-emitting layer 112 over the charge-generation layer 110, and the semi-transmissive and semi-reflective electrode 114 over the second light-emitting layer 112. Note that the semi-transmissive and semi-reflective electrode 114 is simply referred to as an electrode in some cases.

The first reflective electrode 104B, the second reflective electrode 104G, and the third reflective electrode 104R each contain silver. When the first reflective electrode 104B, the second reflective electrode 104G, and the third reflective electrode 104R are each formed using a material containing silver, the reflectivity can be increased and the emission efficiency of each light-emitting element can be increased. For example, a conductive film containing silver is formed and separated into an island-shape; in this way, the first reflective electrode 104B, the second reflective electrode 104G, and the third reflective electrode 104R can be formed. The first reflective electrode 104B, the second reflective electrode 104G, and the third reflective electrode 104R are preferably formed through a step of processing the same conductive film, because the manufacturing cost can be reduced.

In FIG. 1A, the second light-emitting layer 112 includes a second light-emitting layer 112a and a second light-emitting layer 112b. The second light-emitting layer 112 can have a single-layer structure, a stacked structure including two layers as illustrated in FIG. 1A, or a stacked structure including three or more layers.

The first light-emitting layer 108 contains a first light-emitting substance that emits light of at least one of violet, blue, and blue green, and the second light-emitting layer 112 contains a second light-emitting substance that emits light of at least one of green, yellow green, yellow, orange, and red. When the second light-emitting layer 112 has a stacked structure, the second light-emitting layer 112 may contain light-emitting substances that emit lights of different colors or light-emitting substances that emit light of the same color. For example, a light-emitting substance that emits green light can be used for the second light-emitting layer 112a, and a light-emitting substance that emits red light can be used for the second light-emitting layer 112b. Alternatively, light-emitting substances that emit yellow light can be used for both the second light-emitting layers 112a and 112b.

In such a manner, in the light-emitting device 100, the first light-emitting substance contained in the first light-emitting layer 108 and the second light-emitting substance contained in the second light-emitting layer 112 are selected so that a desired emission wavelength can be amplified, whereby light close to monochromatic light can be obtained. Also, in the light-emitting device 100, light emission from the first light-emitting substance contained in the first light-emitting layer 108 and light emission from the second light-emitting substance contained in the second light-emitting layer 112 can be combined so that white light emission can be obtained.

Figure 2A:
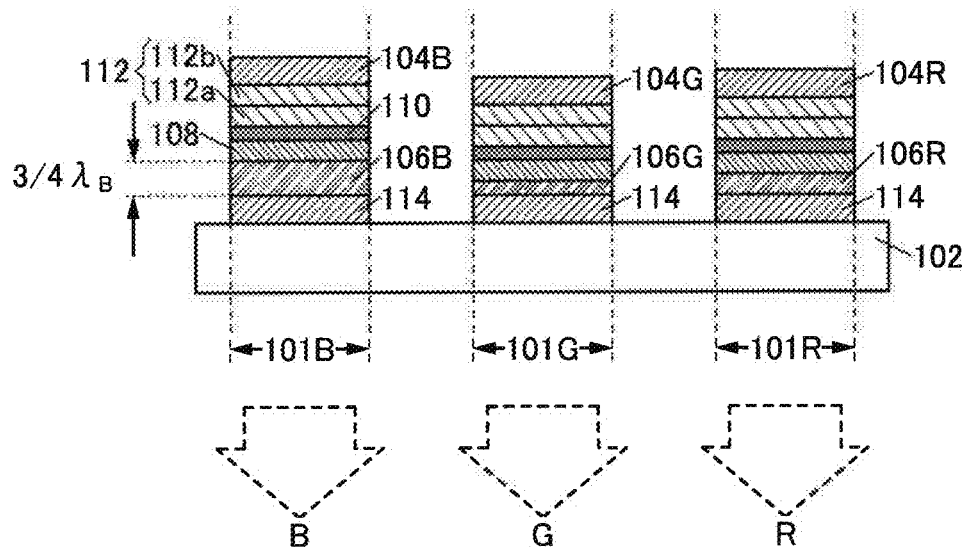
FIGS. 2A and 2B are cross-sectional views each illustrating a light-emitting device according to one embodiment of the present invention.
Figure 2B:
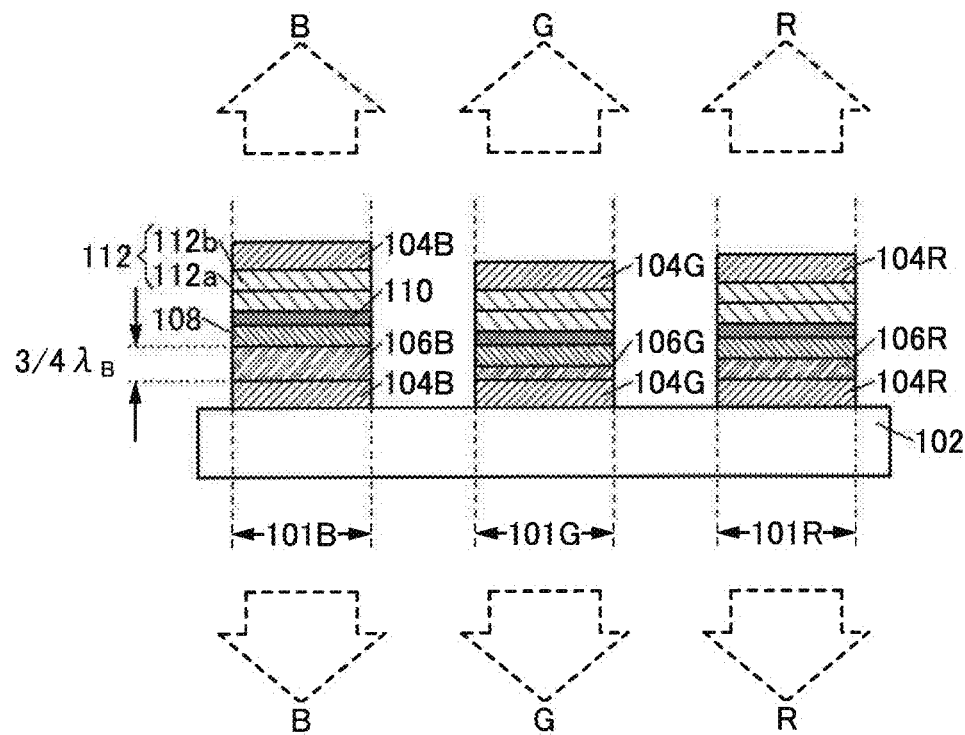

In FIG. 1A, blue light (B), green light (G), and red light (R) emitted from their respective light-emitting elements are schematically denoted by arrows of dashed lines. The same applies to light-emitting devices described later. The light-emitting device 100 illustrated in FIG. 1A has a top-emission structure in which light emitted from light-emitting elements is extracted to the side opposite to the substrate 102 side where the light-emitting elements are formed. However, one embodiment of the present invention is not limited thereto and may have a bottom-emission structure as illustrated in FIG. 2A in which light emitted from light-emitting elements is extracted to the substrate 102 side where the light-emitting elements are formed, or a dual-emission structure as illustrated in FIG. 2B in which light emitted from light-emitting elements is extracted in both top and bottom directions of the substrate 102 where the light-emitting elements are formed.

In FIG. 1A, the first light-emitting layer 108, the charge-generation layer 110, the second light-emitting layer 112, and the semi-transmissive and semi-reflective electrode 114 are separated for the first to third light-emitting elements 101B to 101R; however, they can also be used without being separated. Therefore, in the second light-emitting element 101G and the third light-emitting element 101R, the first light-emitting layer 108, the charge-generation layer 110, the second light-emitting layer 112, and the semi-transmissive and semi-reflective electrode 114 are represented by the same hatching patterns as in the first light-emitting element 101B and not especially denoted by reference numerals.

The first light-emitting element 101B, the second light-emitting element 101G, and the third light-emitting element 101R each have a microcavity structure. The microcavity structure of each light-emitting element will be described below.

Light emitted from the first light-emitting layer 108 and the second light-emitting layer 112 resonates between a pair of electrodes (between the first reflective electrode 104B and the semi-transmissive and semi-reflective electrode 114, between the second reflective electrode 104G and the semi-transmissive and semi-reflective electrode 114, and between the third reflective electrode 104R and the semi-transmissive and semi-reflective electrode 114). In the light-emitting device 100, the thickness of each of the first transparent conductive film 106B, the second transparent conductive film 106G, and the third transparent conductive film 106R in the light-emitting elements is adjusted so that a desired wavelength of light emitted from the first light-emitting layer 108 and the second light-emitting layer 112 can be amplified.

Specifically, the thickness of the first transparent conductive film 106B is adjusted so that the optical path length between the first reflective electrode 104B and the semi-transmissive and semi-reflective electrode 114 can be $m_x \lambda_B/2$ ($m_x$ is a natural number and $\lambda_B$ is a wavelength (greater than or equal to 420 nm and less than or equal to 480 nm) of blue light). In addition, the thickness of the second transparent conductive film 106G is adjusted so that the optical path length between the second reflective electrode 104G and the semi-transmissive and semi-reflective electrode 114 can be $m_y \lambda_G/2$ ($m_y$ is a natural number and $\lambda_G$ is a wavelength (greater than or equal to 500 nm and less than 550 nm) of green light). In addition, the thickness of the third transparent conductive film 106R is adjusted so that the optical path length between the third reflective electrode 104R and the semi-transmissive and semi-reflective electrode 114 can be $m_z \lambda_R/2$ ($m_z$ is a natural number and $\lambda_R$ is a wavelength (greater than or equal to 600 nm and less than or equal to 740 nm) of red light).

By adjusting the thickness of the first transparent conductive film 106B, the optical path length between the first reflective electrode 104B and the first light-emitting layer 108 is set to greater than or equal to $\frac{3}{4}\lambda_B$, preferably greater than or equal to $\frac{3}{4}\lambda_B$ and less than or equal to $\frac{5}{4}\lambda_B$. For example, when the optical path length between the first reflective electrode 104B and the first light-emitting layer 108 is around $\frac{1}{4}\lambda_B$, light is scattered or absorbed in the vicinity of a surface of the first reflective electrode 104B, resulting in a lower light extraction efficiency. However, in the light-emitting device 100, the optical path length between the first reflective electrode 104B and the first light-emitting layer 108 is set to greater than or equal to $\frac{3}{4}\lambda_B$, preferably greater than or equal to $\frac{3}{4}\lambda_B$ and less than or equal to $\frac{5}{4}\lambda_B$, whereby scattering or absorption of light in the vicinity of the surface of the first reflective electrode 104B can be suppressed and thus a high light extraction efficiency can be achieved. Accordingly, in the first light-emitting element 101B, blue light can be efficiently extracted from the first light-emitting substance contained in the first light-emitting layer 108.

By adjusting the thickness of the second transparent conductive film 106G, the optical path length between the second reflective electrode 104G and the first light-emitting layer 108 can be less than $\frac{3}{4} \lambda_G$, preferably greater than or equal to $\frac{1}{4}\lambda_G$ and less than $\frac{3}{4}\lambda_G$. By adjusting the thickness of the second transparent conductive film 106G, the optical path length between the second reflective electrode 104G and the second light-emitting layer 112 can be around $\frac{3}{4}\lambda_G$. By adjusting the thickness of the third transparent conductive film 106R, the optical path length between the third reflective electrode 104R and the first light-emitting layer 108 can be less than $\frac{3}{4}\lambda_R$, preferably greater than or equal to $\frac{1}{4}\lambda_R$ and less than $\frac{3}{4}\lambda_R$. By adjusting the thickness of the third transparent conductive film 106R, the optical path length between the third reflective electrode 104R and the second light-emitting layer 112 can be around $\frac{3}{4}\lambda_R$. When the optical path length is set as described above, green light can be efficiently extracted from the second light-emitting substance contained in the second light-emitting layer 112 in the second light-emitting element 101G, and red light can be efficiently extracted from the second light-emitting substance contained in the second light-emitting layer 112 in the third light-emitting element 101R.

As described above, the first transparent conductive film 106B, the second transparent conductive film 106G, and the third transparent conductive film 106R each have a function of adjusting the optical path length in each light-emitting element. When the optical path length is adjusted in each light-emitting element, the first transparent conductive film 106B is formed to be thicker than the third transparent conductive film 106R, and the third transparent conductive film 106R is formed to be thicker than the second transparent conductive film 106G. In other words, the first transparent conductive film 106B has a first region, the second transparent conductive film 106G has a second region, and the third transparent conductive film 106R has a third region; the first region is thicker than the third region, and the third region is thicker than the second region.

The optical path length between the first reflective electrode 104B and the semi-transmissive and semi-reflective electrode 114 is, to be exact, represented by the product of a refractive index and the thickness from a reflective region in the first reflective electrode 104B to a reflective region in the semi-transmissive and semi-reflective electrode 114. However, it is difficult to precisely determine the positions of the reflective regions in the first reflective electrode 104B and the semi-transmissive and semi-reflective electrode 114; therefore, it is assumed that the above effect can be sufficiently obtained with the reflective regions set in given positions in the first reflective electrode 104B and the semi-transmissive and semi-reflective electrode 114. The same applies to the optical path length between the second reflective electrode 104G and the semi-transmissive and semi-reflective electrode 114 and the optical path length between the third reflective electrode 104R and the semi-transmissive and semi-reflective electrode 114.

Furthermore, the optical path length between the first reflective electrode 104B and the light-emitting layer emitting desired light is, to be exact, the optical path length between the reflective region in the first reflective electrode 104B and a light-emitting region in the light-emitting layer emitting desired light. However, it is difficult to exactly determine the positions of the reflective region in the first reflective electrode 104B and the light-emitting region in the light-emitting layer emitting desired light; therefore, it is assumed that the above effect can be sufficiently obtained with the reflective region and the light-emitting region set in given positions in the first reflective electrode 104B and the light-emitting layer emitting desired light. The same applies to the optical path length between the second reflective electrode 104G and the light-emitting layer emitting desired light and the optical path length between the third reflective electrode 104R and the light-emitting layer emitting desired light.

As described above, in the light-emitting device 100 illustrated in FIG. 1A, the optical path length between the reflective electrode (the first reflective electrode 104B, the second reflective electrode 104G, or the third reflective electrode 104R) and the semi-transmissive and semi-reflective electrode 114 of each light-emitting element is adjusted, whereby scattering or absorption of light in the vicinity of the surface of the reflective electrode can be suppressed and thus a high light extraction efficiency can be achieved. Therefore, a novel light-emitting device with a high emission efficiency and a low power consumption can be provided.

Structural Example 2 of Light-Emitting Device

Next, a structural example different from that of the light-emitting device 100 illustrated in FIG. 1A will be described below with reference to FIG. 1B.

Figure 1B:
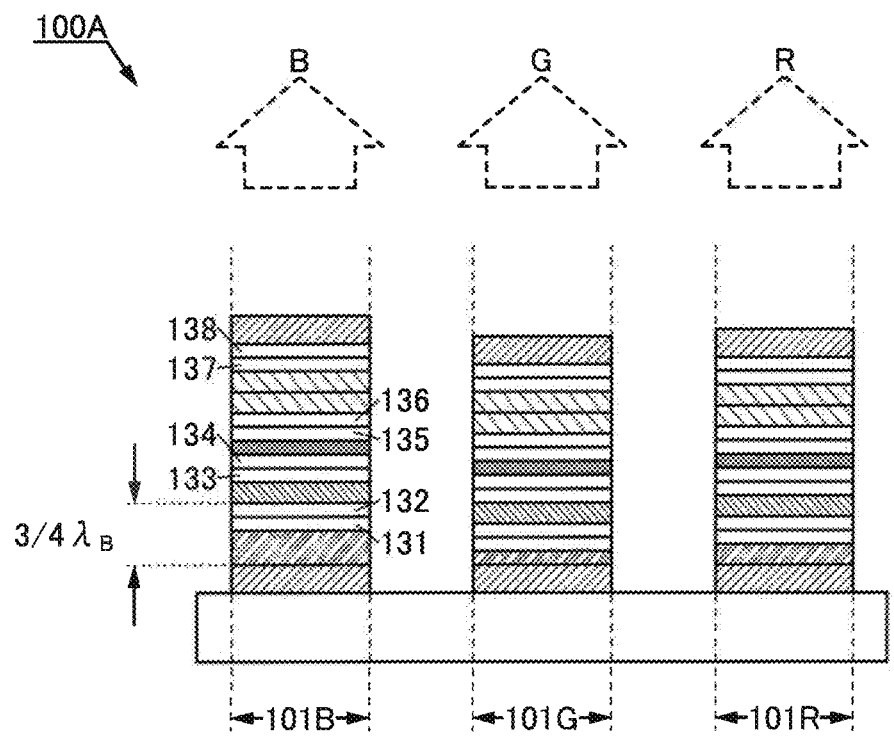

FIG. 1B is a cross-sectional view illustrating an example of a light-emitting device according to one embodiment of the present invention. In FIG. 1B, a portion having a function similar to that in FIG. 1A is represented by the same hatch pattern as in FIG. 1A and not especially denoted by a reference numeral in some cases. In addition, common reference numerals are used for portions having similar functions, and a detailed description of the portions is omitted in some cases.

A light-emitting device 100A illustrated in FIG. 1B includes the first light-emitting element 101B having a function of emitting blue light, the second light-emitting element 101G having a function of emitting green light, and the third light-emitting element 101R having a function of emitting red light.

The first light-emitting element 101B includes the first reflective electrode 104B, the first transparent conductive film 106B over the first reflective electrode 104B, a first hole-injection layer 131 over the first transparent conductive film 106B, a first hole-transport layer 132 over the first hole-injection layer 131, the first light-emitting layer 108 over the first hole-transport layer 132, a first electron-transport layer 133 over the first light-emitting layer 108, a first electron-injection layer 134 over the first electron-transport layer 133, the charge-generation layer 110 over the first electron-injection layer 134, a second hole-injection layer 135 over the charge-generation layer 110, a second hole-transport layer 136 over the second hole-injection layer 135, the second light-emitting layer 112 over the second hole-transport layer 136, a second electron-transport layer 137 over the second light-emitting layer 112, a second electron-injection layer 138 over the second electron-transport layer 137, and the semi-transmissive and semi-reflective electrode 114 over the second electron-injection layer 138.

The second light-emitting element 101G includes the second reflective electrode 104G, the second transparent conductive film 106G over the second reflective electrode 104G, the first hole-injection layer 131 over the second transparent conductive film 106G, the first hole-transport layer 132 over the first hole-injection layer 131, the first light-emitting layer 108 over the first hole-transport layer 132, the first electron-transport layer 133 over the first light-emitting layer 108, the first electron-injection layer 134 over the first electron-transport layer 133, the charge-generation layer 110 over the first electron-injection layer 134, the second hole-injection layer 135 over the charge-generation layer 110, the second hole-transport layer 136 over the second hole-injection layer 135, the second light-emitting layer 112 over the second hole-transport layer 136, the second electron-transport layer 137 over the second light-emitting layer 112, the second electron-injection layer 138 over the second electron-transport layer 137, and the semi-transmissive and semi-reflective electrode 114 over the second electron-injection layer 138.

The third light-emitting element 101R includes the third reflective electrode 104R, the third transparent conductive film 106R over the third reflective electrode 104R, the first hole-injection layer 131 over the third transparent conductive film 106R, the first hole-transport layer 132 over the first hole-injection layer 131, the first light-emitting layer 108 over the first hole-transport layer 132, the first electron-transport layer 133 over the first light-emitting layer 108, the first electron-injection layer 134 over the first electron-transport layer 133, the charge-generation layer 110 over the first electron-injection layer 134, the second hole-injection layer 135 over the charge-generation layer 110, the second hole-transport layer 136 over the second hole-injection layer 135, the second light-emitting layer 112 over the second hole-transport layer 136, the second electron-transport layer 137 over the second light-emitting layer 112, the second electron-injection layer 138 over the second electron-transport layer 137, and the semi-transmissive and semi-reflective electrode 114 over the second electron-injection layer 138.

As described above, in the light-emitting device 100A, the following components are provided in addition to the components of the light-emitting device 100: the first hole-injection layer 131 and the first hole-transport layer 132 between the transparent conductive films (the first transparent conductive film 106B, the second transparent conductive film 106G, and the third transparent conductive film 106R) and the first light-emitting layer 108, the first electron-transport layer 133 and the first electron-injection layer 134 between the first light-emitting layer 108 and the charge-generation layer 110, the second hole-injection layer 135 and the second hole-transport layer 136 between the charge-generation layer 110 and the second light-emitting layer 112, and the second electron-transport layer 137 and the second electron-injection layer 138 between the second light-emitting layer 112 and the semi-transmissive and semi-reflective electrode 114.

In the light-emitting device 100A, the optical path length between the first reflective electrode 104B and the first light-emitting layer 108 is adjusted with the thickness of at least one of the first transparent conductive film 106B, the first hole-injection layer 131, and the first hole-transport layer 132; the optical path length between the second reflective electrode 104G and the first light-emitting layer 108 is adjusted with the thickness of at least one of the second transparent conductive film 106G, the first hole-injection layer 131, and the first hole-transport layer 132; and the optical path length between the third reflective electrode 104R and the first light-emitting layer 108 is adjusted with the thickness of at least one of the third transparent conductive film 106R, the first hole-injection layer 131, and the first hole-transport layer 132.

In this way, the optical path length between the first reflective electrode 104B and the first light-emitting layer 108 may be adjusted by changing the thicknesses of a plurality of layers between the first reflective electrode 104B and the first light-emitting layer 108. The same applies to the optical path length between the second reflective electrode 104G and the first light-emitting layer 108 and the optical path length between the third reflective electrode 104R and the first light-emitting layer 108.

As described above, in the light-emitting device 100A, the following components are provided in each light-emitting element in addition to the components of the light-emitting device 100: the first hole-injection layer 131, the first hole-transport layer 132, the first electron-transport layer 133, the first electron-injection layer 134, the second hole-injection layer 135, the second hole-transport layer 136, the second electron-transport layer 137, and the second electron-injection layer 138. The other components are similar to those of the light-emitting device 100 illustrated in FIG. 1A, and the effect similar to that in the case of the light-emitting device 100 is obtained.

Structural Example 3 of Light-Emitting Device

Next, a structural example different from that of the light-emitting device 100A illustrated in FIG. 1B will be described below with reference to FIG. 3.

Figure 3:
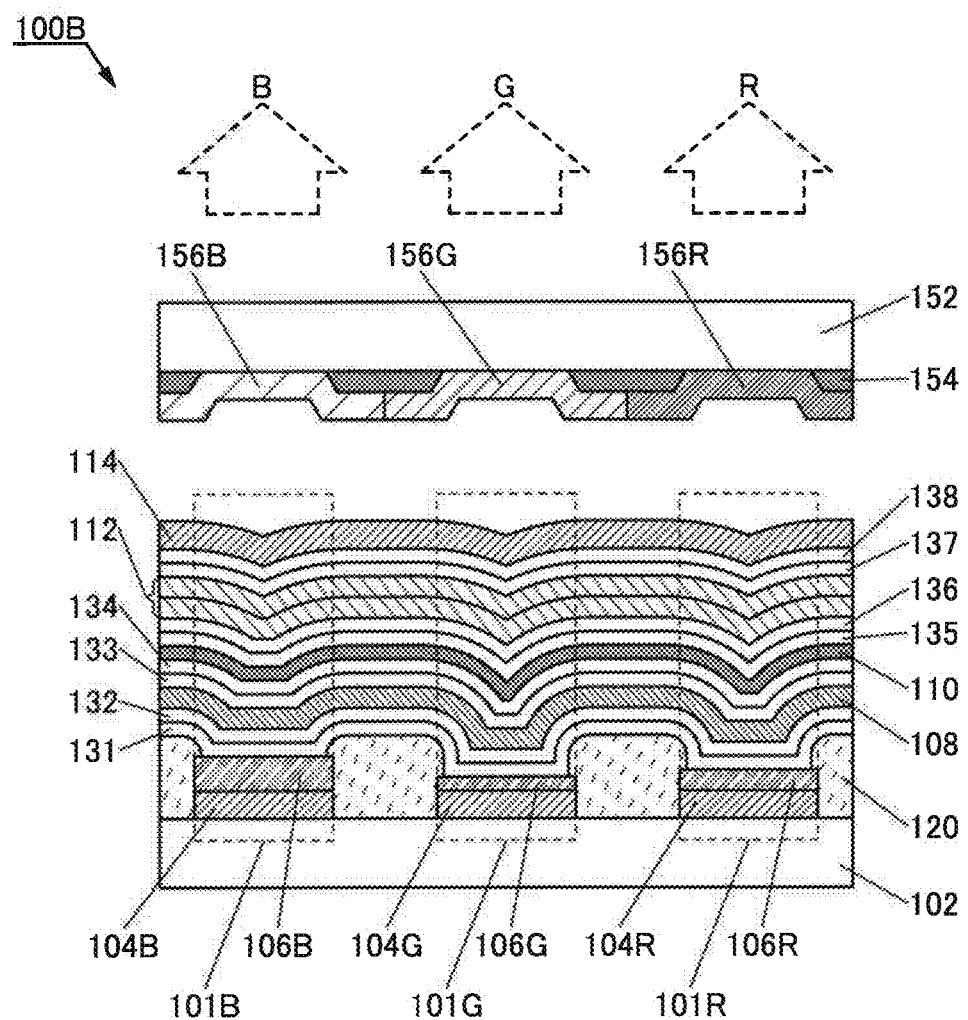
FIG. 3 is a cross-sectional view illustrating a light-emitting device according to one embodiment of the present invention.

A light-emitting device 100B illustrated in FIG. 3 includes a partition wall 120 in addition to the first light-emitting element 101B, the second light-emitting element 101G, and the third light-emitting element 101R included in the light-emitting device 100A illustrated in FIG. 1B. The light-emitting device 100B also includes a substrate 152 that faces the substrate 102. The substrate 152 is provided with a light-blocking layer 154, a first optical element 156B, a second optical element 156G, and a third optical element 156R.

The partition wall 120 has an insulating property. The partition wall 120 covers end portions of a lower electrode (the first reflective electrode 104B, the second reflective electrode 104G, the third reflective electrode 104R, the first transparent conductive film 106B, the second transparent conductive film 106G, or the third transparent conductive film 106R) of each light-emitting element and has an opening that overlaps with the lower electrode.

With the partition wall 120, the lower electrodes of the light-emitting elements can be separated into island-shapes.

The light-blocking layer 154 has a function of blocking light from the adjacent light-emitting element. Note that a structure without the light-blocking layer 154 may also be employed.

The first optical element 156B, the second optical element 156G, and the third optical element 156R each have a function of selectively transmitting light of a particular color out of incident light. With the first optical element 156B, the second optical element 156G, and the third optical element 156R, the color purity of each light-emitting element can be enhanced.

As described above, in the light-emitting device 100B, the following components are provided in addition to the components of the light-emitting device 100A: the partition wall 120 that covers the end portions of the lower electrode of each light-emitting element, and the first optical element 156B, the second optical element 156G, and the third optical element 156R that face the light-emitting elements. With the first optical element 156B, the second optical element 156G, and the third optical element 156R, the color purity of the light-emitting device 100B can be enhanced. The other components are similar to those of the light-emitting device 100A illustrated in FIG. 1B, and the effect similar to that in the case of the light-emitting device 100A is obtained.

Now, other components of the light-emitting device 100 illustrated in FIG. 1A, the light-emitting device 100A illustrated in FIG. 1B, and the light-emitting device 100B illustrated in FIG. 3 will be described in detail below.

<Substrate>

The substrate 102 is used as a support of the light-emitting elements. The substrate 152 is used as a support of the optical elements. For the substrates 102 and 152, for example, glass, quartz, plastics, or the like can be used. Alternatively, a flexible substrate can be used. A flexible substrate is a substrate that can be bent, such as a plastic substrate made of, for example, polycarbonate, polyarylate, or poly(ether sulfone). A film made of polypropylene, polyester, polyvinyl fluoride, polyvinyl chloride, or the like, an inorganic film formed by evaporation, or the like can also be used. Note that other materials can also be used as long as they can function as a support in a manufacturing process of the light-emitting elements and the optical elements.

<Reflective Electrode>

The first reflective electrode 104B, the second reflective electrode 104G, and the third reflective electrode 104R each have a function as a lower electrode or an anode of each light-emitting element. The first reflective electrode 104B, the second reflective electrode 104G, and the third reflective electrode 104R are each formed using a reflective conductive material containing silver. Examples of such a conductive material include silver (Ag) and an alloy containing silver (Ag) and M (M represents Y, Nd, Mg, Al, Ti, Ga, Zn, In, Mn, W, Sn, Fe, Ni, Cu, Pd, Ir, or Au). Examples of the alloy containing silver include an alloy containing silver, palladium, and copper, an alloy containing silver and copper, an alloy containing silver and magnesium, an alloy containing silver and nickel, and an alloy containing silver and gold.

The first reflective electrode 104B, the second reflective electrode 104G, and the third reflective electrode 104R can each be formed using a conductive material whose visible light reflectivity is higher than or equal to 40% and lower than or equal to 100%, preferably higher than or equal to 70% and lower than or equal to 100%, and whose resistivity is lower than or equal to $1\times10^{-2}$ $\Omega\cdot$cm. The first reflective electrode 104B, the second reflective electrode 104G, and the third reflective electrode 104R can each be formed by a sputtering method, an evaporation method, a printing method, a coating method, or the like.

<Transparent Conductive Film>

The first transparent conductive film 106B, the second transparent conductive film 106G, and the third transparent conductive film 106R each have a function as a lower electrode or an anode of each light-emitting element. In addition, the first transparent conductive film 106B, the second transparent conductive film 106G, and the third transparent conductive film 106R each have a function of adjusting the optical path length so that desired light emitted from each light-emitting layer resonates and its wavelength can be amplified.

The first transparent conductive film 106B, the second transparent conductive film 106G, and the third transparent conductive film 106R can each be formed using, for example, ITO, indium oxide-tin oxide containing silicon or silicon oxide (indium tin oxide doped with $SiO_2$, hereinafter referred to as ITSO), indium oxide-zinc oxide (indium zinc oxide), or indium oxide containing tungsten oxide and zinc oxide. In particular, the first transparent conductive film 106B, the second transparent conductive film 106G, and the third transparent conductive film 106R are each preferably formed using a material with a high work function (higher than or equal to 4.0 eV). The first transparent conductive film 106B, the second transparent conductive film 106G, and the third transparent conductive film 106R can each be formed by a sputtering method, an evaporation method, a printing method, a coating method, or the like.

<Semi-Transmissive and Semi-Reflective Electrode>

The semi-transmissive and semi-reflective electrode 114 has a function as an upper electrode or a cathode of each light-emitting element. The semi-transmissive and semi-reflective electrode 114 is formed using a reflective and light-transmitting conductive material. Alternatively, the semi-transmissive and semi-reflective electrode 114 is formed using a reflective conductive material and a light-transmitting conductive material. Examples of such a conductive material include conductive materials whose visible light reflectivity is higher than or equal to 20% and lower than or equal to 80%, preferably higher than or equal to 40% and lower than or equal to 70%, and whose resistivity is lower than or equal to $1\times10^{-2}$ $\Omega\cdot$cm. The semi-transmissive and semi-reflective electrode 114 can be formed using one or more kinds of conductive metals, conductive alloys, conductive compounds, and the like. In particular, it is preferable to use a material with a low work function (lower than or equal to 3.8 eV). Examples of the material include aluminum, silver, an element belonging to Group 1 or 2 of the periodic table (e.g., an alkali metal such as lithium or cesium, an alkaline earth metal such as calcium or strontium, or magnesium), an alloy containing any of these elements (e.g., Ag—Mg or Al—Li), a rare earth metal such as europium or ytterbium, and an alloy containing any of these rare earth metals. The semi-transmissive and semi-reflective electrode 114 can be formed by a sputtering method, an evaporation method, a printing method, a coating method, or the like.

<Light-Emitting Layer>

The first light-emitting layer 108 contains the first light-emitting substance that emits light of at least one of violet, blue, and blue green, and the second light-emitting layer 112 contains the second light-emitting substance that emits light of at least one of green, yellow green, yellow, orange, and red. The first light-emitting layer 108 contains one or both of an electron-transport material and a hole-transport material in addition to the first light-emitting substance. The second light-emitting layer 112 contains one or both of an electron-transport material and a hole-transport material in addition to the second light-emitting substance.

As the first light-emitting substance and the second light-emitting substance, any of light-emitting substances that convert singlet excitation energy into luminescence and light-emitting substances that convert triplet excitation energy into luminescence can be used. Examples of the light-emitting substance are given below.

Examples of the light-emitting substance that converts singlet excitation energy into luminescence include substances that emit fluorescence. For example, the following substances can be used: substances that emit blue light (emission wavelength: greater than or equal to 420 nm and less than or equal to 480 nm) such as N,N-bis[4-(9H-carbazol-9-yl)phenyl]-N,N-diphenylstilbene-4,4'-diamine (abbreviation: YGA2S), 4-(9H-carbazol-9-yl)-4'-(10-phenyl-9-anthryl)triphenylamine (abbreviation: YGAPA), 4-(9H-carbazol-9-yl)-4'-(9,10-diphenyl-2-anthryl)triphenylamine (abbreviation: 2YGAPPA), N,9-diphenyl-N-[4-(10-phenyl-9-anthryl)phenyl]-9H-carbazol-3-amine (abbreviation: PCAPA), 410-phenyl-9-anthryl)-4'-(9-phenyl-9H-carbazol-3-yl)triphenylam ine (abbreviation: PCBAPA), 4-[4-(10-phenyl-9-anthryl)phenyl]-4'-(9-phenyl-9H-carbazol-3-yl)triphenylamine (abbreviation: PCBAPBA), perylene, 2,5,8,11-tetra(tert-butyl)perylene (abbreviation: TBP), N,N-bis[4-(9-phenyl-9H-fluoren-9-yl)phenyl]-N,N-diphenylpyrene-1,6-diamine (abbreviation: 1,6FLPAPrn), and N,N-bis(3-methylphenyl)-N,N-bis[3-(9-phenyl-9H-fluoren-9-yl)phenyl]pyrene-1,6-diamine (abbreviation: 1,6mMemFLPAPrn); and substances that emit yellow light (emission wavelength: greater than or equal to 550 nm and less than or equal to 580 nm) such as rubrene, 5,12-bis(1,1'-biphenyl-4-yl)-6,11-diphenyltetracene (abbreviation: BPT), 2-(2-{2-[4-(dimethylamino)phenyl]ethenyl}-6-methyl-4H-pyran-4-ylidene)propanedinitrile (abbreviation: DCM1), and 2-{2-methyl-6-[2-(2,3,6,7-tetrahydro-1H,5H-benzo[ij]quinolizin-9-yl)ethenyl]-4H-pyran-4-ylidene}propanedinitrile (abbreviation: DCM2).

Examples of the light-emitting substance that converts triplet excitation energy into luminescence include substances that emit phosphorescence. For example, a substance having an emission peak at greater than or equal to 440 nm and less than or equal to 520 nm, a substance having an emission peak at greater than or equal to 520 nm and less than or equal to 600 nm, or a substance having an emission peak at greater than or equal to 600 nm and less than or equal to 700 nm can be used.

Examples of the substance that has an emission peak at greater than or equal to 440 nm and less than or equal to 520 nm include organometallic iridium complexes having 4H-triazole skeletons, such as tris{2-[5-(2-methylphenyl)-4-(2,6-dimethylphenyl)-4H-1,2,4-triazol-3-yl-κN2]phenyl-κC}iridium(III) (abbreviation: Ir(mpptz-dmp)$_3$), tris(5-methyl-3,4-diphenyl-4H-1,2,4-triazolato)iridium(III) (abbreviation: Ir(Mptz)$_3$), and tris[4-(3-biphenyl)-5-isopropyl-3-phenyl-4H-1,2,4-triazolato]iridium(III) (abbreviation: Ir(iPrptz-3b)$_3$); organometallic iridium complexes having 1H-triazole skeletons, such as tris[3-methyl-1-(2-methylphenyl)-5-phenyl-1H-1,2,4-triazolato]iridium (III) (abbreviation: Ir(Mptzl-mp)$_3$) and tris(1-methyl-5-phenyl-3-propyl-1H-1,2,4-triazolato)iridium(III) (abbreviation: Ir(Prptzl-Me)$_3$); organometallic iridium complexes having imidazole skeletons, such as fac-tris[1-(2,6-diisopropylphenyl)-2-phenyl-1H-imidazole]iridium(III) (abbreviation: Ir(iPrpmi)$_3$) and tris[3-(2,6-dimethylphenyl)-7-methylimidazo[1,2-f]phenanthridinato]iridium(III) (abbreviation: Ir(dmpimpt-Me)$_3$); and organometallic iridium complexes in which a phenylpyridine derivative having an electron-withdrawing group is a ligand, such as bis[2-(4',6'-difluorophenyl)pyridinato-N,C$^{2'}$]iridium(III) tetrakis(1-pyrazolyl)borate (abbreviation: FIr6), bis[2-(4',6'-difluorophenyl)pyridinato-N,C$^{2'}$]iridium(III) picolinate (abbreviation: FIrpic), bis[2-[3',5'-bis(trifluoromethyl)phenyl]pyridinato-N,C$^{2'}$]iridium(III) picolinate (abbreviation: Ir(CF3ppy)$_2$(pic)), and bis[2-(4',6'-difluorophenyl)pyridinato-N,C$^{2'}$]iridium(III) acetylacetonate (abbreviation: FIr(acac)). Among the substances given above, the organometallic iridium complex having a 4H-triazole skeleton has a high reliability and a high emission efficiency and is thus especially preferable.

Examples of the substance that has an emission peak at greater than or equal to 520 nm and less than or equal to 600 nm include organometallic iridium complexes having pyrimidine skeletons, such as tris(4-methyl-6-phenylpyrimidinato)iridium(III) (abbreviation: Ir(mppm)$_3$), tris(4-t-butyl-6-phenylpyrimidinato)iridium(III) (abbreviation: Ir(tBuppm)$_3$), (acetylacetonato)bis(6-methyl-4-phenylpyrimidinato)iridium(III) (abbreviation: Ir(mppm)$_2$(acac)), (acetylacetonato)bis(6-tert-butyl-4-phenylpyrimidinato) iridium(III) (abbreviation: Ir(tBuppm)$_2$(acac)), (acetylacetonato)bis[4-(2-norbornyl)-6-phenylpyrimidinato]iridium(III) (abbreviation: Ir(nbppm)$_2$(acac)), (acetylacetonato)bis[5-methyl-6-(2-methylphenyl)-4-phenylpyrimidinato]iridium (III) (abbreviation: Ir(mpmppm)$_2$(acac)), and (acetylacetonato)bis(4,6-diphenylpyrimidinato)iridium(III) (abbreviation: Ir(dppm)$_2$(acac)); organometallic iridium complexes having pyrazine skeletons, such as (acetylacetonato)bis(3,5-dimethyl-2-phenylpyrazinato)iridium(III) (abbreviation: Ir(mppr-Me)$_2$(acac)) and (acetylacetonato)bis(5-isopropyl-3-methyl-2-phenylpyrazinato)iridium(III) (abbreviation: Ir(mppr-iPr)$_2$(acac)); organometallic iridium complexes having pyridine skeletons, such as tris(2-phenylpyridinato-N,C$^{2'}$)iridium(III) (abbreviation: Ir(ppy)$_3$), bis(2-phenylpyridinato-N,C$^{2'}$)iridium(III) acetylacetonate (abbreviation: Ir(ppy)$_2$(acac)), bis(benzo[h]quinolinato) iridium(III) acetylacetonate (abbreviation: Ir(bzq)$_2$(acac)), tris(benzo[h]quinolinato)iridium(III) (abbreviation: Ir(bzq)$_3$), tris(2-phenylquinolinato-N,C$^{2'}$)iridium (III) (abbreviation: Ir(pq)$_3$), and bis(2-phenylquinolinato-N,C$^{2'}$) iridium(II) acetylacetonate (abbreviation: Ir(pq)$_2$(acac)); and a rare earth metal complex such as tris(acetylacetonato) (monophenanthroline)terbium(III) (abbreviation: Tb(acac)$_3$ (Phen)). Among the substances given above, the organometallic iridium complex having a pyrimidine skeleton has distinctively high reliability and emission efficiency and is thus especially preferable.

Among the substances having an emission peak at greater than or equal to 520 nm and less than or equal to 600 nm, a substance having an emission peak at greater than or equal to 550 nm and less than or equal to 580 nm is especially preferably used. With the use of the substance having an emission peak at greater than or equal to 550 nm and less than or equal to 580 nm, the current efficiency of the light-emitting element can be increased.

Examples of the substance having an emission peak at greater than or equal to 550 nm and less than or equal to 580 nm include bis{4,6-dimethyl-2-[6-(2,6-dimethylphenyl)-4-pyrimidinyl-κN3]phenyl-κC} (2,4-pentanedionato-κ$^2$O,O') iridium(III) (abbreviation: Ir(dmppm-dmp)$_2$(acac)).

Examples of the substance that has an emission peak at greater than or equal to 600 nm and less than or equal to 700 nm include organometallic iridium complexes having pyrimidine skeletons, such as (diisobutyrylmethanato)bis[4,6-bis(3-methylphenyl)pyrimidinato]iridium(III) (abbreviation: Ir(5mdppm)$_2$(dibm)), bis[4,6-bis(3-methylphenyl)pyrimidinato](dipivaloylmethanato)iridium(III) (abbreviation: Ir(5mdppm)$_2$(dpm)), and bis[4,6-di(naphthalen-1-yl)pyrimidinato] (dipivaloylmethanato)iridium(III) (abbreviation: Ir(dlnpm)$_2$(dpm)); organometallic iridium complexes having pyrazine skeletons, such as (acetylacetonato)bis(2,3,5-triphenylpyrazinato)iridium(III) (abbreviation: Ir(tppr)$_2$ (acac)), bis(2,3,5-triphenylpyrazinato)(dipivaloylmethanato)iridium(III) (abbreviation: Ir(tppr)$_2$ (dpm)), and (acetylacetonato)bis[2,3-bis(4-fluorophenyl) quinoxalinato]iridium(III) (abbreviation: Ir(Fdpq)$_2$(acac)); organometallic iridium complexes having pyridine skeletons, such as tris(1-phenylisoquinolinato-N,C$^{2'}$)iridium(III) (abbreviation: Ir(piq)$_3$) and bis(1-phenylisoquinolinato-N, C$^{2'}$)iridium(II)acetylacetonate (abbreviation: Ir(piq)$_2$ (acac)); a platinum complex such as 2,3,7,8,12,13,17,18-octaethyl-21H,23H-porphyrin platinum(II) (abbreviation: PtOEP); and rare earth metal complexes such as tris(1,3-diphenyl-1,3-propanedionato) (monophenanthroline)europium(III) (abbreviation: Eu(DBM)$_3$(Phen)) and tris[1-(2-thenoyl)-3,3,3-trifluoroacetonato] (monophenanthroline) europium(III) (abbreviation: Eu(TTA)$_3$(Phen)). Among the substances given above, the organometallic iridium complex having a pyrimidine skeleton has distinctively high reliability and emission efficiency and is thus especially preferable. Furthermore, the organometallic iridium complex having a pyrazine skeleton can provide red light emission with favorable chromaticity.

As the electron-transport material used for the first light-emitting layer 108 and the second light-emitting layer 112, a π-electron deficient heteroaromatic compound such as a nitrogen-containing heteroaromatic compound is preferable, examples of which include quinoxaline derivatives and dibenzoquinoxaline derivatives such as 2-[3-(dibenzothiophen-4-yl)phenyl]dibenzo[f,h]quinoxaline (abbreviation: 2mDBTPDBq-II), 2-[3'-(dibenzothiophen-4-yl)biphenyl-3-yl]dibenzo[f,h]quinoxaline (abbreviation: 2mDBTBPDBq-II), 2-[4-(3,6-diphenyl-9H-carbazol-9-yl)phenyl]dibenzo[f,h]quinoxaline (abbreviation: 2CzPDBq-III), 7-[3-(dibenzothiophen-4-yl)phenyl]dibenzo[f,h]quinoxaline (abbreviation: 7mDBTPDBq-II), and 6-[3-(dibenzothiophen-4-yl)phenyl]dibenzo[f,h]quinoxaline (abbreviation: 6mDBTPDBq-II).

As the hole-transport material used for the first light-emitting layer 108 and the second light-emitting layer 112, a π-electron rich heteroaromatic compound (e.g., a carbazole derivative or an indole derivative) or an aromatic amine compound is preferable, examples of which include 4-phenyl-4'-(9-phenyl-9H-carbazol-3-yl)triphenylamine (abbreviation: PCBA1BP), 4,4'-di(1-naphthyl)-4''-(9-phenyl-9H-carbazol-3-yl)triphenylamine (abbreviation: PCBNBB), 3-[N-(1-naphthyl)-N-(9-phenylcarbazol-3-yl)amino]-9-phenylcarbazole (abbreviation: PCzPCN1), 4,4',4''-tris[N-(1-naphthyl)-N-phenylamino]triphenylamine (abbreviation: 1'-TNATA), 2,7-bis[N-(4-diphenylaminophenyl)-N-phenylamino]-spiro-9,9'-bifluorene (abbreviation: DPA2SF), N,N'-bis(9-phenylcarbazol-3-yl)-N,N-diphenylbenzene-1,3-diamine (abbreviation: PCA2B), N-(9,9-dimethyl-2-diphenylamino-9H-fluoren-7-yl)diphenylamine (abbreviation: DPNF), N,N',N''-triphenyl-N,N',N''-tris(9-phenylcarbazol-3-yl) benzene-1,3,5-triamine (abbreviation: PCA3B), 2-[N-(9-phenylcarbazol-3-yl)-N-phenylamino]spiro-9,9'-bifluorene (abbreviation: PCASF), 2-[N-(4diphenylaminophenyl)-N-phenylamino]spiro-9,9'-bifluorene (abbreviation: DPASF), N,N'-bis[4-(carbazol-9-yl)phenyl]-N,N'-diphenyl-9,9-dimethylfluorene-2,7-diamine (abbreviation: YGA2F), 4,4'-bis [N-(3-methylphenyl)-N-phenylamino]biphenyl (abbreviation: TPD), 4,4'-bis[N-(4-diphenylaminophenyl)-N-phenylamino]biphenyl (abbreviation: DPAB), N-(9,9-dimethyl-9H-fluoren-2-yl)-N-{9,9-dimethyl-2-[N-phenyl-N'-(9,9-dimethyl-9H-fluoren-2-yl)amino]-9H-fluoren-7-yl}phenylamine (abbreviation: DFLADFL), 3-[N-(9-phenylcarbazol-3-yl)-N-phenylamino]-9-phenylcarbazole (abbreviation: PCzPCA1), 3-[N-(4-diphenylaminophenyl)-N-phenylamino]-9-phenylcarbazole (abbreviation: PCzDPA1), 3,6-bis[N-(4-diphenylaminophenyl)-N-phenylamino]-9-phenylcarbazole (abbreviation: PCzDPA2), 4,4'-bis(N-{4-[AP-(3-methylphenyl)-N'-phenylamino]phenyl}-N-phenylamino)biphenyl (abbreviation: DNTPD), 3,6-bis[N-(4-diphenylaminophenyl)-N-(1-naphthyl)amino]-9-phenylcarbazole (abbreviation: PCzTPN2), and 3,6-bis[N-(9-phenylcarbazol-3-yl)-N-phenylamino]-9-phenylcarbazole (abbreviation: PCzPCA2).

<Hole-Injection Layer and Hole-Transport Layer>

The first hole-injection layer 131 injects holes into the first light-emitting layer 108 through the first hole-transport layer 132 with a high hole-transport property and contains a hole-transport material and an acceptor material. The first hole-injection layer 131 contains a hole-transport material and an acceptor material, so that electrons are extracted from the hole-transport material by the acceptor material to generate holes, and the holes are injected into the first light-emitting layer 108 through the first hole-transport layer 132. The first hole-injection layer 131 may have a structure in which a hole-transport material and an acceptor material are stacked. The first hole-transport layer 132 is formed using a hole-transport material. The second hole-injection layer 135 injects holes into the second light-emitting layer 112 through the second hole-transport layer 136 with a high hole-transport property and contains a hole-transport material and an acceptor material. The second hole-injection layer 135 contains a hole-transport material and an acceptor material, so that electrons are extracted from the hole-transport material by the acceptor material to generate holes, and the holes are injected into the second light-emitting layer 112 through the second hole-transport layer 136. The second hole-injection layer 135 may have a structure in which a hole-transport material and an acceptor material are stacked. The second hole-transport layer 136 is formed using a hole-transport material.

Examples of the hole-transport material used for the first hole-injection layer 131, the first hole-transport layer 132, the second hole-injection layer 135, and the second hole-transport layer 136 include aromatic amine compounds such as 4,4'-bis[N-(1-naphthyl)-N-phenylamino]biphenyl (abbreviation: NPB or α-NPD), N,N-bis(3-methylphenyl)-N,N-diphenyl-[1,1'-biphenyl]-4,4'-diamine (abbreviation: TPD), 4,4',4''-tris(carbazol-9-yl)triphenylamine (abbreviation: TCTA), 4,4',4''-tris(N,N-diphenylamino)triphenylamine (abbreviation: TDATA), 4,4',4''-tris[N-(3-methylphenyl)-N-phenylamino]triphenylamine (abbreviation: MTDATA), and 4,4'-bis[N-(spiro-9,9'-bifluoren-2-yl)-N-phenylamino]biphenyl (abbreviation: BSPB); 3-[N-(9-phenylcarbazol-3-yl)-N-phenylamino]-9-phenylcarbazole (abbreviation: PCz- PCA1); 3,6-bis[N-(9-phenylcarbazol-3-yl)-N-phenylamino]-9-phenylcarbazole (abbreviation: PCzPCA2); and 3-[N-(1-naphthyl)-N-(9-phenylcarbazol-3-yl)amino]-9-phenylcarbazole (abbreviation: PCzPCN1). Examples further include carbazole derivatives such as 4,4'-di(N-carbazolyl)biphenyl (abbreviation: CBP), 1,3,5-tris[4-(N-carbazolyl)phenyl]benzene (abbreviation: TCPB), and 9-[4-(10-phenyl-9-anthracenyl)phenyl]-9H-Carbazole (abbreviation: CzPA). The substances described here are mainly substances having a hole mobility of higher than or equal to $1 \times 10^6$ cm$^2$/Vs. Note that other substances may also be used as long as their hole-transport properties are higher than their electron-transport properties.

Furthermore, a high molecular compound such as poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N'-phenylamino}phenyl)methacrylamide] (abbreviation: PTPDMA), or poly[N,N'-bis(4-butylphenyl)-N,N'-bis(phenyl)benzidine] (abbreviation: Poly-TPD) can be used.

Examples of the acceptor material used for the first hole-injection layer 131 and the second hole-injection layer 135 include compounds having an electron-withdrawing group (a halogen group or a cyano group) such as 7,7,8,8-tetracyano-2,3,5,6-tetrafluoroquinodimethane (abbreviation: F$_4$-TCNQ), chloranil, and 2,3,6,7,10,11-hexacyano-1,4,5,8,9,12-hexaazatriphenylene (HAT-CN). In particular, a compound in which electron-withdrawing groups are bonded to a condensed aromatic ring having a plurality of hetero atoms, like HAT-CN, is thermally stable and preferable. A transition metal oxide can also be used. Oxides of metals belonging to Groups 4 to 8 of the periodic table can also be used. Specifically, it is preferable to use vanadium oxide, niobium oxide, tantalum oxide, chromium oxide, molybdenum oxide, tungsten oxide, manganese oxide, or rhenium oxide because of their high electron-accepting properties. Molybdenum oxide is especially preferable because it is stable in the air, has a low hygroscopic property, and is easy to handle.

The first hole-injection layer 131 and the second hole-injection layer 135 may also be formed using the above-described acceptor material alone or using the above-described acceptor material and another material in combination. In that case, the acceptor material extracts electrons from the hole-transport layer, so that holes can be injected into the hole-transport layer. The acceptor material transfers the extracted electrons to the anode.

<Electron-Transport Layer>

The first electron-transport layer 133 and the second electron-transport layer 137 each contain a substance with a high electron-transport property. The first electron-transport layer 133 and the second electron-transport layer 137 can each be formed using a metal complex such as Alq$_3$, tris(4-methyl-8-quinolinolato)aluminum (abbreviation: Almq$_3$), bis(10-hydroxybenzo[h]quinolinato)beryllium (abbreviation: BeBq2), BAlq, bis[2-(2-benzoxazolyl)phenolato]zinc(II) (abbreviation: Zn(BOX)$_2$), or bis[2-(2-hydroxyphenyl)benzothiazolato]zinc (abbreviation: Zn(BTZ)$_2$). Furthermore, a heteroaromatic compound such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-tert-butylphenyl)-4-phenyl-5-(4-biphenylyl)-1,2,4-triazole (abbreviation: TAZ), 3-(4-tert-butylphenyl)-4-(4-ethylphenyl)-5-(4-biphenylyl)-1,2,4-triazole (abbreviation: p-EtTAZ), bathophenanthroline (abbreviation: Bphen), bathocuproine (abbreviation: BCP), or 4,4'-bis(5-methylbenzoxazol-2-yl) stilbene (abbreviation: BzOs) can be used. Furthermore, a high molecular compound such as poly(2,5-pyridinediyl) (abbreviation: PPy), poly[(9,9-dihexylfluorene-2,7-diyl)-co-(pyridine-3,5-diyl)] (abbreviation: PF-Py), or poly[(9,9-dioctylfluorene-2,7-diyl)-co-(2,2'-bipyridine-6,6'-diyl)] (abbreviation: PF-BPy) can be used. The substances mentioned here are mainly substances having an electron mobility of higher than or equal to $1 \times 10^{-6}$ cm$^2$/Vs. Note that other substances may also be used for the first electron-transport layer 133 and the second electron-transport layer 137 as long as their electron-transport properties are higher than their hole-transport properties.

The first electron-transport layer 133 and the second electron-transport layer 137 are not limited to a single layer, and may be a stack of two or more layers containing any of the above substances.

<Electron-Injection Layer>

The first electron-injection layer 134 and the second electron-injection layer 138 each contain a substance with a high electron-injection property. The first electron-injection layer 134 and the second electron-injection layer 138 can each be formed using an alkali metal, an alkaline earth metal, or a compound thereof, such as lithium fluoride (LiF), cesium fluoride (CsF), calcium fluoride (CaF$_2$), or lithium oxide (LiOn). Furthermore, a rare earth metal compound such as erbium fluoride (ErF$_3$) can be used. An electride may also be used for the first electron-injection layer 134 and the second electron-injection layer 138. Examples of the electride include a substance in which electrons are added at a high concentration to calcium oxide-aluminum oxide.

A composite material in which an organic compound and an electron donor (donor) are mixed may also be used for the first electron-injection layer 134 and the second electron-injection layer 138. Such a composite material is excellent in electron-injection property and electron-transport property, since electrons are generated in the organic compound by the electron donor. The organic compound in such a case is preferably a material excellent in transporting the generated electrons, specific examples of which include a substance for forming the first electron-transport layer 133 and the second electron-transport layer 137 (e.g., a metal complex or a heteroaromatic compound), which is described above. As the electron donor, a substance showing an electron-donating property with respect to the organic compound may be used. Specifically, an alkali metal, an alkaline earth metal, and a rare earth metal are preferable, and lithium, cesium, magnesium, calcium, erbium, ytterbium, and the like can be given. Furthermore, an alkali metal oxide and an alkaline earth metal oxide are preferable, and lithium oxide, calcium oxide, barium oxide, and the like can be given. Lewis base such as magnesium oxide can also be used. An organic compound such as tetrathiafulvalene (abbreviation: TTF) can also be used.

<Charge-Generation Layer>

The charge-generation layer 110 has a function of injecting electrons into one of the light-emitting layers (the first light-emitting layer 108 or the second light-emitting layer 112) and injecting holes into the other light-emitting layer (the first light-emitting layer 108 or the second light-emitting layer 112), when a voltage is applied between the pair of electrodes (the lower electrode and the upper electrode).

For example, in the first light-emitting element 101B illustrated in FIG. 1A, when a voltage is applied such that the potential of the lower electrode (the first reflective electrode 104B and the first transparent conductive film 106B) is higher than that of the semi-transmissive and semi-reflective electrode 114, the charge-generation layer 110 injects electrons into the first light-emitting layer 108 and injects holes into the second light-emitting layer 112. In the first light-emitting element 101B illustrated in FIG. 1B, when a voltage is applied such that the potential of the lower electrode (the first reflective electrode 104B and the first transparent conductive film 106B) is higher than that of the semi-transmissive and semi-reflective electrode 114, the charge-generation layer 110 injects electrons into the first electron-injection layer 134 and injects holes into the second hole-injection layer 135.

Note that in terms of light extraction efficiency, the charge-generation layer 110 preferably transmits visible light (specifically, the charge-generation layer 110 has a visible light transmittance of higher than or equal to 40%). The charge-generation layer 110 functions even if it has lower conductivity than the pair of electrodes (the lower electrode and the upper electrode).

The charge-generation layer 110 may have either a structure in which an electron acceptor (acceptor) is added to a hole-transport material or a structure in which an electron donor (donor) is added to an electron-transport material. Alternatively, both of these structures may be stacked.

By forming the charge-generation layer 110 using any of the above materials, it is possible to suppress an increase in driving voltage caused when the light-emitting layers are stacked.

The above-described light-emitting layer, hole-transport layer, hole-injection layer, electron-transport layer, electron-injection layer, and charge-generation layer can each be formed by any of the following methods: a sputtering method, an evaporation method (including a vacuum evaporation method), a printing method (such as relief printing, intaglio printing, gravure printing, planography printing, and stencil printing), an ink-jet method, a coating method, and the like.

<Light-Blocking Layer>

The light-blocking layer 154 has a function of blocking light emitted from the adjacent light-emitting element and preventing mixture of light. In addition, the light-blocking layer 154 has a function of reducing the reflection of external light. As the light-blocking layer 154, a metal, a resin containing black pigment, carbon black, a metal oxide, a composite oxide containing a solid solution of a plurality of metal oxides, or the like can be used.

<Optical Element>

The first optical element 156B, the second optical element 156G, and the third optical element 156R each selectively transmit light of a particular color out of incident light. For example, a color filter, a band pass filter, a multilayer filter, or the like can be used. Color conversion elements can also be used as the optical elements. A color conversion element is an optical element that converts incident light into light having a longer wavelength than the incident light. As the color conversion elements, quantum-dot elements are favorably used. The usage of the quantum-dot elements can increase the color reproducibility of the light-emitting device.

The first optical element 156B transmits blue light out of light emitted from the first light-emitting element 101B. The second optical element 156G transmits green light out of light emitted from the second light-emitting element 101G. The third optical element 156R transmits red light out of light emitted from the third light-emitting element 101R.

A plurality of optical elements may also be stacked over each of the first light-emitting element 101B, the second light-emitting element 101G, and the third light-emitting element 101R. As the optical element, a circularly polarizing plate, an anti-reflective film, or the like can also be used, for example. A circularly polarizing plate provided on the side where light emitted from the light-emitting element of the light-emitting device is extracted can prevent a phenomenon in which light entering from the outside of the light-emitting device is reflected in the light-emitting device and emitted to the outside. An anti-reflective film can weaken external light reflected by a surface of the light-emitting device. Accordingly, light emitted from the light-emitting device can be observed clearly.

Structural Example 4 of Light-Emitting Device

Next, a structural example different from that of the light-emitting device 100 illustrated in FIG. 1A will be described below with reference to FIG. 4A.

Figure 4A:
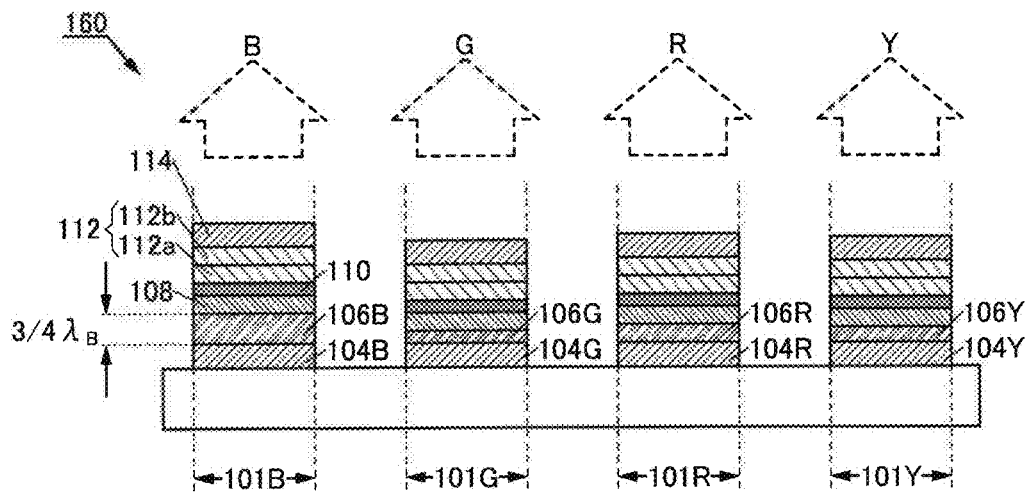
FIGS. 4A and 4B are cross-sectional views each illustrating a light-emitting device according to one embodiment of the present invention.

FIG. 4A is a cross-sectional view illustrating an example of a light-emitting device according to one embodiment of the present invention. A light-emitting device 160 illustrated in FIG. 4A includes the first light-emitting element 101B having a function of emitting blue light, the second light-emitting element 101G having a function of emitting green light, the third light-emitting element 101R having a function of emitting red light, and a fourth light-emitting element 101Y having a function of emitting yellow light.

The first light-emitting element 101B, the second light-emitting element 101G, and the third light-emitting element 101R have structures similar to those of the first light-emitting element 101B, the second light-emitting element 101G, and the third light-emitting element 101R, respectively, illustrated in FIG. 1A. The fourth light-emitting element 101Y includes a fourth reflective electrode 104Y, a fourth transparent conductive film 106Y over the fourth reflective electrode 104Y, the first light-emitting layer 108 over the fourth transparent conductive film 106Y, the charge-generation layer 110 over the first light-emitting layer 108, the second light-emitting layer 112 over the charge-generation layer 110, and the semi-transmissive and semi-reflective electrode 114 over the second light-emitting layer 112.

The first reflective electrode 104B, the second reflective electrode 104G, the third reflective electrode 104R, and the fourth reflective electrode 104Y each contain silver. When the first reflective electrode 104B, the second reflective electrode 104G, the third reflective electrode 104R, and the fourth reflective electrode 104Y are each formed using a material containing silver, the reflectivity can be increased and the emission efficiency of each light-emitting element can be increased. For example, a conductive film containing silver is formed and separated into an island-shape; in this way, the first reflective electrode 104B, the second reflective electrode 104G, the third reflective electrode 104R, and the fourth reflective electrode 104Y can be formed. The first reflective electrode 104B, the second reflective electrode 104G, the third reflective electrode 104R, and the fourth reflective electrode 104Y are preferably formed through a step of processing the same conductive film, because the manufacturing cost can be reduced.

In FIG. 4A, the second light-emitting layer 112 includes the second light-emitting layer 112a and the second light-emitting layer 112b. The second light-emitting layer 112 can have a single-layer structure, a stacked structure including two layers as illustrated in FIG. 4A, or a stacked structure including three or more layers.

In FIG. 4A, the first light-emitting layer 108, the charge-generation layer 110, the second light-emitting layer 112, and the semi-transmissive and semi-reflective electrode 114 are separated for the first to fourth light-emitting elements 101B to 101Y; however, they can also be used without being separated. Therefore, in the second light-emitting element 101G, the third light-emitting element 101R, and the fourth light-emitting element 101Y, the first light-emitting layer 108, the charge-generation layer 110, the second light-emitting layer 112, and the semi-transmissive and semi-reflective electrode 114 are represented by the same hatching patterns as in the first light-emitting element 101B and not especially denoted by reference numerals.

As described above, in the light-emitting device 160 illustrated in FIG. 4A, the fourth light-emitting element 101Y is provided in addition to the components of the light-emitting device 100 illustrated in FIG. 1A.

The fourth light-emitting element 101Y in the light-emitting device 160 will be described in detail below.

The fourth light-emitting element 101Y has a microcavity structure. Light emitted from the first light-emitting layer 108 and the second light-emitting layer 112 resonates between a pair of electrodes (between the fourth reflective electrode 104Y and the semi-transmissive and semi-reflective electrode 114). In the light-emitting device 160, the thickness of the fourth transparent conductive film 106Y in the fourth light-emitting element 101Y is adjusted so that a desired emission wavelength of light emitted from the first light-emitting layer 108 and the second light-emitting layer 112 can be amplified.

Specifically, the thickness of the fourth transparent conductive film 106Y is adjusted so that the optical path length between the fourth reflective electrode 104Y and the semi-transmissive and semi-reflective electrode 114 can be $m_w\lambda_Y/2$ ($m_w$ is a natural number and $\lambda_Y$ is a wavelength (greater than or equal to 550 nm and less than or equal to 580 nm) of yellow light).

By adjusting the thickness of the fourth transparent conductive film 106Y, the optical path length between the fourth reflective electrode 104Y and the first light-emitting layer 108 can be less than $\frac{3}{4}\lambda_Y$, preferably greater than or equal to $\frac{1}{4}\lambda_Y$ and less than $\frac{3}{4}\lambda_Y$. By adjusting the thickness of the fourth transparent conductive film 106Y, the optical path length between the fourth reflective electrode 104Y and the second light-emitting layer 112 can be around $\frac{3}{4}\lambda_Y$. When the optical path length is set as described above, yellow light can be efficiently extracted from the second light-emitting substance contained in the second light-emitting layer 112 in the fourth light-emitting element 101Y.

As described above, the fourth transparent conductive film 106Y has a function of adjusting the optical path length in the fourth light-emitting element 101Y. When the optical path length is adjusted in each light-emitting element, the first transparent conductive film 106B is formed to be thicker than the third transparent conductive film 106R, the third transparent conductive film 106R is formed to be thicker than the fourth transparent conductive film 106Y, and the fourth transparent conductive film 106Y is formed to be thicker than the second transparent conductive film 106G. In other words, the first transparent conductive film 106B has a first region, the second transparent conductive film 106G has a second region, the third transparent conductive film 106R has a third region, and the fourth transparent conductive film 106Y has a fourth region; the first region is thicker than the third region, the third region is thicker than the fourth region, and the fourth region is thicker than the second region.

As described above, in the light-emitting device 160, the fourth light-emitting element 101Y is provided in addition to the components of the light-emitting device 100. The other components are similar to those of the light-emitting device 100 illustrated in FIG. 1A, and the effect similar to that in the case of the light-emitting device 100 is obtained.

Structural Example 5 of Light-Emitting Device

Next, a structural example different from that of the light-emitting device 160 illustrated in FIG. 4A will be described below with reference to FIG. 4B.

Figure 4B:
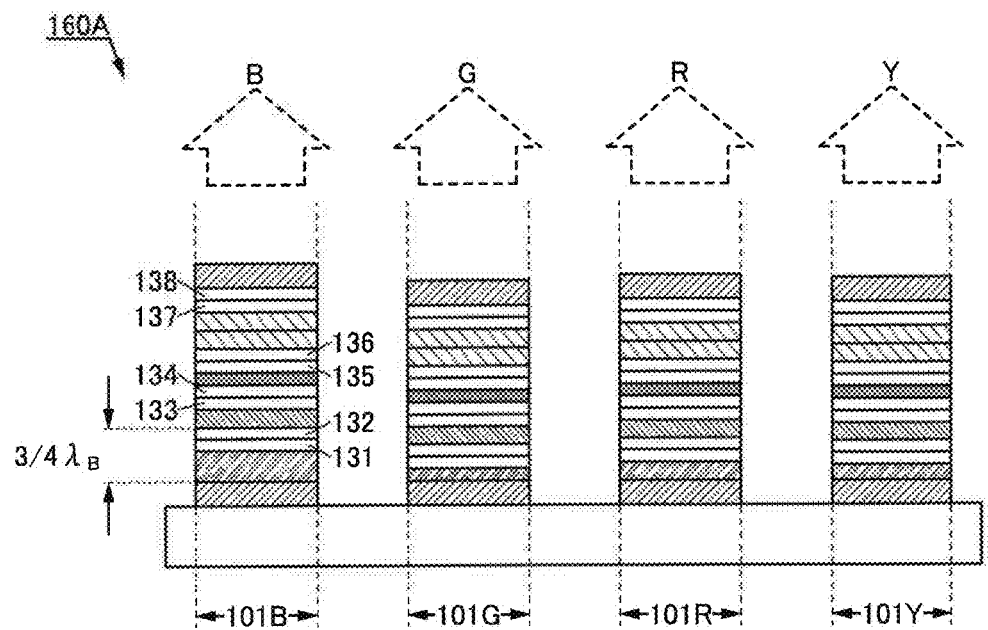

FIG. 4B is a cross-sectional view illustrating an example of a light-emitting device according to one embodiment of the present invention. In FIG. 4B, a portion having a function similar to that in FIG. 4A is represented by the same hatch pattern as in FIG. 4A and not especially denoted by a reference numeral in some cases. In addition, common reference numerals are used for portions having similar functions, and a detailed description of the portions is omitted in some cases.

A light-emitting device 160A illustrated in FIG. 4B includes the first light-emitting element 101B having a function of emitting blue light, the second light-emitting element 101G having a function of emitting green light, the third light-emitting element 101R having a function of emitting red light, and the fourth light-emitting element 101Y having a function of emitting yellow light.

The first light-emitting element 101B, the second light-emitting element 101G, and the third light-emitting element 101R have structures similar to those of the first light-emitting element 101B, the second light-emitting element 101G, and the third light-emitting element 101R, respectively, illustrated in FIG. 1B. The fourth light-emitting element 101Y includes the fourth reflective electrode 104Y, the fourth transparent conductive film 106Y over the fourth reflective electrode 104Y, the first hole-injection layer 131 over the fourth transparent conductive film 106Y, the first hole-transport layer 132 over the first hole-injection layer 131, the first light-emitting layer 108 over the first hole-transport layer 132, the first electron-transport layer 133 over the first light-emitting layer 108, the first electron-injection layer 134 over the first electron-transport layer 133, the charge-generation layer 110 over the first electron-injection layer 134, the second hole-injection layer 135 over the charge-generation layer 110, the second hole-transport layer 136 over the second hole-injection layer 135, the second light-emitting layer 112 over the second hole-transport layer 136, the second electron-transport layer 137 over the second light-emitting layer 112, the second electron-injection layer 138 over the second electron-transport layer 137, and the semi-transmissive and semi-reflective electrode 114 over the second electron-injection layer 138.

In the light-emitting device 160A, the optical path length between the fourth reflective electrode 104Y and the first light-emitting layer 108 is adjusted with the thickness of at least one of the fourth transparent conductive film 106Y, the first hole-injection layer 131, and the first hole-transport layer 132.

In this way, the optical path length between the fourth reflective electrode 104Y and the first light-emitting layer 108 may be adjusted by changing the thicknesses of a plurality of layers between the fourth reflective electrode 104Y and the first light-emitting layer 108.

As described above, in the light-emitting device 160A, the following components are provided in each light-emitting element in addition to the components of the light-emitting device 160: the first hole-injection layer 131, the first hole-transport layer 132, the first electron-transport layer 133, the first electron-injection layer 134, the second hole-injection layer 135, the second hole-transport layer 136, the second electron-transport layer 137, and the second electron-injection layer 138. The other components are similar to those of the light-emitting device 160 illustrated in FIG. 4A, and the effect similar to that in the case of the light-emitting device 160 is obtained.

Structural Example 6 of Light-Emitting Device

Next, a structural example different from that of the light-emitting device 160A illustrated in FIG. 4B will be described below with reference to FIG. 5.

Figure 5:
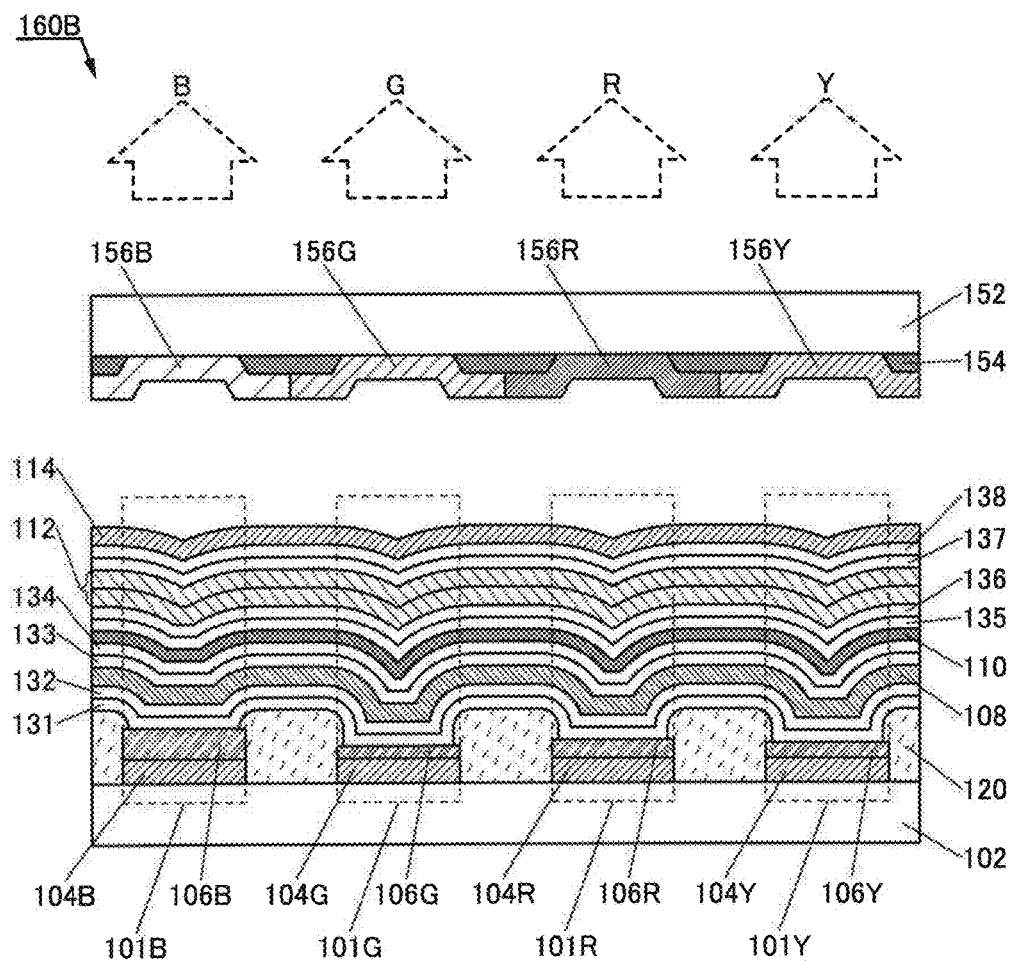
FIG. 5 is a cross-sectional view illustrating a light-emitting device according to one embodiment of the present invention.

A light-emitting device 160B illustrated in FIG. 5 includes the partition wall 120 in addition to the first light-emitting element 101B, the second light-emitting element 101G, the third light-emitting element 101R, and the fourth light-emitting element 101Y included in the light-emitting device 160A illustrated in FIG. 4B. The light-emitting device 160B also includes the substrate 152 that faces the substrate 102. The substrate 152 is provided with the light-blocking layer 154, the first optical element 156B, the second optical element 156G, the third optical element 156R, and a fourth optical element 156Y.

The partition wall 120, the light-blocking layer 154, the first optical element 156B, the second optical element 156G, and the third optical element 156R can have structures similar to those of the light-emitting device 100B illustrated in FIG. 3. The fourth optical element 156Y has a function of selectively transmitting light of a particular color out of incident light. With the fourth optical element 156Y, the color purity of the fourth light-emitting element 101Y can be enhanced.

As described above, in the light-emitting device 160B, the following components are provided in addition to the components of the light-emitting device 160: the partition wall 120 that covers the end portions of the lower electrode of each light-emitting element, and the first optical element 156B, the second optical element 156G, the third optical element 156R, and the fourth optical element 156Y that face the light-emitting elements. The other components are similar to those of the light-emitting device 160 illustrated in FIG. 4A, and the effect similar to that in the case of the light-emitting device 160 is obtained.

Structural Example 7 of Light-Emitting Device

Next, a structural example different from that of the light-emitting device 160B illustrated in FIG. 5 will be described below with reference to FIG. 6.

Figure 6:
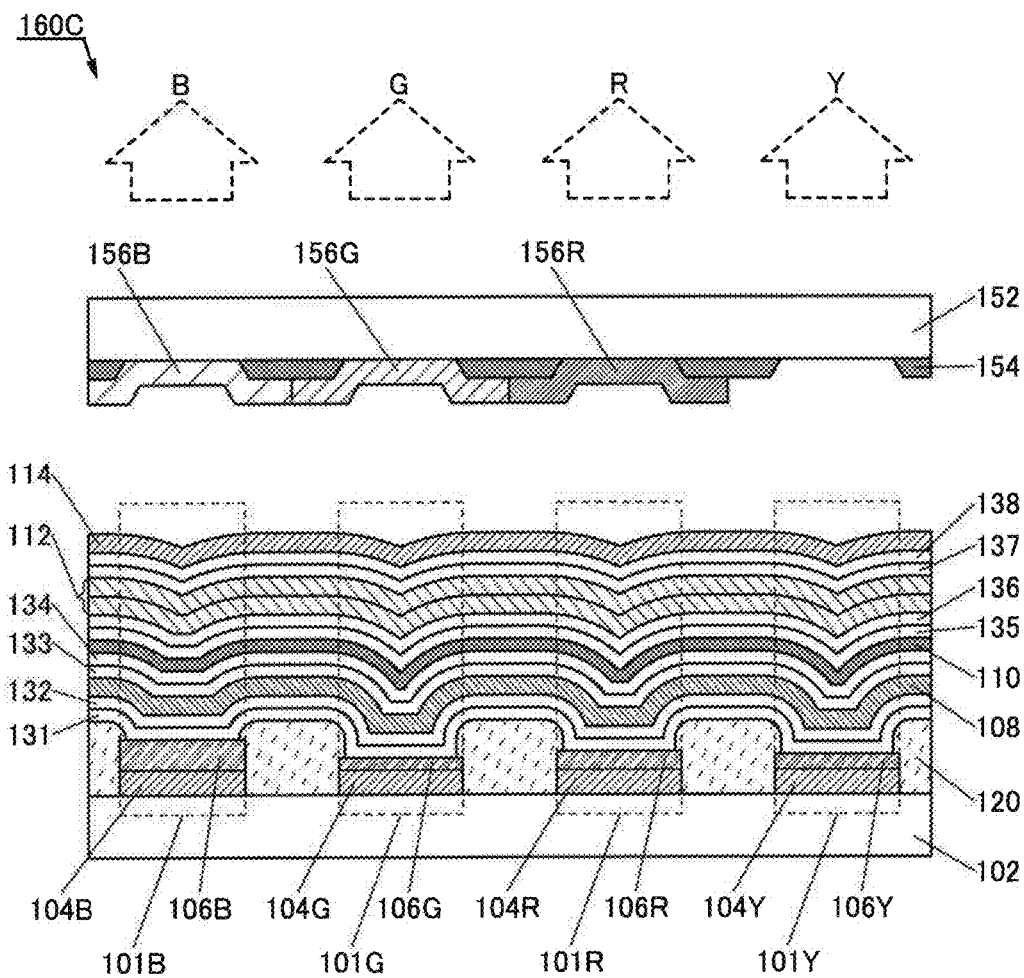
FIG. 6 is a cross-sectional view illustrating a light-emitting device according to one embodiment of the present invention.

In a light-emitting device 160C illustrated in FIG. 6, the fourth optical element 156Y included in the light-emitting device 160B illustrated in FIG. 5 is not provided. The other components are similar to those of the light-emitting device 160B illustrated in FIG. 5, and the effect similar to that in the case of the light-emitting device 160B is obtained.

Since the fourth optical element 156Y that overlaps with the fourth light-emitting element 101Y is not provided, less energy of light emitted from the fourth light-emitting element 101Y is lost than in the structure with the fourth optical element 156Y, leading to a lower power consumption.

Structural Example 8 of Light-Emitting Device

Next, a structural example different from that of the light-emitting device 160C illustrated in FIG. 6 will be described below with reference to FIG. 7.

Figure 7:
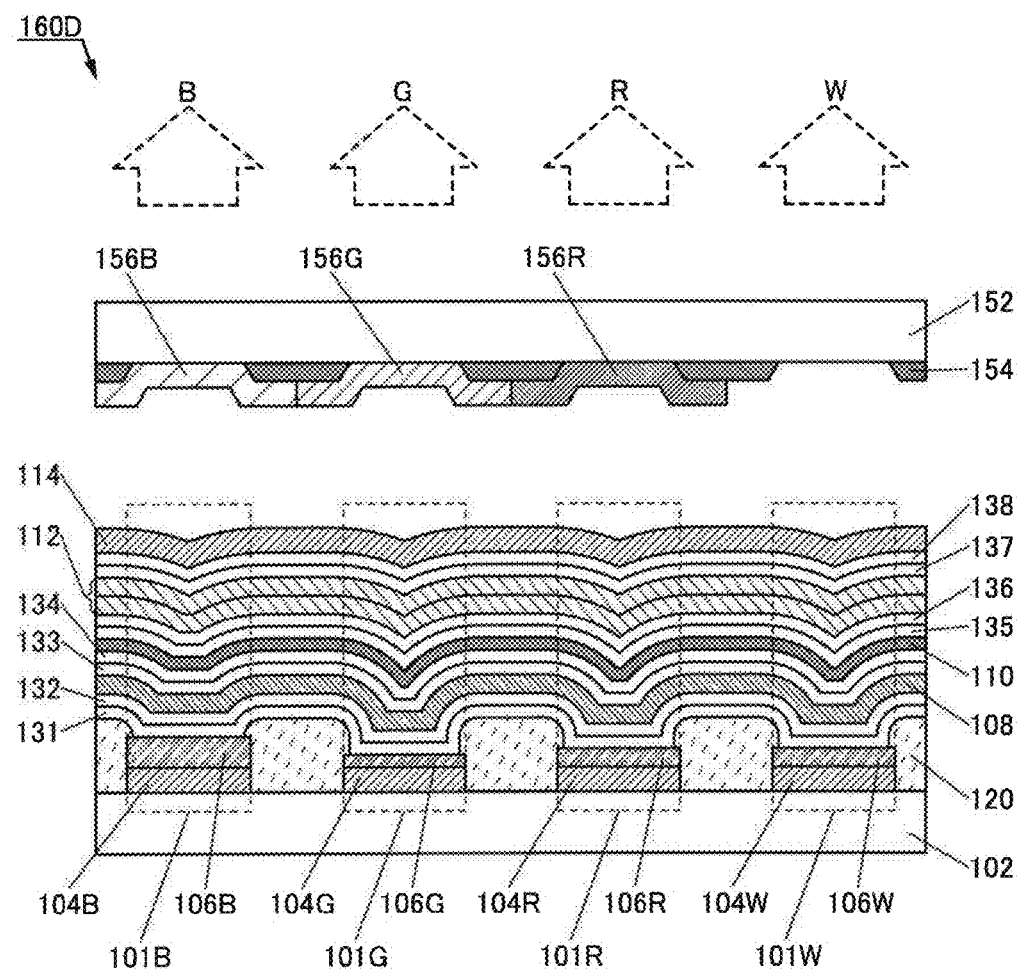
FIG. 7 is a cross-sectional view illustrating a light-emitting device according to one embodiment of the present invention.

A light-emitting device 160D illustrated in FIG. 7 includes a fifth light-emitting element 101W instead of the fourth light-emitting element 101Y included in the light-emitting device 160C illustrated in FIG. 6.

The fifth light-emitting element 101W includes a fifth reflective electrode 104W, a fifth transparent conductive film 106W over the fifth reflective electrode 104W, the first hole-injection layer 131 over the fifth transparent conductive film 106W, the first hole-transport layer 132 over the first hole-injection layer 131, the first light-emitting layer 108 over the first hole-transport layer 132, the first electron-transport layer 133 over the first light-emitting layer 108, the first electron-injection layer 134 over the first electron-transport layer 133, the charge-generation layer 110 over the first electron-injection layer 134, the second hole-injection layer 135 over the charge-generation layer 110, the second hole-transport layer 136 over the second hole-injection layer 135, the second light-emitting layer 112 over the second hole-transport layer 136, the second electron-transport layer 137 over the second light-emitting layer 112, the second electron-injection layer 138 over the second electron-transport layer 137, and the semi-transmissive and semi-reflective electrode 114 over the second electron-injection layer 138.

In the fifth light-emitting element 101W, the optical path length between the fifth reflective electrode 104W and the first light-emitting layer 108 is adjusted with the thickness of at least one of the fifth transparent conductive film 106W, the first hole-injection layer 131, and the first hole-transport layer 132.

For example, the thickness of the fifth transparent conductive film 106W is substantially the same as that of the third transparent conductive film 106R. In the fifth light-emitting element 101W, light emission from the first light-emitting substance contained in the first light-emitting layer 108 and light emission from the second light-emitting substance contained in the second light-emitting layer 112 are combined so that white light emission can be obtained.

In addition, no optical element is provided to overlap with the fifth light-emitting element 101W. Therefore, less energy of light emitted from the fifth light-emitting element 101W is lost than in the first light-emitting element 101B, the second light-emitting element 101G, and the third light-emitting element 101R, leading to a lower power consumption.

The above-described structures of the light-emitting devices can be combined as appropriate.

<Manufacturing Method 1 of Light-Emitting Device>

Next, a method for manufacturing a light-emitting device according to one embodiment of the present invention will be described below with reference to FIGS. 8A to 8D and FIGS. 9A and 9B. Here, a method for manufacturing the light-emitting device 160B illustrated in FIG. 5 will be described.

FIGS. 8A to 8D and FIGS. 9A and 9B are cross-sectional views illustrating a method for manufacturing the light-emitting device according to one embodiment of the present invention.

The method for manufacturing the light-emitting device 160B described below includes first to seventh steps.

<First Step>

Figure 8A:
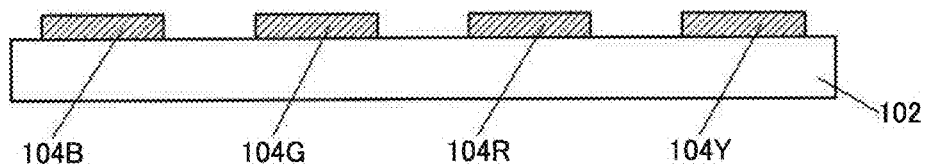
FIGS. 8A to 8D are cross-sectional views illustrating a method for manufacturing a light-emitting device according to one embodiment of the present invention.

In the first step, a reflective electrode (e.g., the first reflective electrode 104B, the second reflective electrode 104G, the third reflective electrode 104R, or the fourth reflective electrode 104Y) of each light-emitting element is formed over the substrate 102 (see FIG. 8A).

In this embodiment, a reflective conductive film is formed over the substrate 102 and processed into a desired shape; in this way, the first reflective electrode 104B, the second reflective electrode 104G, the third reflective electrode 104R, and the fourth reflective electrode 104Y are formed. As the reflective conductive film, an alloy film of silver, palladium, and copper is used.

Note that a plurality of transistors may be formed over the substrate 102 before the first step. The plurality of transistors may be electrically connected to the first reflective electrode 104B, the second reflective electrode 104G, the third reflective electrode 104R, and the fourth reflective electrode 104Y.

<Second Step>

Figure 8B:
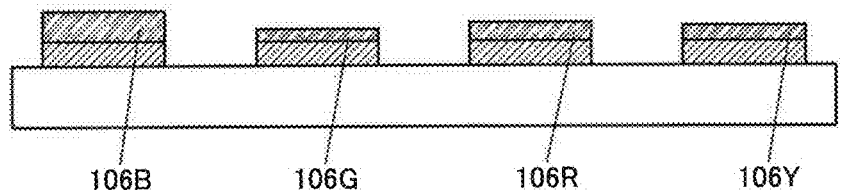

In the second step, a transparent conductive film (e.g., the first transparent conductive film 106B, the second transparent conductive film 106G, the third transparent conductive film 106R, or the fourth transparent conductive film 106Y) of each light-emitting element is formed over the reflective electrode (see FIG. 8B).

In this embodiment, a transparent conductive film is formed over the substrate 102, the first reflective electrode 104B, the second reflective electrode 104G, the third reflective electrode 104R, and the fourth reflective electrode 104Y and processed into a desired shape; in this way, the first transparent conductive film 106B, the second transparent conductive film 106G, the third transparent conductive film 106R, and the fourth transparent conductive film 106Y are formed. As the transparent conductive film, an ITSO film is used in this embodiment.

The first transparent conductive film 106B, the second transparent conductive film 106G, the third transparent conductive film 106R, and the fourth transparent conductive film 106Y may be formed through a plurality of steps. When the first transparent conductive film 106B, the second transparent conductive film 106G, the third transparent conductive film 106R, and the fourth transparent conductive film 106Y are formed through a plurality of steps, they can be formed to have thicknesses which enable each light-emitting element to have a microcavity structure.

<Third Step>

Figure 8C:
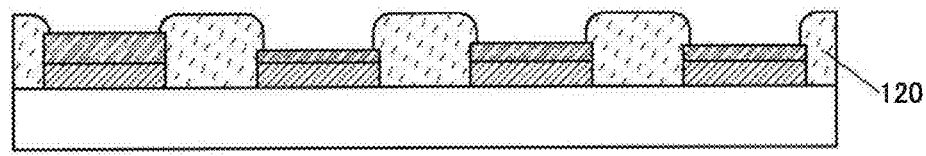

In the third step, the partition wall 120 that covers end portions of a lower electrode (e.g., the first reflective electrode 104B, the second reflective electrode 104G, the third reflective electrode 104R, the fourth reflective electrode 104Y, the first transparent conductive film 106B, the second transparent conductive film 106G, the third transparent conductive film 106R, or the fourth transparent conductive film 106Y) of each light-emitting element is formed (see FIG. 8C).

The partition wall 120 includes an opening that overlaps with the lower electrode. The transparent conductive film that overlaps with the opening functions as the lower electrode of the light-emitting element. In this embodiment, an acrylic resin is used as the partition wall 120.

In the first to third steps, since there is no possibility of damaging a light-emitting layer containing an organic compound, a variety of film formation methods and micromachining technologies can be employed. In this embodiment, a reflective conductive film is formed by a sputtering method, a pattern is formed over the reflective conductive film by a lithography method, and then the reflective conductive film is processed into an island shape by a dry etching method or a wet etching method to form the first reflective electrode 104B, the second reflective electrode 104G, the third reflective electrode 104R, and the fourth reflective electrode 104Y. Then, a transparent conductive film is formed by a sputtering method, a pattern is formed over the transparent conductive film by a lithography method, and then the transparent conductive film is processed into an island shape by a wet etching method to form the first transparent conductive film 106B, the second transparent conductive film 106G, the third transparent conductive film 106R, and the fourth transparent conductive film 106Y.

<Fourth Step>

Figure 8D:
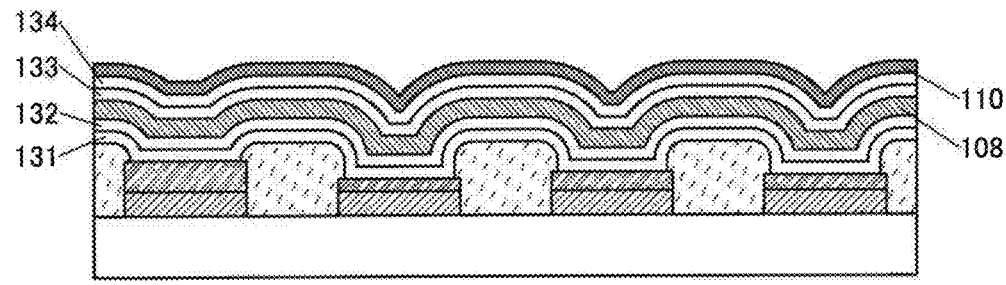

In the fourth step, the first hole-injection layer 131, the first hole-transport layer 132, the first light-emitting layer 108, the first electron-transport layer 133, the first electron-injection layer 134, and the charge-generation layer 110 are formed (see FIG. 8D).

The first hole-injection layer 131 can be formed by co-evaporating a hole-transport material and a material containing an acceptor substance. Note that co-evaporation is an evaporation method in which a plurality of different substances are concurrently vaporized from their respective evaporation sources. The first hole-transport layer 132 can be formed by evaporating a hole-transport material.

The first light-emitting layer 108 can be formed by evaporating the first light-emitting substance that emits light of at least one of violet, blue, and blue green. As the first light-emitting substance, a fluorescent organic compound can be used. The fluorescent organic compound may be evaporated alone or the fluorescent organic compound mixed with another material may be evaporated. For example, the fluorescent organic compound may be used as a guest material, and the guest material may be dispersed into a host material having a higher excitation energy than the guest material and evaporated.

The first electron-transport layer 133 can be formed by evaporating a substance with a high electron-transport property. The first electron-injection layer 134 can be formed by evaporating a substance with a high electron-injection property.

The charge-generation layer 110 can be formed by evaporating a material obtained by adding an electron acceptor (acceptor) to a hole-transport material or a material obtained by adding an electron donor (donor) to an electron-transport material.

<Fifth Step>

Figure 9A:
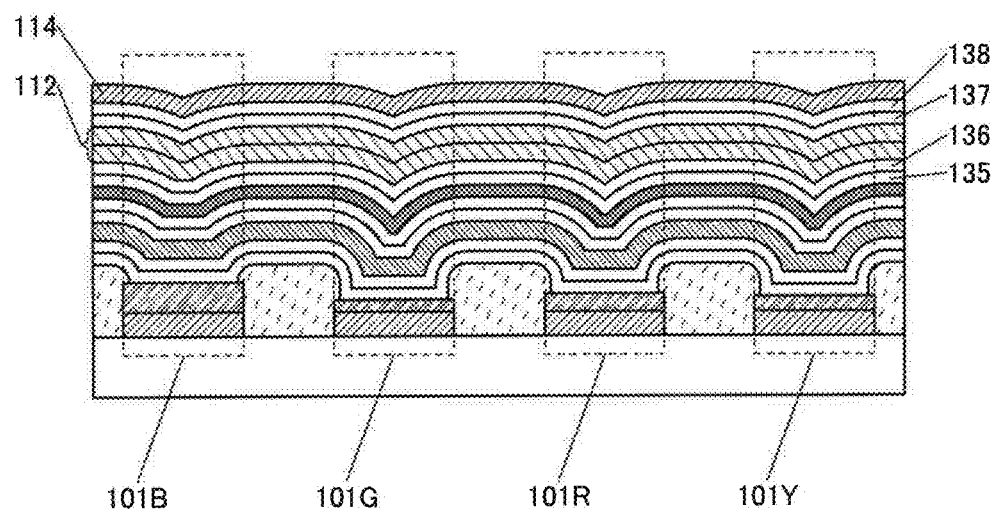
FIGS. 9A and 9B are cross-sectional views illustrating a method for manufacturing a light-emitting device according to one embodiment of the present invention.

In the fifth step, the second hole-injection layer 135, the second hole-transport layer 136, the second light-emitting layer 112, the second electron-transport layer 137, the second electron-injection layer 138, and the semi-transmissive and semi-reflective electrode 114 are formed (see FIG. 9A).

The second hole-injection layer 135 can be formed by using a material and a method which are similar to those of the first hole-injection layer 131. The second hole-transport layer 136 can be formed by using a material and a method which are similar to those of the first hole-transport layer 132.

The second light-emitting layer 112 can be formed by evaporating the second light-emitting substance that emits light of at least one of green, yellow green, yellow, orange, and red. As the second light-emitting substance, a phosphorescent organic compound can be used. The phosphorescent organic compound may be evaporated alone or the phosphorescent organic compound mixed with another material may be evaporated. For example, the phosphorescent organic compound may be used as a guest material, and the guest material may be dispersed into a host material having a higher excitation energy than the guest material and evaporated.

The second electron-transport layer 137 can be formed by evaporating a substance with a high electron-transport property. The second electron-injection layer 138 can be formed by evaporating a substance with a high electron-injection property.

The semi-transmissive and semi-reflective electrode 114 can be formed by stacking a reflective conductive film and a light-transmitting conductive film. The semi-transmissive and semi-reflective electrode 114 may have a single-layer structure or a stacked structure.

Through the above-described steps, the first light-emitting element 101B, the second light-emitting element 101G, the third light-emitting element 101R, and the fourth light-emitting element 101Y are formed over the substrate 102.
<Sixth Step>

Figure 9B:
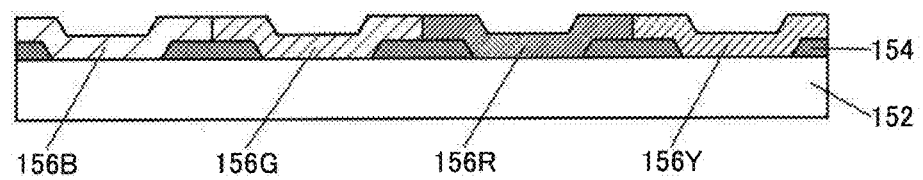

In the sixth step, the light-blocking layer 154, the first optical element 156B, the second optical element 156G, the third optical element 156R, and the fourth optical element 156Y are formed over the substrate 152 (see FIG. 9B).

As the light-blocking layer 154, an organic resin film containing black pigment is formed in a desired region. Then, the first optical element 156B, the second optical element 156G, the third optical element 156R, and the fourth optical element 156Y are formed over the substrate 152 and the light-blocking layer 154. As the first optical element 156B, an organic resin film containing blue pigment is formed in a desired region. As the second optical element 156, an organic resin film containing green pigment is formed in a desired region. As the third optical element 156R, an organic resin film containing red pigment is formed in a desired region. As the fourth optical element 156Y, an organic resin film containing yellow pigment is formed in a desired region.
<Seventh Step>

In the seventh step, the first light-emitting element 101B, the second light-emitting element 101G, the third light-emitting element 101R, and the fourth light-emitting element 101Y formed over the substrate 102 are attached to the light-blocking layer 154, the first optical element 156B, the second optical element 156G, the third optical element 156R, and the fourth optical element 156Y formed over the substrate 152, and sealed with a sealant (not shown).

Through the above steps, the light-emitting device 160B illustrated in FIG. 5 can be formed.

This embodiment can be combined as appropriate with any of the other embodiments.

Embodiment 2

In this embodiment, a top view and a cross-sectional view of a display device (also referred to as a display panel or a light-emitting panel) which is one embodiment of a light-emitting device will be described with reference to FIGS. 10A and 10B.

Figure 10A:
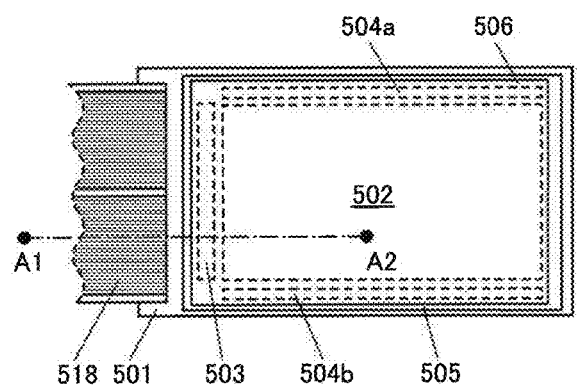
FIGS. 10A and 10B are a top view and a cross-sectional view illustrating a display device according to one embodiment of the present invention.

FIG. 10A is a top view of a light-emitting panel in which a light-emitting element provided over a first substrate 501 and an optical element provided over a second substrate 506 are sealed with a sealant. FIG. 10B is a cross-sectional view along dashed-dotted line A1-A2 in FIG. 10A.

The first substrate 501 is provided with a pixel portion 502, a signal line driver circuit portion 503, and scan line driver circuit portions 504a and 504b. The second substrate 506 is provided with a light-blocking layer 521, a first optical element 522B having a function of transmitting blue light, a second optical element 522G having a function of transmitting green light, and a third optical element 522R having a function of transmitting red light. The first substrate 501 and the second substrate 506 are sealed with a sealant 505.

The pixel portion 502, the signal line driver circuit portion 503, and the scan line driver circuit portions 504a and 504b are sealed with the first substrate 501, the second substrate 506, the sealant 505, and a filler 507.

An epoxy-based resin or a glass frit is preferably used for the sealant 505. It is preferable that such a material do not transmit moisture or oxygen as much as possible.

For the filler 507, an inert gas such as nitrogen or argon, or an ultraviolet curable resin or a thermosetting resin can be used. For example, a polyvinyl chloride (PVC)-based resin, an acrylic-based resin, a polyimide-based resin, an epoxy-based resin, a silicone-based resin, a polyvinyl butyral (PVB)-based resin, or an ethylene vinyl acetate (EVA)-based resin can be used.

As the signal line driver circuit portion 503 and the scan line driver circuit portions 504a and 504b, driver circuits formed by using a single crystal semiconductor film or a polycrystalline semiconductor film over a separately prepared substrate may be mounted.

Figure 10B:
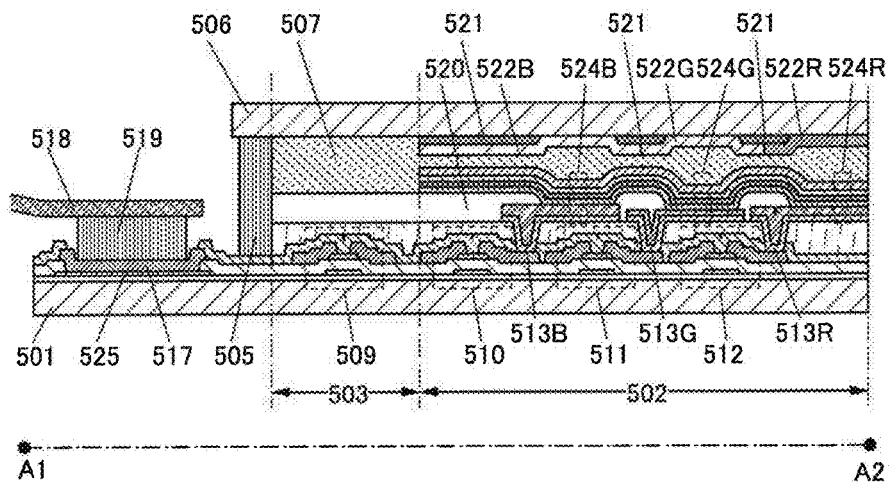

The pixel portion 502, the signal line driver circuit portion 503, and the scan line driver circuit portions 504a and 504b each include a plurality of transistors, and FIG. 10B illustrates transistors 510, 511 and 512 included in the pixel portion 502 and a transistor 509 included in the signal line driver circuit portion 503 as an example.

In FIG. 10B, as an example of the transistor, an inverted staggered transistor is illustrated but one embodiment of the present invention is not limited thereto, and a staggered transistor may be used. In addition, there is no particular limitation on the polarity of the transistor. A structure including an n-channel transistor and a p-channel transistor, a structure including only an n-channel transistor, or a structure including only a p-channel transistor may be used. Furthermore, there is no particular limitation on the crystallinity of a semiconductor film used for the transistor. For example, an amorphous semiconductor film or a crystalline semiconductor film can be used. Examples of a semiconductor material include Group 13 semiconductors (e.g., gallium), Group 14 semiconductors (e.g., silicon), compound semiconductors (including oxide semiconductors), and organic semiconductors. For example, an oxide semiconductor that has an energy gap of greater than or equal to 2 eV, preferably greater than or equal to 2.5 eV, more preferably greater than or equal to 3 eV is preferably used for the transistors 509, 510, 511, and 512, because the off-state current of the transistors can be reduced. Examples of the oxide semiconductor include an In—Ga oxide and an In-M-Zn oxide (M represents Al, Ga, Y, Zr, La, Ce, or Nd).

A variety of signals and potentials are supplied from an FPC 518 to the signal line driver circuit portion 503, the scan line driver circuit portions 504a and 504b, and the pixel portion 502.

The FPC 518 is electrically connected to a terminal electrode 525 through an anisotropic conductive film 519 and a connection terminal electrode 517. The connection terminal electrode 517 is formed through a step of processing the same conductive film as source electrodes and drain electrodes of the transistors 510, 511 and 512. The terminal electrode 525 is formed through a step of processing the same conductive film as gate electrodes of the transistors 510, 511 and 512.

As the first substrate 501 and the second substrate 506, a semiconductor substrate (e.g., a single crystal substrate or a silicon substrate), an SOI substrate, a glass substrate, a quartz substrate, a plastic substrate, a metal substrate, a stainless steel substrate, a substrate including stainless steel foil, a tungsten substrate, a substrate including tungsten foil, a flexible substrate, an attachment film, paper including a fibrous material, a base material film, or the like can be used. Examples of a glass substrate include a barium borosilicate glass substrate, an aluminoborosilicate glass substrate, and a soda lime glass substrate. Examples of the flexible substrate, the attachment film, and the base material film are as follows: plastics typified by polyethylene terephthalate (PET), polyethylene naphthalate (PEN), and polyether sulfone (PES), a synthetic resin such as acrylic, polypropylene, polyester, polyvinyl fluoride, polyvinyl chloride, polyamide, polyimide, aramid, epoxy, an inorganic film formed by evaporation, and paper.

When the above-described flexible substrate is used as a substrate over which a light-emitting element or a transistor is formed, the light-emitting element or the transistor may be directly formed over the flexible substrate. Alternatively, part of or the entire light-emitting element or transistor may be formed over a base substrate with a separation layer provided therebetween and then the light-emitting element or the transistor may be separated from the base substrate and transferred to another substrate. When the light-emitting element or the transistor is transferred to another substrate by using a separation layer as described above, the light-emitting element or the transistor can be formed over a substrate having low heat resistance or a flexible substrate over which the light-emitting element or the transistor is directly formed with difficulty. Examples of the above separation layer include a stack including inorganic films, e.g., a tungsten film and a silicon oxide film, and an organic resin film of polyimide or the like formed over a substrate. Examples of a substrate to which a light-emitting element or a transistor is transferred include, in addition to the above-described substrates over which a light-emitting element or a transistor can be formed, a paper substrate, a cellophane substrate, an aramid film substrate, a polyimide film substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), or the like), a leather substrate, and a rubber substrate. With the use of any of these substrates, an increase in durability or heat resistance and a reduction in weight or thickness can be achieved.

A first reflective electrode 513B is electrically connected to the source electrode or the drain electrode of the transistor 510, a second reflective electrode 513G is electrically connected to the source electrode or the drain electrode of the transistor 511, and a third reflective electrode 513R is electrically connected to the source electrode or the drain electrode of the transistor 512.

A partition wall 520 is formed so as to cover end portions of the first reflective electrode 513B, the second reflective electrode 513G, and the third reflective electrode 513R. The partition wall 520 preferably has a curved surface with curvature at its upper end portion or lower end portion. With the partition wall 520 having such a shape, the coverage with a film to be formed over the partition wall 520 can be favorable.

The first reflective electrode 513B serves as part of a lower electrode of a first light-emitting element 524B. The second reflective electrode 513G serves as part of a lower electrode of a second light-emitting element 524G. The third reflective electrode 513R serves as part of a lower electrode of a third light-emitting element 524R.

The first light-emitting element 524B, the second light-emitting element 524G, and the third light-emitting element 524R can each have any of the element structures described in Embodiment 1. With any of the element structures described in Embodiment 1, a light-emitting device with a high emission efficiency and a low power consumption can be provided.

Light is emitted from the first light-emitting element 524B, the second light-emitting element 524G, and the third light-emitting element 524R through the second substrate 506. Therefore, the second substrate 506 needs to have a light-transmitting property. For example, a material such as a glass plate, a plastic plate, a polyester film, or an acrylic film can be used for the second substrate 506.

The second substrate 506 may be provided with an optical film such as a polarizing plate, a circularly polarizing plate (including an elliptically polarizing plate), or a retardation plate (a quarter-wave plate or a half-wave plate). The polarizing plate or the circularly polarizing plate may be provided with an anti-reflective film. For example, anti-glare treatment by which reflected light can be diffused by projections and depressions on the surface so as to reduce the glare can be performed.

A protective film may be formed over the first light-emitting element 524B, the second light-emitting element 524G, and the third light-emitting element 524R. The protective film has a function of preventing oxygen, hydrogen, moisture, carbon dioxide, or the like from entering each light-emitting element. For example, a silicon nitride film, a silicon nitride oxide film, an aluminum oxide film, or the like can be used for the protective film.

This embodiment can be implemented in an appropriate combination with any of the structures described in the other embodiments.

Embodiment 3

In this embodiment, a display device including a light-emitting device according to one embodiment of the present invention will be described with reference to FIGS. 11A and 11B.

The display device illustrated in FIG. 11A includes a region including pixels of display elements (the region is hereinafter referred to as a pixel portion 602), a circuit portion provided outside the pixel portion 602 and including a circuit for driving the pixels (the circuit portion is hereinafter referred to as a driver circuit portion 604), circuits each having a function of protecting an element (the circuits are hereinafter referred to as protection circuits 606), and a terminal portion 607. Note that the protection circuits 606 are not necessarily provided.

Part of or the entire driver circuit portion 604 is preferably formed over a substrate over which the pixel portion 602 is formed. In this way, the number of components and the number of terminals can be reduced. When part of or the entire driver circuit portion 604 is not formed over the substrate over which the pixel portion 602 is formed, part of or the entire driver circuit portion 604 can be mounted by COG or tape automated bonding (TAB).

The pixel portion 602 includes circuits for driving a plurality of display elements arranged in X (X is a natural number of greater than or equal to 2) rows and Y (Y is a natural number of greater than or equal to 2) columns (the circuits are hereinafter referred to as pixel circuits 601). The driver circuit portion 604 includes driver circuits such as a circuit for supplying a signal (scan signal) to select a pixel (the circuit is hereinafter referred to as a scan line driver circuit portion 604a) and a circuit for supplying a signal (data signal) to drive a display element in a pixel (the circuit is hereinafter referred to as a signal line driver circuit portion 604b).

The scan line driver circuit portion 604a includes a shift register or the like. Through the terminal portion 607, the scan line driver circuit portion 604a receives a signal for driving the shift register and outputs a signal. For example, the scan line driver circuit portion 604a receives a start pulse signal, a clock signal, or the like and outputs a pulse signal. The scan line driver circuit portion 604a has a function of controlling potentials of wirings supplied with scan signals (the wirings are hereinafter referred to as scan lines GL_1 to GL_X). A plurality of scan line driver circuit portions 604a may be provided to control the scan lines GL_1 to GL_X separately. Alternatively, the scan line driver circuit portion 604a has a function of supplying an initialization signal. However, without being limited thereto, the scan line driver circuit portion 604a can supply other signals.

The signal line driver circuit portion 604b includes a shift register or the like. Through the terminal portion 607, the signal line driver circuit portion 604b receives a signal (image signal) from which a data signal is derived, as well as a signal for driving the shift register. The signal line driver circuit portion 604b has a function of generating data signals written to the pixel circuits 601 based on image signals. The signal line driver circuit portion 604b has a function of controlling output of a data signal in response to a pulse signal produced by input of a start pulse, a clock signal, or the like. The signal line driver circuit portion 604b has a function of controlling potentials of wirings supplied with data signals (the wirings are hereinafter referred to as data lines DL_1 to DL_). Alternatively, the signal line driver circuit portion 604b has a function of supplying an initialization signal. However, without being limited thereto, the signal line driver circuit portion 604b can supply other signals.

The signal line driver circuit portion 604b includes a plurality of analog switches, for example. The signal line driver circuit portion 604b can output, as the data signals, signals obtained by time-dividing the image signals by sequentially turning on the plurality of analog switches.

A pulse signal and a data signal are input to each of the plurality of pixel circuits 601 through one of the plurality of scan lines GL supplied with scan signals and one of the plurality of data lines DL supplied with data signals, respectively. Writing and holding of the data signal in each of the plurality of pixel circuits 601 are controlled by the scan line driver circuit portion 604a. For example, to the pixel circuit 601 in m-th row and n-th column (m is a natural number of less than or equal to X and n is a natural number of less than or equal to Y), a pulse signal is input from the scan line driver circuit portion 604a through a scan line GL_m, and a data signal is input from the signal line driver circuit portion 604b through a data line DL_n depending on the potential of the scan line GL_m.

Figure 11A:
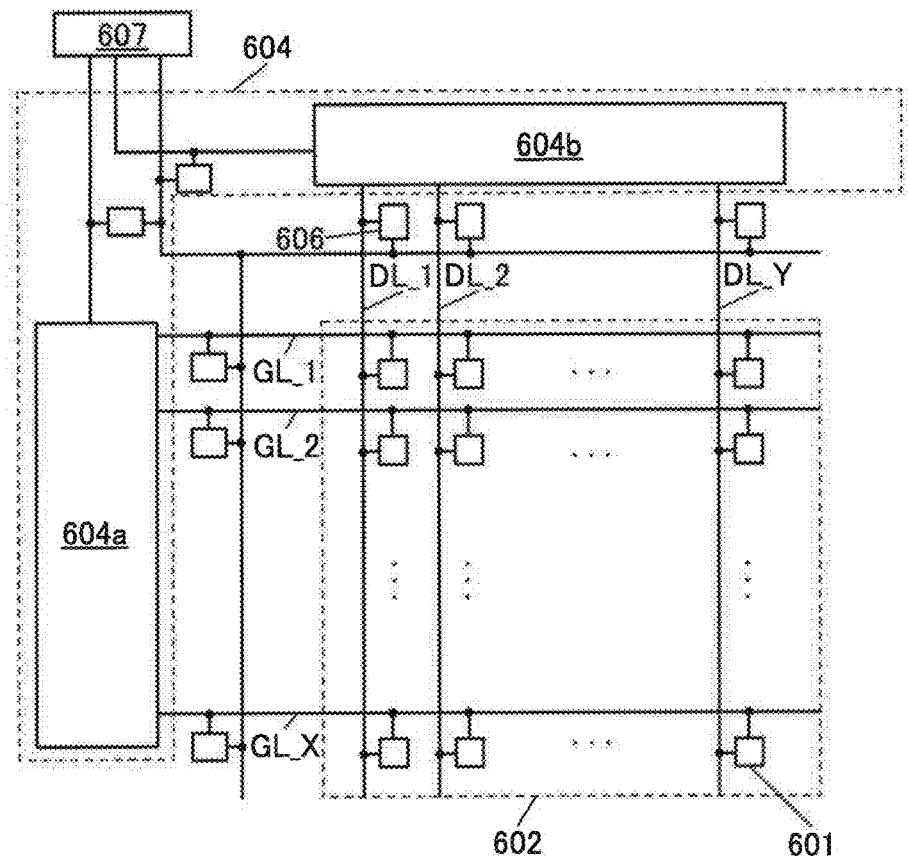
FIGS. 11A and 11B are a block diagram and a circuit diagram illustrating a display device according to one embodiment of the present invention.

In FIG. 11A, the protection circuit 606 is connected to, for example, the scan line GL between the scan line driver circuit portion 604a and the pixel portion 602. In addition, the protection circuit 606 is connected to the data line DL between the signal line driver circuit portion 604b and the pixel portion 602. In addition, the protection circuit 606 can be connected to a wiring between the scan line driver circuit portion 604a and the terminal portion 607. In addition, the protection circuit 606 can be connected to a wiring between the signal line driver circuit portion 604b and the terminal portion 607. Note that the terminal portion 607 refers to a portion having terminals for inputting power, control signals, and image signals to the display device from external circuits.

The protection circuit 606 is a circuit which electrically connects a wiring connected to the protection circuit to another wiring when a potential out of a certain range is supplied to the wiring connected to the protection circuit.

As illustrated in FIG. 11A, when the pixel portion 602 and the driver circuit portion 604 are both provided with the protection circuits 606, the resistance of the display device to overcurrent generated by electrostatic discharge (ESD) or the like can be improved. The configuration of the protection circuits 606 is not limited thereto; for example, the protection circuit 606 may be connected to the scan line driver portion 604a or the protection circuit 606 may be connected to the signal line driver circuit portion 604b. Alternatively, the protection circuit 606 may be connected to the terminal portion 607.

FIG. 11A illustrates an example in which the driver circuit portion 604 includes the scan line driver circuit portion 604a and the signal line driver circuit portion 604b; however, the structure is not limited thereto. For example, only the scan line driver circuit portion 604a may be formed, and a separately prepared substrate over which a source driver circuit is formed (e.g., a driver circuit substrate formed using a single crystal semiconductor film or a polycrystalline semiconductor film) may be mounted.

Figure 11B:
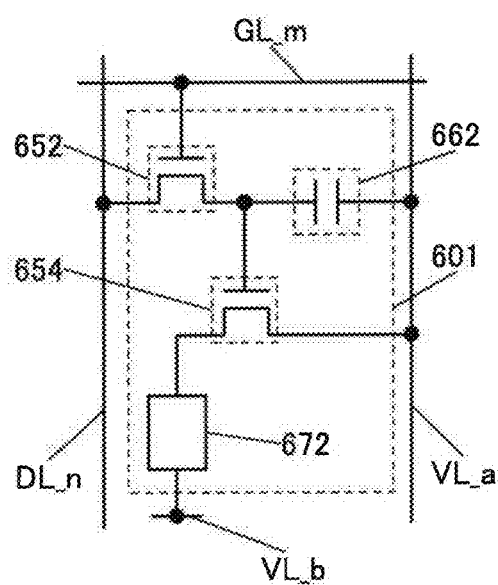

Each of the plurality of pixel circuits 601 illustrated in FIG. 11A can have a structure illustrated in FIG. 11B, for example.

The pixel circuit 601 illustrated in FIG. 11R includes transistors 652 and 654, a capacitor 662, and a light-emitting element 672.

One of a source electrode and a drain electrode of the transistor 652 is electrically connected to a wiring supplied with a data signal (hereinafter referred to as a data line DL_n). A gate electrode of the transistor 652 is electrically connected to a wiring supplied with a gate signal (hereinafter referred to as a scan line GL_m).

The transistor 652 has a function of controlling whether to write a data signal by being turned on or off.

One of a pair of electrodes of the capacitor 662 is electrically connected to a wiring supplied with a potential (hereinafter referred to as a potential supply line VL_a), and the other is electrically connected to the other of the source electrode and the drain electrode of the transistor 652.

The capacitor 662 functions as a storage capacitor for holding written data.

One of a source electrode and a drain electrode of the transistor 654 is electrically connected to the potential supply line VL_a. A gate electrode of the transistor 654 is electrically connected to the other of the source electrode and the drain electrode of the transistor 652.

One of an anode and a cathode of the light-emitting element 672 is electrically connected to a potential supply line VL_b, and the other is electrically connected to the other of the source electrode and the drain electrode of the transistor 654.

As the light-emitting element 672, any of the light-emitting elements described in Embodiment 1 can be used.

A high power supply potential VDD is supplied to one of the potential supply line VL_a and the potential supply line VL_b, and a low power supply potential VSS is supplied to the other.

For example, in the display device including the pixel circuit 601 in FIG. 11B, the pixel circuits 601 are sequentially selected row by row by the scan line driver circuit portion 604a illustrated in FIG. 11A, whereby the transistors 652 are turned on and data signals are written.

When the transistors 652 are turned off, the pixel circuits 601 in which the data signals have been written are brought into a holding state. The amount of current flowing between the source electrode and the drain electrode of the transistor 654 is controlled in accordance with the potential of the written data signal. The light-emitting element 672 emits light with a luminance corresponding to the amount of the flowing current. This operation is sequentially performed row by row; thus, an image can be displayed.

The structure described in this embodiment can be used in an appropriate combination with any of the structures described in the other embodiments.

Embodiment 4

In this embodiment, a display module and electronic devices each including a light-emitting device according to one embodiment of the present invention will be described with reference to FIG. 12 and FIGS. 13A to 13G.

Figure 12:
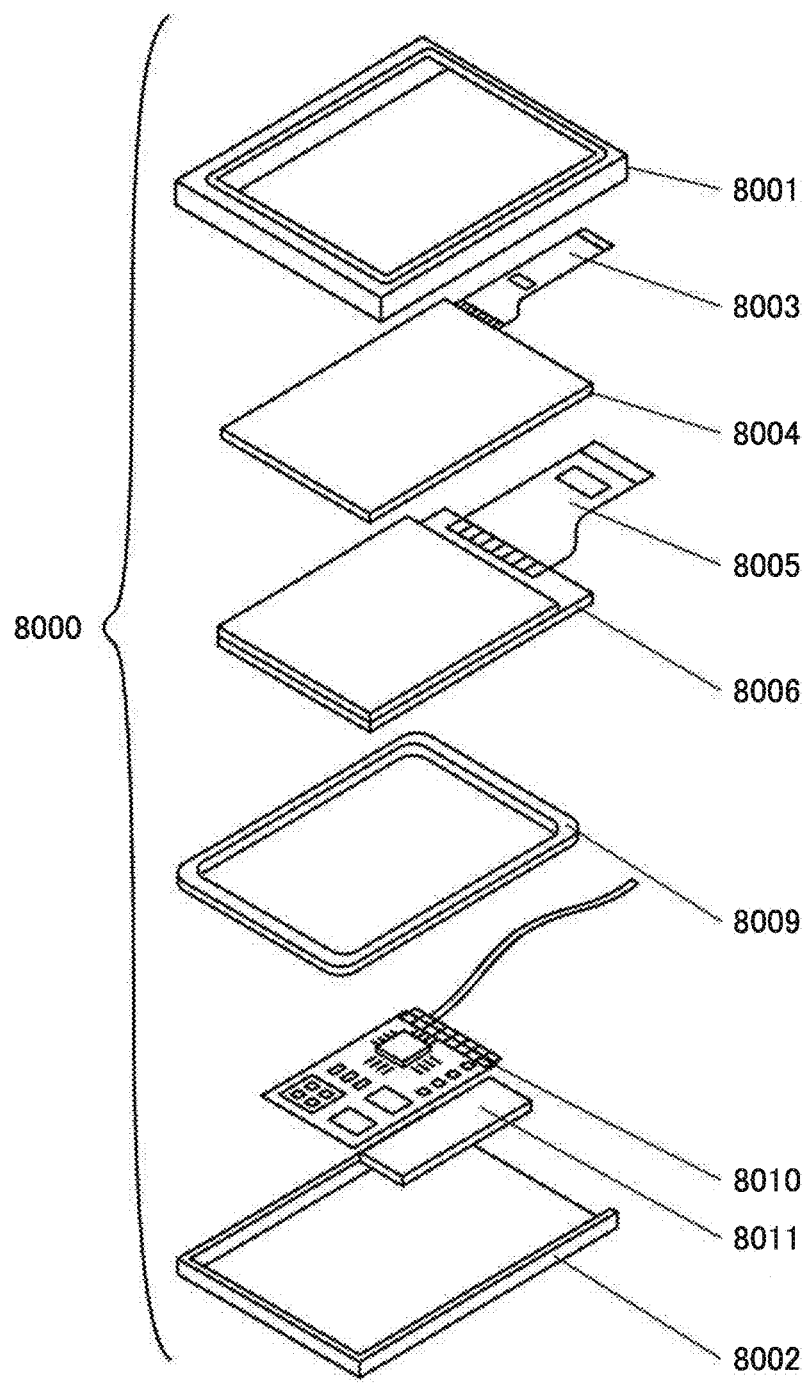
FIG. 12 is a perspective view illustrating a display module.

In a display module 8000 illustrated in FIG. 12, a touch panel 8004 connected to an FPC 8003, a display panel 8006 connected to an FPC 8005, a frame 8009, a printed board 8010, and a battery 8011 are provided between an upper cover 8001 and a lower cover 8002.

A light-emitting device according to one embodiment of the present invention can be used for the display panel 8006, for example.

The shapes and sizes of the upper cover 8001 and the lower cover 8002 can be changed as appropriate in accordance with the sizes of the touch panel 8004 and the display panel 8006.

The touch panel 8004 can be a resistive touch panel or a capacitive touch panel and can be provided so as to overlap with the display panel 8006. Alternatively, a counter substrate (sealing substrate) of the display panel 8006 can have a touch panel function. Alternatively, a photosensor may be provided in each pixel of the display panel 8006 to form an optical touch panel.

The frame 8009 protects the display panel 8006 and also functions as an electromagnetic shield for blocking electromagnetic waves generated by the operation of the printed board 8010. The frame 8009 can also function as a radiator plate.

The printed board 8010 is provided with a power supply circuit and a signal processing circuit for outputting a video signal and a clock signal. As a power source for supplying power to the power supply circuit, an external commercial power source or a power source using the battery 8011 provided separately may be used. The battery 8011 can be omitted in the case of using a commercial power source.

The display module 8000 may be additionally provided with a member such as a polarizing plate, a retardation plate, or a prism sheet.

FIGS. 13A to 13G illustrate electronic devices. These electronic devices can each include a housing 9000, a display portion 9001, a speaker 9003, an operation key 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, chemical substance, sound, time, hardness, electric field, current, voltage, power, radiation, flow rate, humidity, gradient, oscillation, odor, or infrared rays), a microphone 9008, and the like.

The electronic devices illustrated in FIGS. 13A to 13G can have a variety of functions, for example, a function of displaying a variety of information (a still image, a moving image, a text image, and the like) on the display portion, a touch sensor function, a function of displaying a calendar, the date, the time, and the like, a function of controlling processing with a variety of software (programs), a wireless communication function, a function of being connected to a variety of computer networks with a wireless communication function, a function of transmitting and receiving a variety of data with a wireless communication function, a function of reading a program or data stored in a storage medium and displaying the program or data on the display portion, and the like. Note that functions of the electronic devices illustrated in FIGS. 13A to 13G are not limited thereto, and the electronic devices can have a variety of functions. Although not illustrated in FIGS. 13A to 13G, the electronic devices may each have a plurality of display portions. The electronic devices may each have a camera or the like and a function of taking a still image, a function of taking a moving image, a function of storing the taken image in a storage medium (an external storage medium or a storage medium incorporated in the camera), a function of displaying the taken image on the display portion, and the like.

The electronic devices illustrated in FIGS. 13A to 13G will be described in detail below.

Figure 13A:
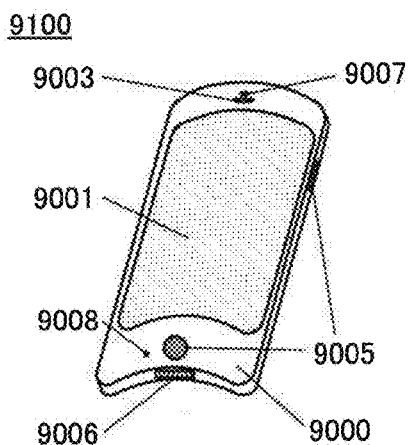
FIGS. 13A to 13G illustrate electronic devices.

FIG. 13A is a perspective view of a portable information terminal 9100. The display portion 9001 of the portable information terminal 9100 is flexible and thus can be incorporated along the curved surface of the housing 9000. Furthermore, the display portion 9001 includes a touch sensor, and operation can be performed by touching a screen with a finger, a stylus, or the like. For example, by touching an icon displayed on the display portion 9001, an application can be started.

Figure 13D:
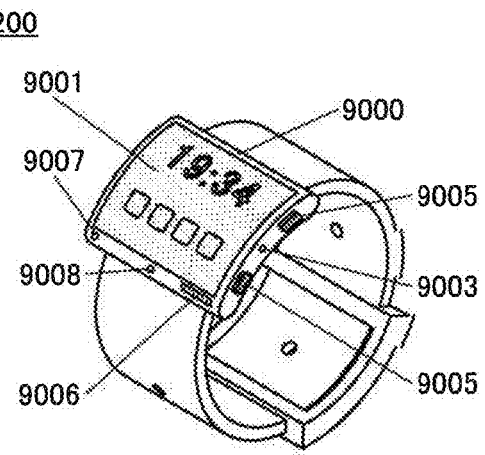
Figure 13B:
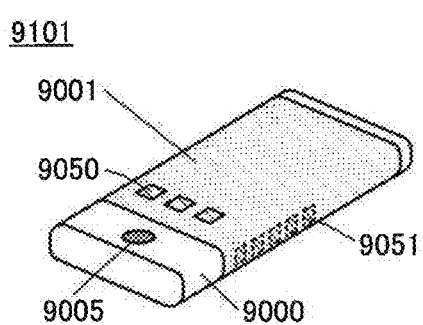

FIG. 13B is a perspective view of a portable information terminal 9101. The portable information terminal 9101 functions as, for example, one or more of a telephone set, a notebook, an information browsing system, and the like. Specifically, the portable information terminal 9101 can be used as a smartphone. Note that the speaker 9003, the connection terminal 9006, the sensor 9007, and the like, which are not illustrated in FIG. 13B, can be positioned in the portable information terminal 9101 as in the portable information terminal 9100 illustrated in FIG. 13A. The portable information terminal 9101 can display characters and image information on its plurality of surfaces. For example, three operation buttons 9050 (also referred to as operation icons, or simply, icons) can be displayed on one surface of the display portion 9001. Furthermore, information 9051 indicated by dashed rectangles can be displayed on another surface of the display portion 9001. Examples of the information 9051 include notification from a social networking service (SNS), display indicating reception of an e-mail or an incoming call, the title of the e-mail, the SNS, or the like, the sender of the e-mail, the SNS, or the like, the date, the time, remaining battery, and the reception strength of an antenna. Instead of the information 9051, the operation buttons 9050 or the like may be displayed in the position where the information 9051 is displayed.

Figure 13E:
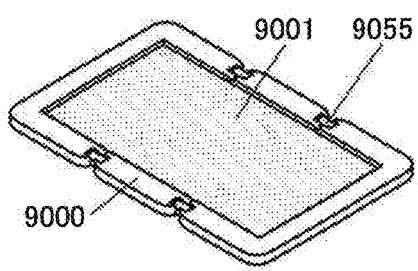
Figure 13C:
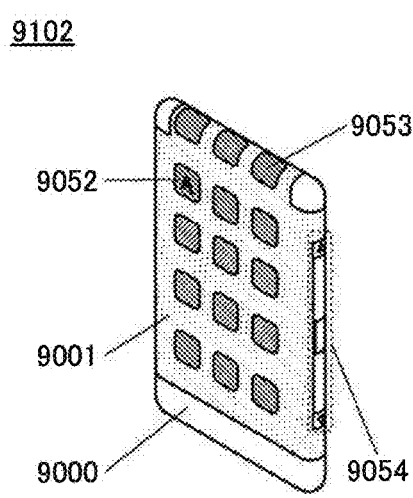

FIG. 13C is a perspective view of a portable information terminal 9102. The portable information terminal 9102 has a function of displaying information on three or more surfaces of the display portion 9001. Here, information 9052, information 9053, and information 9054 are displayed on different surfaces. For example, a user of the portable information terminal 9102 can see the display (here, the information 9053) with the portable information terminal 9102 put in a breast pocket of his/her clothes. Specifically, a caller's phone number, name, or the like of an incoming call is displayed in the position that can be seen from above the portable information terminal 9102. Thus, the user can see the display without taking out the portable information terminal 9102 from the pocket and decide whether to answer the call.

FIG. 13D is a perspective view of a watch-type portable information terminal 9200. The portable information terminal 9200 is capable of executing a variety of applications such as mobile phone calls, e-mailing, viewing and editing texts, music reproduction, Internet communication, and computer games. The display surface of the display portion 9001 is curved, and images can be displayed on the curved display surface. The portable information terminal 9200 can employ near field communication conformable to a communication standard. For example, hands-free calling can be achieved with mutual communication between the portable information terminal 9200 and a headset capable of wireless communication. Moreover, the portable information terminal 9200 includes the connection terminal 9006, and data can be directly transmitted to and received from another information terminal via a connector. Charging through the connection terminal 9006 is also possible. Note that the charging operation may be performed by wireless power feeding without using the connection terminal 9006.

Figure 13F:
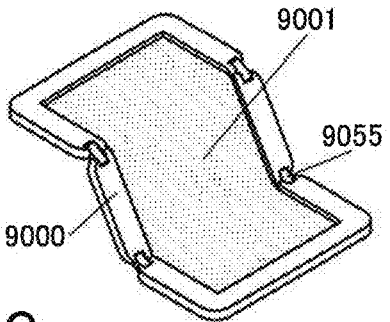
Figure 13G:
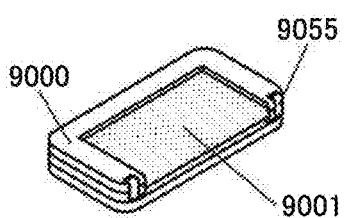

FIGS. 13E, 13F, and 13G are perspective views of a foldable portable information terminal 9201 that is opened, that is shifted from the opened state to the folded state or from the folded state to the opened state, and that is folded, respectively. The portable information terminal 9201 is highly portable when folded. When the portable information terminal 9201 is opened, a seamless large display region provides high browsability. The display portion 9001 of the portable information terminal 9201 is supported by three housings 9000 joined together by hinges 9055. By folding the portable information terminal 9201 at a connection portion between two housings 9000 with the hinges 9055, the portable information terminal 9201 can be reversibly changed in shape from the opened state to the folded state. For example, the portable information terminal 9201 can be bent with a radius of curvature of greater than or equal to 1 mm and less than or equal to 150 mm.

The electronic devices described in this embodiment each include the display portion for displaying some kinds of information. However, a light-emitting device according to one embodiment of the present invention can also be used for an electronic device that does not include a display portion. Furthermore, the display portions of the electronic devices described in this embodiment may also be non-flexible and can display images on a flat surface without limitation to a flexible mode capable of displaying images on a curved display surface or a foldable mode.

The structure described in this embodiment can be used in an appropriate combination with any of the structures described in the other embodiments.

Embodiment 5

In this embodiment, examples of a lighting device to which a light-emitting device according to one embodiment of the present invention is applied will be described with reference to FIG. 14.

Figure 14:
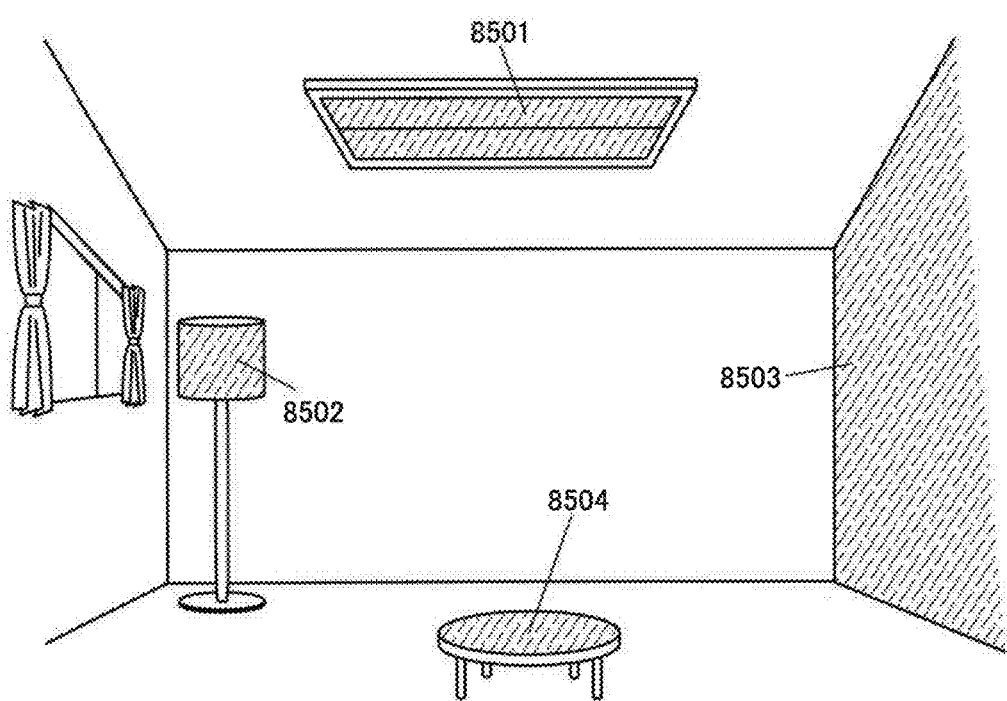
FIG. 14 illustrates lighting devices.

FIG. 14 illustrates an example in which a light-emitting device is used for an indoor lighting device 8501. Since the area of the light-emitting device can be increased, a lighting device having a large area can be formed. In addition, a lighting device 8502 in which a light-emitting region has a curved surface can be obtained with the use of a housing with a curved surface. A light-emitting element included in the light-emitting device described in this embodiment is in the form of a thin film, which allows the housing to be designed more freely. Therefore, the lighting device can be elaborately designed in a variety of ways. Furthermore, a wall of the room may be provided with a large-sized lighting device 8503. Touch sensors may be provided in the lighting devices 8501, 8502, and 8503 to control the power on/off of the lighting devices.

When the light-emitting device is used for a surface of a table, a lighting device 8504 that has a function as a table can be obtained. When the light-emitting device is used as part of other furniture, a lighting device which has a function as the furniture can be obtained.

In this manner, a variety of lighting devices to which the light-emitting device is applied can be obtained. Note that such lighting devices are also embodiments of the present invention.

The structure described in this embodiment can be used in an appropriate combination with any of the structures described in the other embodiments.

Example 1

Figure 15:
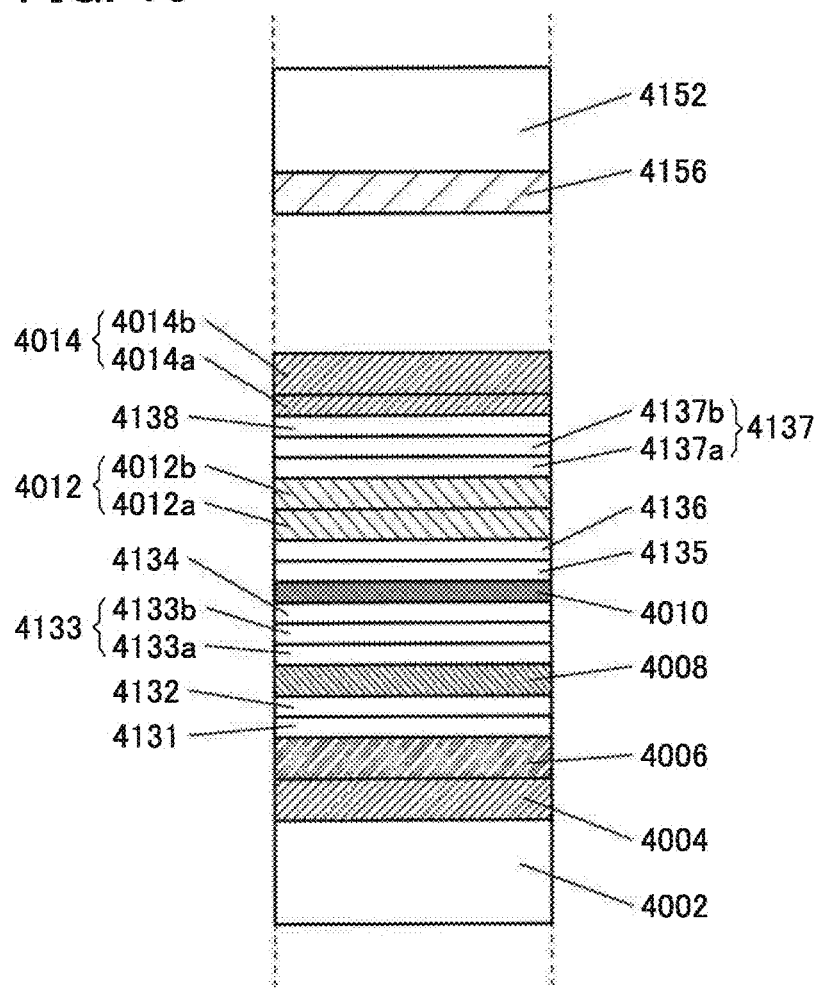
FIG. 15 illustrates an element structure used in Examples.

In this example, a light-emitting element 1 (referred to as LEE 1 in the drawings) and a light-emitting element 2 (referred to as LEE 2 in the drawings) which are embodiments of the present invention and a reference light-emitting element 3 (referred to as LEE 3 in the drawings) were fabricated and evaluated. The element structures of the light-emitting element 1, the light-emitting element 2, and the reference light-emitting element 3 will be described in detail with reference to FIG. 15. First, chemical formulae of materials used for the light-emitting elements in this example are shown below.

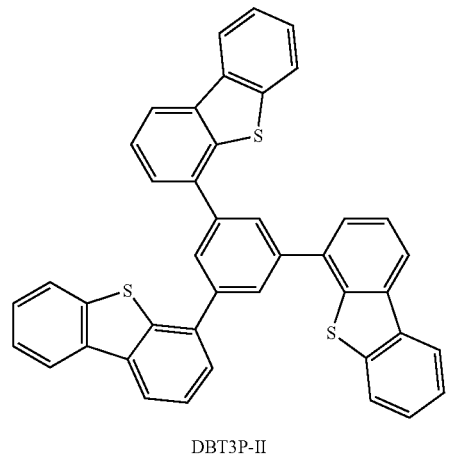

DBT3P-II

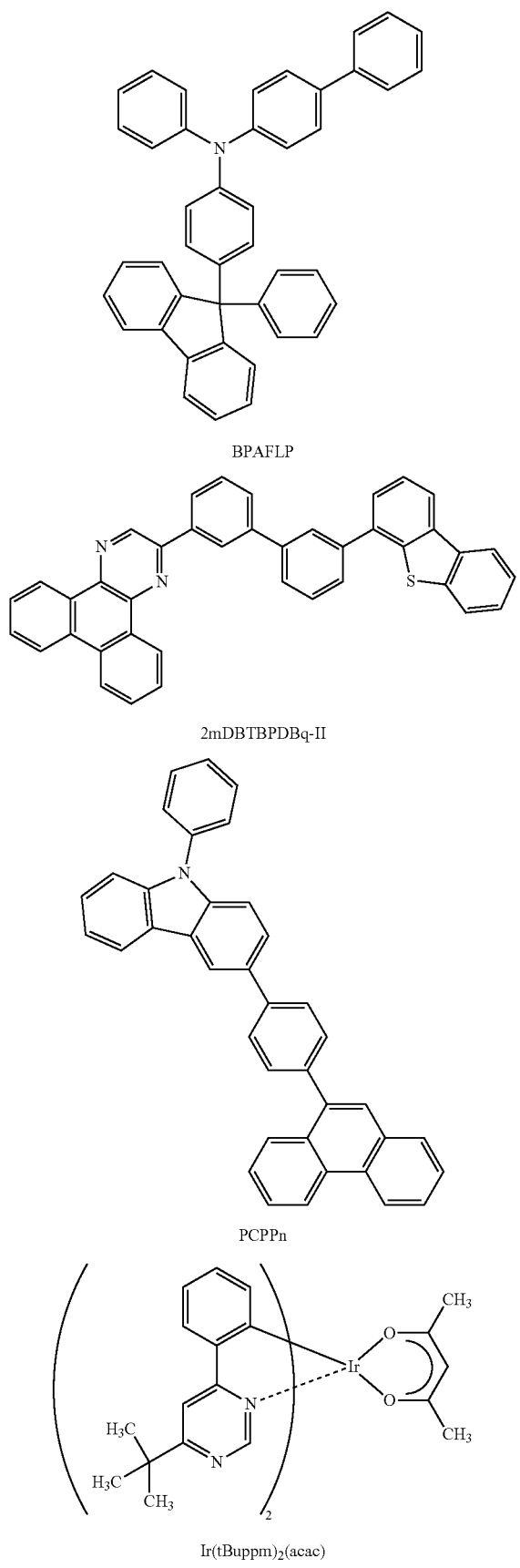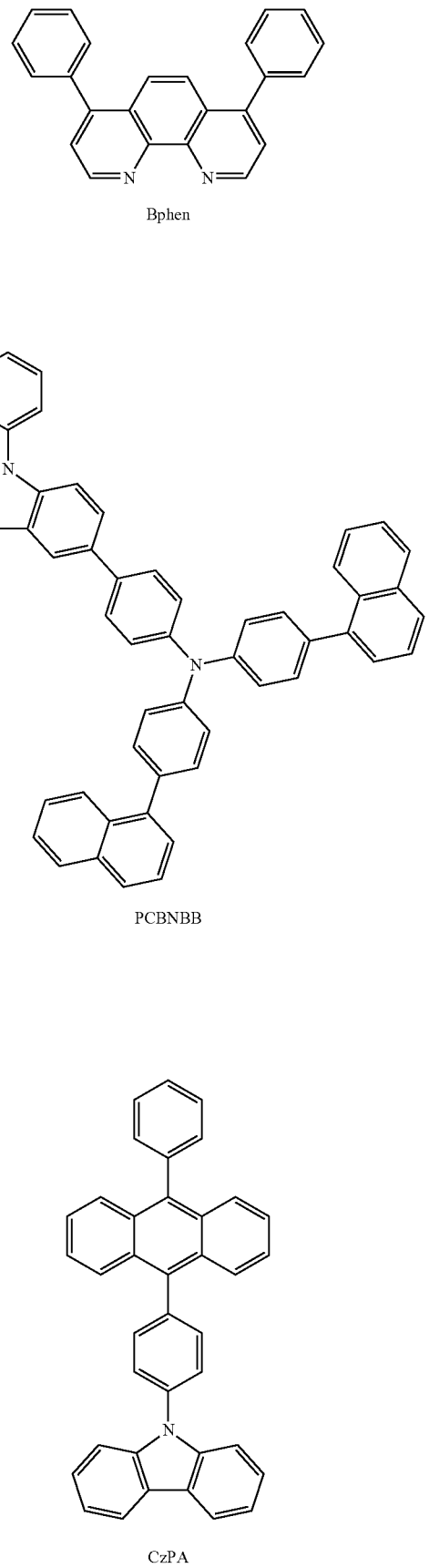

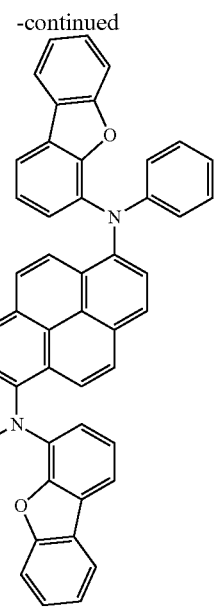

1,6FrAPm-II

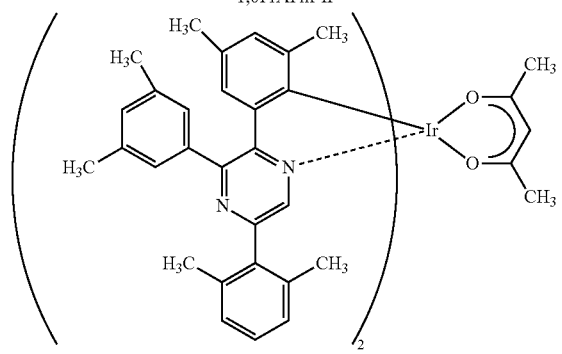

Ir(dmdppr-dmp)₂(acac)

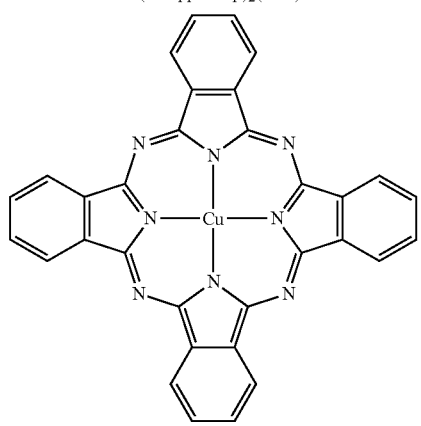

CuPc

A method for fabricating the light-emitting element 1, the light-emitting element 2, and the reference light-emitting element 3 of this example will be described below.

<<Method for Fabricating Light-Emitting Element 1, Light-Emitting Element 2, and Reference Light-Emitting Element 3>>

First, over a substrate 4002, an alloy film of silver (Ag), palladium (Pd), and copper (Cu) (the alloy film is hereinafter referred to as APC) was formed as a reflective electrode 4004 by a sputtering method. Note that the thickness of the reflective electrode 4004 was 100 nm and the area was 4 mm² (2 mm×2 mm).

Then, over the reflective electrode 4004, a film of indium tin oxide containing silicon oxide (the film is hereinafter referred to as ITSO) was formed as a transparent conductive film 4006 by a sputtering method. Note that the thickness of the transparent conductive film 4006 was 60 nm in the light-emitting element 1, the thickness of the transparent conductive film 4006 was 30 nm in the light-emitting element 2, and the thickness of the transparent conductive film 4006 was 10 nm in the reference light-emitting element 3.

Then, as pretreatment of evaporation of an organic compound layer, the transparent conductive film 4006 side of the substrate 4002 provided with the reflective electrode 4004 and the transparent conductive film 4006 was washed with water, baking was performed at 200° C. for one hour, and then UV ozone treatment was performed on a surface of the transparent conductive film 4006 for 370 seconds.

After that, the substrate 4002 was transferred into a vacuum evaporation apparatus in which the pressure had been reduced to approximately $10^{-4}$ Pa, and was subjected to vacuum baking at 170° C. for 60 minutes in a heating chamber of the vacuum evaporation apparatus, and then the substrate 4002 was cooled down for about 30 minutes.

Then, the substrate 4002 was fixed to a holder provided in the vacuum evaporation apparatus so that a surface of the substrate 4002 over which the transparent conductive film 4006 was formed faced downward. In this example, by a vacuum evaporation method, a first hole-injection layer 4131, a first hole-transport layer 4132, a first light-emitting layer 4008, first electron-transport layers 4133*a* and 4133*b*, a first electron-injection layer 4134, a charge-generation layer 4010, a second hole-injection layer 4135, a second hole-transport layer 4136, second light-emitting layers 4012*a* and 4012*b*, second electron-transport layers 4137*a* and 4137*b*, and a second electron-injection layer 4138 were sequentially formed. The fabrication method will be described in detail below.

First, the pressure in the vacuum evaporation apparatus was reduced to $10^{-4}$ Pa. Then, on the transparent conductive film 4006, 3-[4-(9-phenanthryl)-phenyl]-9-phenyl-9H-carbazole (abbreviation: PCPPn) and molybdenum oxide were co-evaporated as the first hole-injection layer 4131 so that the mass ratio of PcPPn to molybdenum oxide was 1:0.5. Note that the thickness of the first hole-injection layer 4131 was 35 nm in each of the light-emitting element 1 and the light-emitting element 2, and the thickness of the first hole-injection layer 4131 was 15 nm in the reference light-emitting element 3.

Then, the first hole-transport layer 4132 was formed on the first hole-injection layer 4131. As the first hole-transport layer 4132, PCPPn was evaporated. Note that the thickness of the first hole-transport layer 4132 was 15 nm in each of the light-emitting element 1 and the light-emitting element 2, and the thickness of the first hole-transport layer 4132 was 10 nm in the reference light-emitting element 3.

Then, the first light-emitting layer 4008 was formed on the first hole-transport layer 4132. As the first light-emitting layer 4008, 9-[4-(0-phenyl-9-anthracenyl)phenyl]-9H-carbazole (abbreviation: CzPA) and N,N'-bis(dibenzofuran-4-yl)-N,N'-diphenylpyrene-1,6-diamine (abbreviation: 1,6FrAPrn-II) were co-evaporated so that the mass ratio of CzPA to 1,6FrAPrn-II was 1:0.05. The thickness of the first light-emitting layer 4008 was 25 nm.

Then, on the first light-emitting layer 4008, CzPA was evaporated to a thickness of 5 nm as the first electron-transport layer 4133a. Then, on the first electron-transport layer 4133a, bathophenanthroline (abbreviation: Bphen) was evaporated to a thickness of 15 nm as the first electron-transport layer 4133b. Then, on the first electron-transport layer 4133b, lithium oxide ($Li_2O$) was evaporated to a thickness of 0.1 nm as the first electron-injection layer 4134.

Then, on the first electron-injection layer 4134, copper phthalocyanine (abbreviation: CuPc) was evaporated to a thickness of 2 nm as the charge-generation layer 4010.

Then, on the charge-generation layer 4010, 1,3,5-tri (dibenzothiophen-4-yl)benzene (abbreviation: DBT3P-II) and molybdenum oxide were co-evaporated as the second hole-injection layer 4135 so that the mass ratio of DBT3P-II to molybdenum oxide was 10.5. Note that the thickness of the second hole-injection layer 4135 was 12.5 nm.

Then, on the second hole-injection layer 4135, BPAFLP was evaporated to a thickness of 20 nm as the second hole-transport layer 4136.

Then, on the second hole-transport layer 4136, 2-[3'-(dibenzothiophen-4-yl)biphenyl-3-yl]dibenzo[f,h]quinoxaline (abbreviation: 2mDBTBPDBq-II), 4,4'-di(1-naphthyl)-4''-(9-phenyl-9H-carbazol-3-yl)triphenylamine (abbreviation: PCBNBB), and (acetylacetonato)bis(6-tert-butyl-4-phenylpyrimidinato)iridium(III) (abbreviation: $Ir(tBuppm)_2(acac)$) were co-evaporated as the second light-emitting layer 4012a so that the mass ratio of 2mDBTBP-DBq-II to PCBNBB and $Ir(tBuppm)_2(acac)$ was 0.7:03:0.06. Note that the thickness of the second light-emitting layer 4012a was 20 ran.

Then, on the second light-emitting layer 4012a, 2mDBT-BPDBq-II and bis{4,6-dimethyl-2-[5-(2,6-dimethylphenyl)-3-(3,5-dimethylphenyl)-2-pyrazinyl-κN]phenyl-κC} (2,4-pentanedionato-$κ^2O,O'$)iridium(II) (abbreviation: $Ir(dmdppr-dmp)_2(acac)$) were co-evaporated as the second light-emitting layer 4012b so that the mass ratio of 2mDBT-BPDBq-II to $Ir(dmdppr-dmp)_2(acac)$ was 1:0.06. Note that the thickness of the second light-emitting layer 4012b was 20 nm.

Then, on the second light-emitting layer 4012b, 2-[3-(dibenzothiophen-4-yl)phenyl]dibenzo[f,h]quinoxaline (abbreviation: 2mDBTPDBq-II) was evaporated to a thickness of 30 nm as the second electron-transport layer 4137a. Then, on the second electron-transport layer 4137a, Bphen was evaporated to a thickness of 15 nm as the second electron-transport layer 4137b.

Then, on the second electron-transport layer 4137b, lithium fluoride (LiF) was evaporated to a thickness of 1 nm as the second electron-injection layer 4138.

Then, on the second electron-injection layer 4138, silver (Ag) and magnesium (Mg) were co-evaporated as a semi-transmissive and semi-reflective electrode 4014a so that the volume ratio was 1:0.1. Note that the thickness of the semi-transmissive and semi-reflective electrode 4014a was 15 nm. Then, on the semi-transmissive and semi-reflective electrode 4014a, a film of indium tin oxide (ITO) with a thickness of 70 nm was formed by a sputtering method as a semi-transmissive and semi-reflective electrode 4014b.

In all of the above evaporation steps, evaporation was performed by a resistance-heating method.

Table 1 shows the element structures of the light-emitting element 1, the light-emitting element 2, and the reference light-emitting element 3 fabricated as described above.

TABLE 1

| | Reflective Electrode | Transparent Conductive Film | First Hole-injection Layer | First Hole-transport Layer | First Light-emitting Layer | First Electron-transport Layer | |
|---|---|---|---|---|---|---|---|
| Light-emitting Element 1 | APC (100 nm) | ITSO (60 nm) | PCPPn:MoOx (1:0.5) (35 nm) | PCPPn (15 nm) | *1) | CzPA (5 nm) | BPhen (15 nm) |
| Light-emitting Element 2 | | ITSO (30 nm) | PCPPn:MoOx (1:0.5) (35 nm) | PCPPn (15 nm) | | | |
| Rerence Light-emitting Element 3 | | ITSO (10 nm) | PCPPn:MoOx (1:05) (15 nm) | PCPPn (10 nm) | | | |

| First Electron-injection Layer | Charge-generation Layer | Second Hole-injection Layer | Second Hole-transport Layer | Second Light-emitting Layer |
|---|---|---|---|---|
| $Li_2O$ (0.1 nm) | CuPc (2 nm) | DBT3P-II:MoOx (1:0.5) (12.5 nm) | BPAFLP (20 nm) | *2)    *3) |

| Second Electron-transport Layer | | Second Electron-injection Layer | Semi-transmissive and Semi-reflective Electrode | | Coloring Layer |
|---|---|---|---|---|---|
| 2mDBTBPDBq-II (30 nm) | Bphen (15 nm) | LiF (1 nm) | Ag:Mg (1:0.1) (15 nm) | ITO (70 nm) | Red 2.4 μm Green 1.3 μm Blue 0.6 μm |

*1) CzPA:1,6FrAPrn-II(1:0.05)(25 nm)
*2) 2mDBTBPDBq-II:PCBNBB:Ir(tBuppm)₂(acac) (0.7:0.3:0.06) (20 nm)
*3) 2mDBTBPDBq-II:Ir(dmdppr-dmp)₂(acac) (1:0.06) (20 nm)

As shown in Table 1, a red color filter (R) with a thickness of 2.4 μm was formed as a coloring layer 4156 on a counter substrate 4152 in the light-emitting element 1, a green color filter (G) with a thickness of 1.3 μm was formed as the coloring layer 4156 on the counter substrate 4152 in the light-emitting element 2, and a blue color filter (B) with a thickness of 0.6 μm was formed as the coloring layer 4156 on the counter substrate 4152 in the reference light-emitting element 3.

Each of the light-emitting element 1, the light-emitting element 2, and the reference light-emitting element 3 fabricated as described above was sealed by being bonded to the counter substrate 4152 fabricated as described above in a glove box in a nitrogen atmosphere so as not to be exposed to the air (specifically, a sealant was applied to surround the element, and irradiation with ultraviolet light having a wavelength of 365 nm at 6 J/cm$^2$ and heat treatment at 80° C. for 1 hour were performed for sealing).

<<Operation Characteristics of Light-Emitting Element 1, Light-Emitting Element 2, and Reference Light-Emitting Element 3>>

Operation characteristics of the light-emitting element 1, the light-emitting element 2, and the reference light-emitting element 3 fabricated as described above were measured. Note that measurements were performed at room temperature (in an atmosphere kept at 25° C.).

Figure 16A:
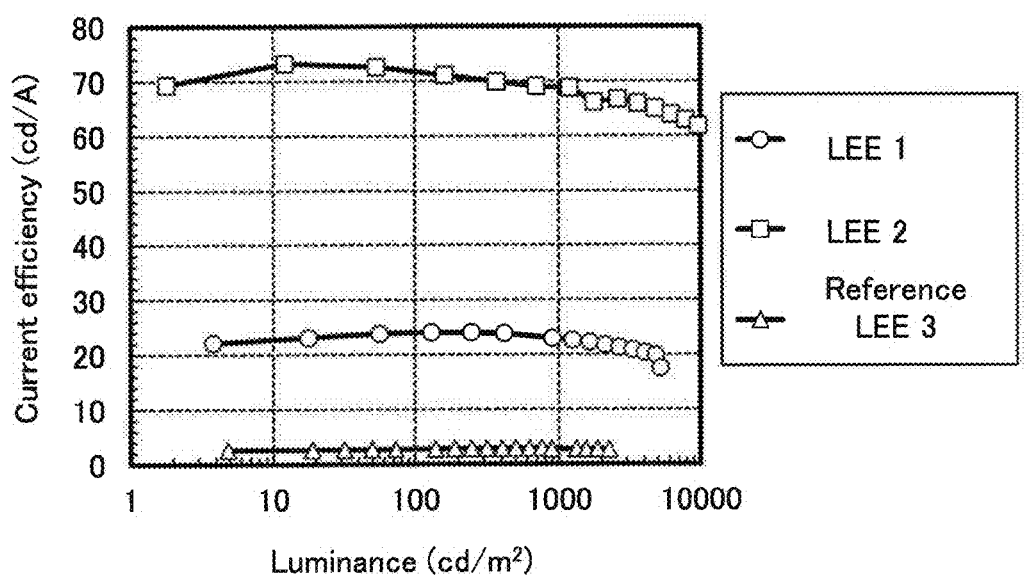
FIGS. 16A and 16B are graphs showing current efficiency-luminance characteristics and current-voltage characteristics of light-emitting elements fabricated in Example 1.
Figure 16B:
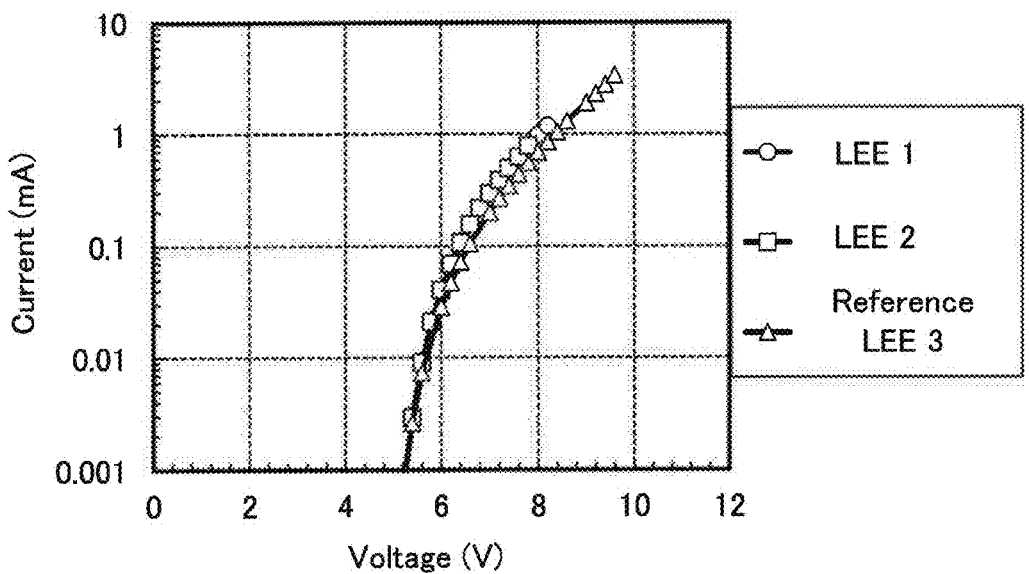
Figure 17:
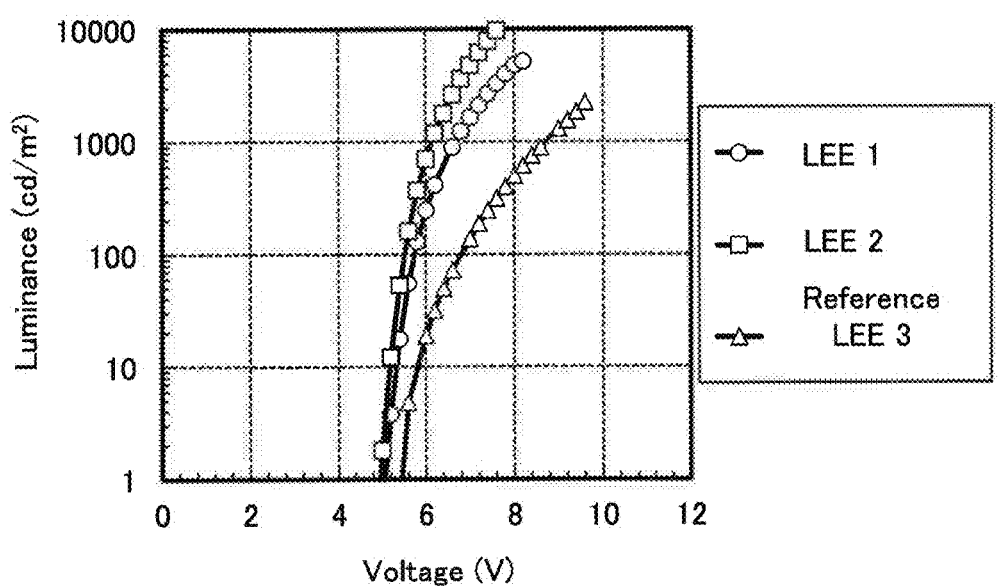
FIG. 17 is a graph showing luminance-voltage characteristics of light-emitting elements fabricated in Example 1.

FIG. 16A shows current efficiency-luminance characteristics of the light-emitting element 1, the light-emitting element 2, and the reference light-emitting element 3. In FIG. 16A, the vertical axis represents current efficiency (cd/A) and the horizontal axis represents luminance (cd/m$^2$). FIG. 16B shows current-voltage characteristics of the light-emitting element 1, the light-emitting element 2, and the reference light-emitting element 3. In FIG. 16B, the vertical axis represents current (mA) and the horizontal axis represents voltage (V). FIG. 17 shows luminance-voltage characteristics of the light-emitting element 1, the light-emitting element 2, and the reference light-emitting element 3. In FIG. 17, the vertical axis represents luminance (cd/m$^2$) and the horizontal axis represents voltage (V).

Table 2 shows initial values of main characteristics of the light-emitting element 1, the light-emitting element 2, and the reference light-emitting element 3 at a luminance of about 1000 cd/m$^2$.

can be achieved. However, when the reference light-emitting element 3 was compared with the light-emitting elements 1 and 2 (although they cannot be simply compared with each other because the element structures and the emission wavelengths were different from each other), the current efficiency of the reference light-emitting element 3 was lower than those of the light-emitting elements 1 and 2.

Example 2

In this example, a light-emitting element 4 (referred to as LEE 4 in the drawings) and a light-emitting element 5 (referred to as LEE 5 in the drawings) which are embodiments of the present invention were fabricated and evaluated. The element structures of the light-emitting element 4 and the light-emitting element 5 will be described in detail with reference to FIG. 15. The light-emitting element 4 and the light-emitting element 5 in this example were fabricated by using the same materials as those of the light-emitting elements in Example 1. Therefore, description of chemical formulae of materials used in this example is omitted.

<<Method for Fabricating Light-Emitting Element 4 and Light-Emitting Element 5>>

First, over the substrate 4002, APC was formed as the reflective electrode 4004 by a sputtering method. Note that the thickness of the reflective electrode 4004 was 100 nm and the area was 4 mm$^2$ (2 mm×2 mm).

Then, over the reflective electrode 4004, ITSO was formed as the transparent conductive film 4006 by a sputtering method. Note that the thickness of the transparent conductive film 4006 was 60 nm in each of the light-emitting element 4 and the light-emitting element 5.

Then, as pretreatment of evaporation of an organic compound layer, the transparent conductive film 4006 side of the substrate 4002 provided with the reflective electrode 4004 and the transparent conductive film 4006 was washed with water, baking was performed at 200° C. for one hour, and

TABLE 2

|  | Voltage (V) | Current (mA) | Current Density (mA/cm$^2$) | Chromaticity (x, y) | Luminance (cd/m$^2$) | Current Efficiency (cd/A) |
| --- | --- | --- | --- | --- | --- | --- |
| Light-emitting Element 1 | 6.6 | 0.15 | 3.9 | (0.67, 0.33) | 903 | 23.0 |
| Light-emitting Element 2 | 6.2 | 0.07 | 1.7 | (0.28, 0.71) | 1193 | 68.8 |
| Reference Light-emitting Element 3 | 8.8 | 1.59 | 39.7 | (0.14, 0.06) | 1086 | 2.7 |

Figure 18:
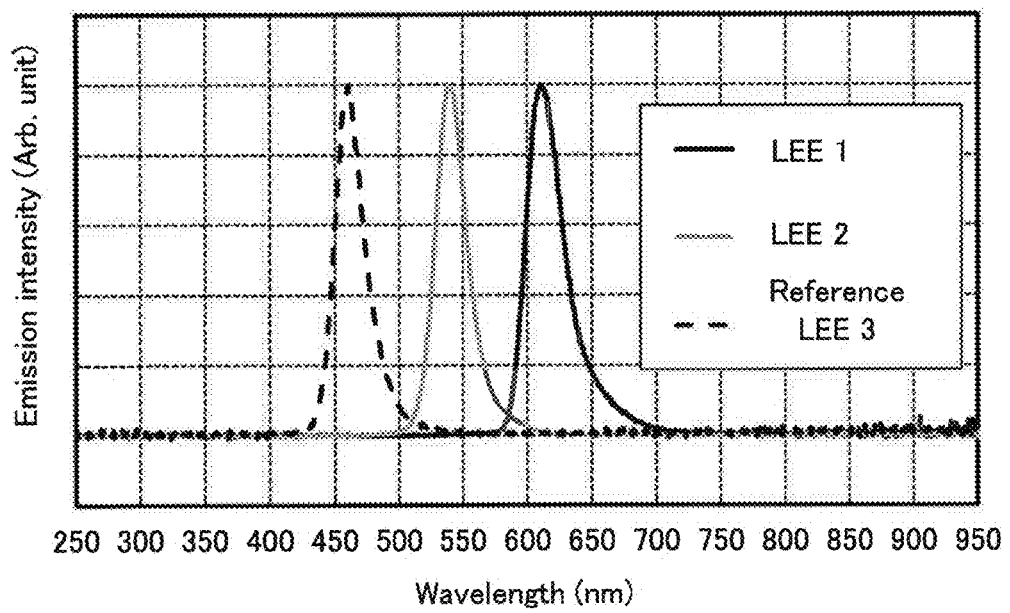
FIG. 18 is a graph showing emission spectra of light-emitting elements fabricated in Example 1.

FIG. 18 shows the emission spectra of the light-emitting element 1, the light-emitting element 2, and the reference light-emitting element 3 through which current flows at a current density of 2.5 mA/cm$^2$. As shown in FIG. 18, the emission spectrum of the light-emitting element 1 has a peak at around 611 nm, the emission spectrum of the light-emitting element 2 has a peak at around 539 nm, and the emission spectrum of the reference light-emitting element 3 has a peak at around 460 nm.

The above results suggest that the light-emitting element 1 emits red light (R), the light-emitting element 2 emits green light (G), and the reference light-emitting element 3 emits blue light (B); thus, by using the light-emitting element 1, the light-emitting element 2, and the reference light-emitting element 3 in combination, full-color display then UV ozone treatment was performed on a surface of the transparent conductive film 4006 for 370 seconds.

After that, the substrate 4002 was transferred into a vacuum evaporation apparatus in which the pressure had been reduced to approximately 10$^{-4}$ Pa, and was subjected to vacuum baking at 170° C. for 60 minutes in a heating chamber of the vacuum evaporation apparatus, and then the substrate 4002 was cooled down for about 30 minutes.

Then, the substrate 4002 was fixed to a holder provided in the vacuum evaporation apparatus so that a surface of the substrate 4002 over which the transparent conductive film 4006 was formed faced downward. In this example, by a vacuum evaporation method, the first hole-injection layer 4131, the first hole-transport layer 4132, the first light-emitting layer 4008, the first electron-transport layers 4133a and 4133b, the first electron-injection layer 4134, the charge-generation layer 4010, the second hole-injection layer 4135, the second hole-transport layer 4136, the second light-emitting layers 4012a and 4012b, the second electron-transport layers 4137a and 4137b, and the second electron-injection layer 4138 were sequentially formed. The fabrication method will be described in detail below.

First, the pressure in the vacuum evaporation apparatus was reduced to $10^{-4}$ Pa. Then, on the transparent conductive film 4006, PCPPn and molybdenum oxide were co-evaporated as the first hole-injection layer 4131 so that the mass ratio of PcPPn to molybdenum oxide was 1:0.5. Note that the thickness of the first hole-injection layer 4131 was 65 nm in the light-emitting element 4, and the thickness of the first hole-injection layer 4131 was 70 nm in the light-emitting element 5.

Then, the first hole-transport layer 4132 was formed on the first hole-injection layer 4131. As the first hole-transport layer 4132, PCPPn was evaporated. Note that the thickness of the first hole-transport layer 4132 was 15 n in each of the light-emitting element 4 and the light-emitting element 5.

Then, the first light-emitting layer 4008 was formed on the first hole-transport layer 4132. As the first light-emitting layer 4008, CzPA and 1,6FrAPrn-II were co-evaporated so that the mass ratio of CzPA to 1,6FrAPrn-II was 1:0.05. The thickness of the first light-emitting layer 4008 was 25 nm.

Then, on the first light-emitting layer 4008, CzPA was evaporated to a thickness of 5 nm as the first electron-transport layer 4133a. Then, on the first electron-transport layer 4133a, Bphen was evaporated to a thickness of 15 nm as the first electron-transport layer 4133b. Then, on the first electron-transport layer 4133b, Li$_2$O was evaporated to a thickness of 0.1 nm as the first electron-injection layer 4134.

Then, on the first electron-injection layer 4134, CuPc was evaporated to a thickness of 2 nm as the charge-generation layer 4010.

Then, on the charge-generation layer 4010, DBT3P-II and molybdenum oxide were co-evaporated as the second hole-injection layer 4135 so that the mass ratio of DBT3P-II to molybdenum oxide was 1:0.5. Note that the thickness of the second hole-injection layer 4135 was 12.5 nm.

Then, on the second hole-injection layer 4135, BPAFLP was evaporated to a thickness of 20 nm as the second hole-transport layer 4136.

Then, on the second hole-transport layer 4136, 2mDBT-BPDBq-II, PCBNBB, and Ir(tBuppm)$_2$(acac) were co-evaporated as the second light-emitting layer 4012a so that the mass ratio of 2mDBTBPDBq-II to PCBNBB and Ir(tBuppm)$_2$(acac) was 0.7:03:0.06. Note that the thickness of the second light-emitting layer 4012a was 20 nm.

Then, on the second light-emitting layer 4012a, 2mDBT-BPDBq-II and Ir(dmdppr-dmp)$_2$(acac) were co-evaporated as the second light-emitting layer 4012b so that the mass ratio of 2mDBTBPDBq-II to Ir(dmdppr-dmp)$_2$(acac) was 1:0.06. Note that the thickness of the second light-emitting layer 4012b was 20 nm.

Then, on the second light-emitting layer 4012b, 2mDBT-PDBq-II was evaporated to a thickness of 30 nm as the second electron-transport layer 4137a. Then, on the second electron-transport layer 4137a, Bphen was evaporated to a thickness of 15 nm as the second electron-transport layer 4137b.

Then, on the second electron-transport layer 4137, LiF was evaporated to a thickness of 1 nm as the second electron-injection layer 4138.

Then, on the second electron-injection layer 4138, silver (Ag) and magnesium (Mg) were co-evaporated as the semi-transmissive and semi-reflective electrode 4014a so that the volume ratio was 1:0.1. Note that the thickness of the semi-transmissive and semi-reflective electrode 4014a was 15 nm. Then, on the semi-transmissive and semi-reflective electrode 4014a, a film of ITO with a thickness of 70 nm was formed by a sputtering method as the semi-transmissive and semi-reflective electrode 4014b.

In all of the above evaporation steps, evaporation was performed by a resistance-heating method.

Table 3 shows the element structures of the light-emitting element 4 and the light-emitting element 5 fabricated as described above.

TABLE 3

| | Reflective Elektrode | Transparent Conductive Film | First Hole-injection Layer | First Hole-transport Layer | First Light-emitting Layer | First Electron-transport Layer | |
|---|---|---|---|---|---|---|---|
| Light-emitting Element 4 | APC (100 nm) | ITSO (60 nm) | PCPPn:MoOx (1:0.5) (65 nm) | PCPPn (15 nm) | *1) | CzPA (5 nm) | BPhen (15 nm) |
| Light-emitting Element 5 | | ITSO (60 nm) | PCPPn:MoOx (1:0.5) (70 nm) | PCPPn (15 nm) | | | |

| First Electron-injection Layer | Charge-generation Layer | Second Hole-injection Layer | Second Hole-transport Layer | | Second Light-emitting Layer |
|---|---|---|---|---|---|
| Li$_2$O (0.1 nm) | CuPc (2 nm) | DBT3P-II:MoOx (1:0.5) (12.5 nm) | BPAFLP (20 nm) | *2) | *3) |

| Second Electron-transport Layer | Second Electron-injection Layer | Semi-transmissive and Semi-reflective Electrode | | Coloring Layer |
|---|---|---|---|---|
| 2mDBTBPDBq-II (30 nm) | Bphen (15 nm) | LiF (1 nm) | Ag:Mg (1:0.1) (15 nm) | ITO (70 nm) | Blue 0.6 μm |
| | | | | | Blue 1.0 μm |

*1) CzPA:1,6FrAPrn-II(1:0.05)(25 nm)
*2) 2mDBTBPDBq-II:PCBNBB:Ir(tBuppm)$_2$(acac) (0.7:0.3:0.06) (20 nm)
*3) 2mDBTBPDBq-II:Ir(dmdppr-dmp)$_2$(acac) (1:0.06) (20 nm)

As shown in Table 3, a blue color filter (B) with a thickness of 0.6 μm was formed as the coloring layer 4156 on the counter substrate 4152 in the light-emitting element 4, and a blue color filter (B) with a thickness of 1.0 μm was formed as the coloring layer 4156 on the counter substrate 4152 in the light-emitting element 5.

Each of the light-emitting element 4 and the light-emitting element 5 fabricated as described above was sealed by being bonded to the counter substrate 4152 fabricated as described above in a glove box in a nitrogen atmosphere so as not to be exposed to the air (specifically, a sealant was applied to surround the element, and irradiation with ultraviolet light having a wavelength of 365 nm at 6 J/cm² and heat treatment at 80° C. for 1 hour were performed for sealing).

<<Operation Characteristics of Light-Emitting Element 4 and Light-Emitting Element 5>>

Operation characteristics of the light-emitting element 4 and the light-emitting element 5 fabricated as described above were measured. Note that measurements were performed at room temperature (in an atmosphere kept at 25° C.).

Figure 19A:
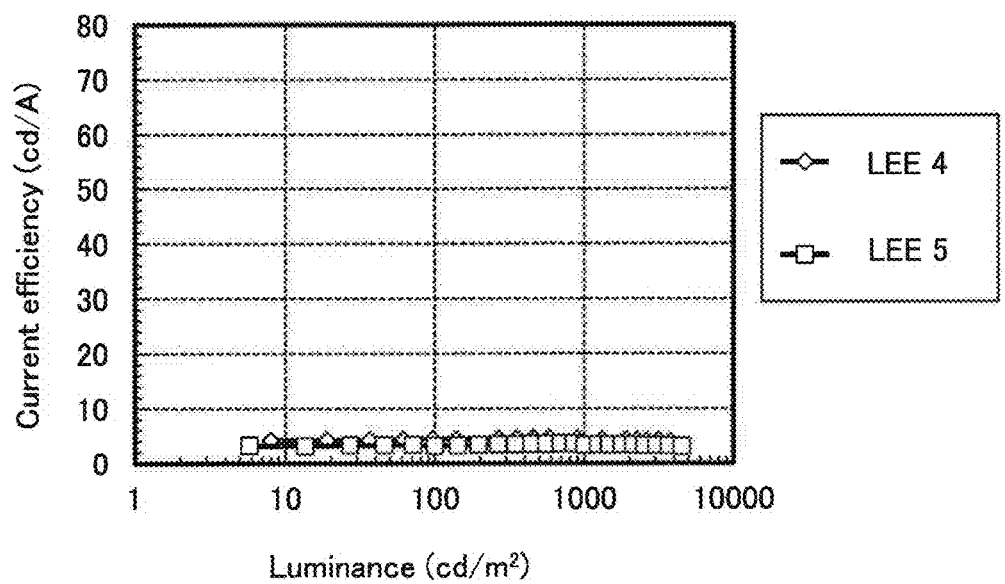
FIGS. 19A and 19B are graphs showing current efficiency-luminance characteristics and current-voltage characteristics of light-emitting elements fabricated in Example 2.
Figure 19B:
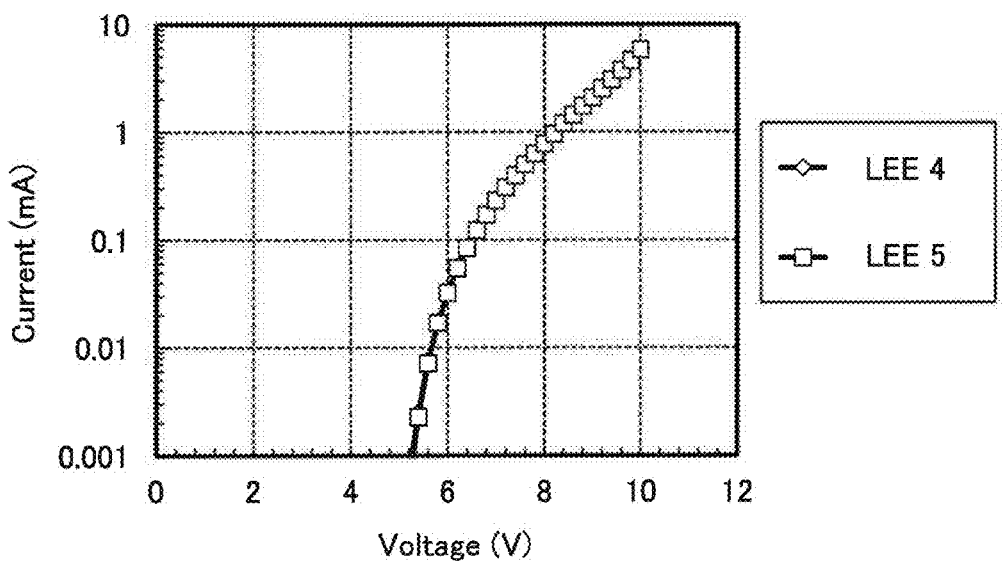
Figure 20:
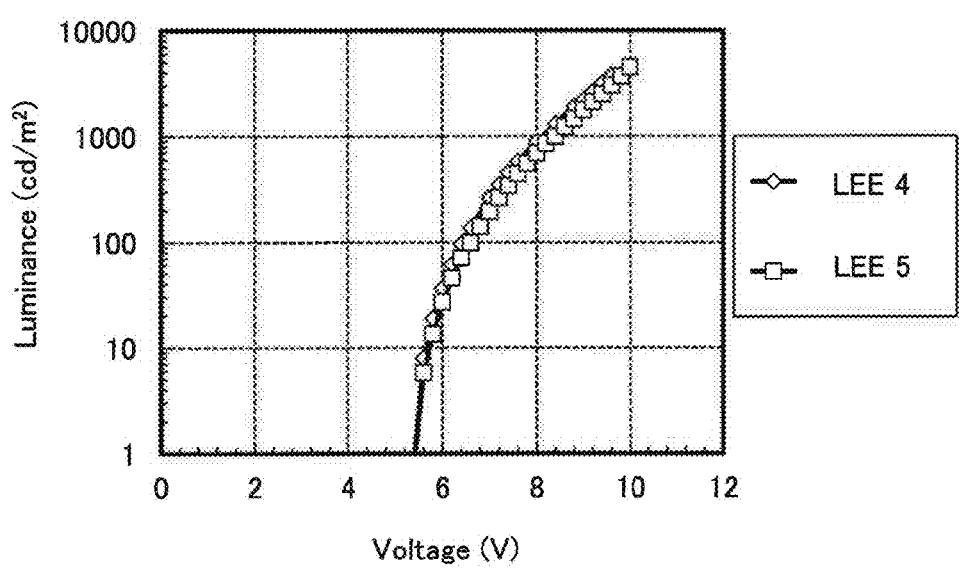
FIG. 20 is a graph showing luminance-voltage characteristics of light-emitting elements fabricated in Example 2.

FIG. 19A shows current efficiency-luminance characteristics of the light-emitting element 4 and the light-emitting element 5. In FIG. 19A, the vertical axis represents current efficiency (cd/A) and the horizontal axis represents luminance (cd/m²). FIG. 19B shows current-voltage characteristics of the light-emitting element 4 and the light-emitting element 5. In FIG. 19B, the vertical axis represents current (mA) and the horizontal axis represents voltage (V). FIG. 20 shows luminance-voltage characteristics of the light-emitting element 4 and the light-emitting element 5. In FIG. 20, the vertical axis represents luminance (cd/m²) and the horizontal axis represents voltage (V). In FIGS. 19A and 19B and FIG. 20, the measurement results of the light-emitting element 4 and the light-emitting element 5 are substantially the same.

Table 4 shows initial values of main characteristics of the light-emitting element 4 and the light-emitting element 5 at a luminance of about 1000 cd/m².

TABLE 4

| | Voltage (V) | Current (mA) | Current Density (mA/cm²) | Chromaticity (x, y) | Luminance (cd/m²) | Current Efficiency (cd/A) |
|---|---|---|---|---|---|---|
| Light-emitting Element 4 | 8.2 | 0.98 | 24.4 | (0.16, 0.07) | 1040 | 4.3 |
| Licht-emitting Element 5 | 8.4 | 1.19 | 29.9 | (0.14, 0.07) | 1001 | 3.4 |

Figure 21:
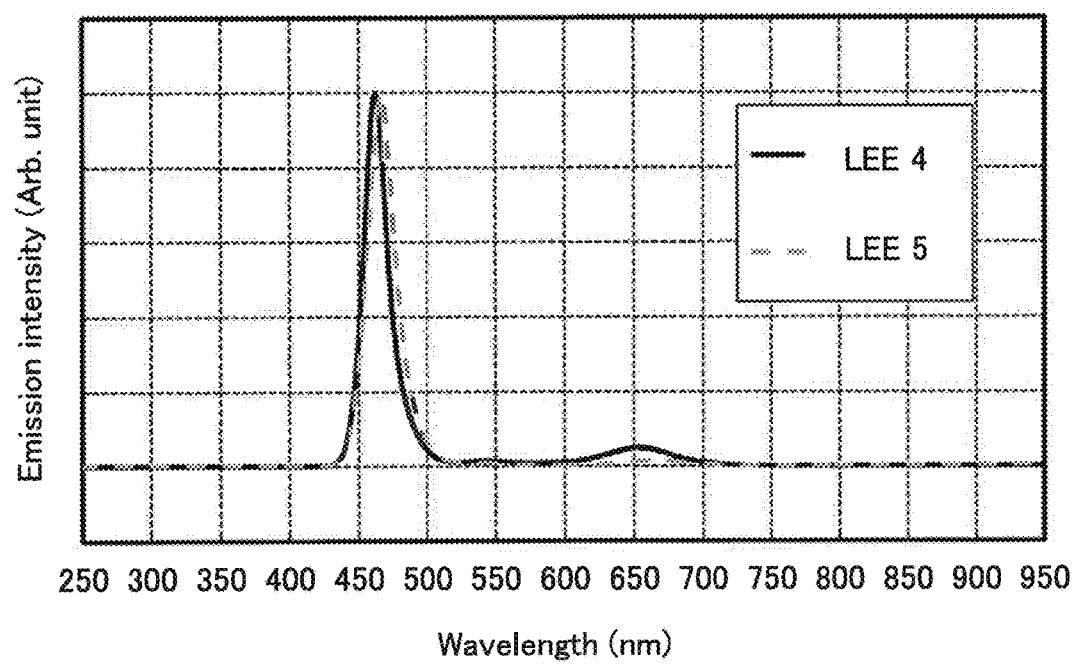
FIG. 21 is a graph showing emission spectra of light-emitting elements fabricated in Example 2.

FIG. 21 shows the emission spectra of the light-emitting element 4 and the light-emitting element 5 through which current flows at a current density of 2.5 mA/cm². As shown in FIG. 21, the emission spectrum of the light-emitting element 4 has a peak at around 462 nm, and the emission spectrum of the light-emitting element 5 has a peak at around 466 nm.

The above results suggest that the light-emitting element 4 and the light-emitting element 5 emit blue light (B) and that the current efficiency of the light-emitting element 4 and the light-emitting element 5 which are embodiments of the present invention is higher than that of the reference light-emitting element 3 fabricated in Example 1, which might be caused by a difference in optical path length between APC used as the reflective electrode and the first light-emitting layer.

Table 5 shows the following data: the optical path length between APC and the first light-emitting layer (hereinafter referred to as EML1 in some cases) of each of the light-emitting element 1, the light-emitting element 2, and the reference light-emitting element 3 fabricated in Example 1, and the light-emitting element 4 and the light-emitting element 5 fabricated in Example 2; the optical path length between APC and the second light-emitting layer (hereinafter referred to as EML2 in some cases) of each of the light-emitting elements; and ¼ and ¾ of the wavelength of light emitted from each of the light-emitting elements.

TABLE 5

| | Optical Path Length between APC and EML1 | Optical Path Length between APC and EML2 | λ/4 | 3 λ/4 |
|---|---|---|---|---|
| Light-emitting Element 1 | 275 | 454 | 153 | 458 |
| Light-emitting Element 2 | 209 | 388 | 135 | 404 |
| Reference Light-emitting Element 3 | 117 | 297 | 115 | 345 |
| Light-emitting Element 4 | 332 | 511 | 116 | 347 |
| Light-emitting Element 5 | 341 | 521 | 117 | 350 |

※ λ represents wavelength of light emitted from each light-emitting element.

The optical path length in Table 5 was calculated under the following conditions: the refractive index of the ITSO film used as the transparent conductive film 4006 was 2.2, and the reflective indices of the other organic layers (the first hole-injection layer 4131, the first hole-transport layer 4132, the first light-emitting layer 4008, the first electron-transport layer 4133, the first electron-injection layer 4134, the charge-generation layer 4010, the second hole-injection layer 4135, the second hole-transport layer 4136, and the second light-emitting layer 4012) were 1.9.

It is suggested that, as shown in Table 5, because the optical path length between APC and EML1 was approximately $\lambda_B/4$ in the reference light-emitting element 3, light was scattered or absorbed in the vicinity of a surface of APC, which led to a low current efficiency. On the other hand, it is suggested that because the optical path length between APC and EML1 was approximately $3\lambda_B/4$ in each of the light-emitting element 4 and the light-emitting element 5 which are embodiments of the present invention, scattering or absorption of light in the vicinity of a surface of APC was suppressed, which led to a higher current efficiency than in the reference light-emitting element 3.

Table 5 also shows that the optical path length between APC and EML2 was approximately $3\lambda_R/4$ in the light-emitting element 1 which is one embodiment of the present invention and that the optical path length between APC and EML2 was approximately $3\lambda_G/4$ in the light-emitting element 2 which is one embodiment of the present invention.

The structures described in this example can be used in an appropriate combination with any of the structures described in the other embodiments and example.

This application is based on Japanese Patent Application serial no. 2014-101116 filed with Japan Patent Office on May 15, 2014, the entire contents of which are hereby incorporated by reference.

What is claimed is:

1. A light-emitting device comprising:
 a first light-emitting element being capable of emitting blue light, the first light-emitting element comprising:
  a first transparent conductive film;
  a first light-emitting layer over the first transparent conductive film;
  a second light-emitting layer over the first light-emitting layer; and
  an electrode over the second light-emitting layer,
 a second light-emitting element being capable of emitting green light, the second light-emitting element comprising:
  a second transparent conductive film;
  the first light-emitting layer over the second transparent conductive film;
  the second light-emitting layer over the first light-emitting layer; and
  the electrode over the second light-emitting layer,
 a third light-emitting element being capable of emitting red light, the third light-emitting element comprising:
  a third transparent conductive film;
  the first light-emitting layer over the third transparent conductive film;
  the second light-emitting layer over the first light-emitting layer; and
  the electrode over the second light-emitting layer, and
 a fourth light-emitting element being capable of emitting white light, the fourth light-emitting element comprising:
  a fourth transparent conductive film;
  the first light-emitting layer over the fourth transparent conductive film;
  the second light-emitting layer over the first light-emitting layer; and
  the electrode over the second light-emitting layer,
 wherein the first transparent conductive film has a first region,
 wherein the second transparent conductive film has a second region,
 wherein the third transparent conductive film has a third region,
 wherein the fourth transparent conductive film has a fourth region,
 wherein the first region is thicker than the third region and the fourth region, and
 wherein each of the third region and the fourth region is thicker than the second region.

2. The light-emitting device according to claim 1,
 wherein the first light-emitting layer comprises a first light-emitting substance emitting light of at least one of violet, blue, and blue green, and
 wherein the second light-emitting layer comprises a second light-emitting substance emitting light of at least one of green, yellow green, yellow, orange, and red.

3. The light-emitting device according to claim 1, further comprising a first reflective electrode in contact with the first transparent conductive film,
 wherein an optical path length between the first reflective electrode and the first light-emitting layer is greater than or equal to $\frac{3}{4}\lambda_B$, $\lambda_B$ being a wavelength range of greater than or equal to 420 nm and less than or equal to 480 nm, and
 wherein the first reflective electrode comprises silver.

4. The light-emitting device according to claim 1, further comprising:
 a second reflective electrode in contact with the second transparent conductive film; and
 a third reflective electrode in contact with the third transparent conductive film,
 wherein an optical path length between the second reflective electrode and the first light-emitting layer is less than $\frac{3}{4}\lambda_G$, $\lambda_G$ being a wavelength range of greater than or equal to 500 nm and less than 550 nm,
 wherein an optical path length between the third reflective electrode and the first light-emitting layer is less than $\frac{3}{4}\lambda_R$, $\lambda_R$ being a wavelength range of greater than or equal to 600 nm and less than or equal to 740 nm,
 wherein the second reflective electrode comprises silver, and
 wherein the third reflective electrode comprises silver.

5. The light-emitting device according to claim 1, further comprising:
 a second reflective electrode in contact with the second transparent conductive film; and
 a third reflective electrode in contact with the third transparent conductive film,
 wherein an optical path length between the second reflective electrode and the second light-emitting layer is around $\frac{3}{4}\lambda_G$, $\lambda_G$ being a wavelength range of greater than or equal to 500 nm and less than 550 nm,
 wherein an optical path length between the third reflective electrode and the second light-emitting layer is around $\frac{3}{4}\lambda_R$, $\lambda_R$ being a wavelength range of greater than or equal to 600 nm and less than or equal to 740 nm,
 wherein the second reflective electrode comprises silver, and
 wherein the third reflective electrode comprises silver.

6. An electronic device comprising:
 the light-emitting device according to claim 1, and
 at least one of a housing and a touch sensor.

7. A light-emitting device comprising:
 a first light-emitting element being capable of emitting blue light, the first light-emitting element comprising:
  a first transparent conductive film;
  a first light-emitting layer over the first transparent conductive film;
  a second light-emitting layer over the first light-emitting layer; and
  an electrode over the second light-emitting layer,
 a second light-emitting element being capable of emitting green light, the second light-emitting element comprising:
  a second transparent conductive film;
  the first light-emitting layer over the second transparent conductive film;
  the second light-emitting layer over the first light-emitting layer; and
  the electrode over the second light-emitting layer,
 a third light-emitting element being capable of emitting red light, the third light-emitting element comprising:
  a third transparent conductive film;
  the first light-emitting layer over the third transparent conductive film;

the second light-emitting layer over the first light-emitting layer; and the electrode over the second light-emitting layer, and a fourth light-emitting element being capable of emitting white light, the fourth light-emitting element comprising:

a fourth transparent conductive film;

the first light-emitting layer over the fourth transparent conductive film;

the second light-emitting layer over the first light-emitting layer; and the electrode over the second light-emitting layer, wherein the first transparent conductive film has a first region, wherein the second transparent conductive film has a second region, wherein the third transparent conductive film has a third region, wherein the fourth transparent conductive film has a fourth region, wherein the first region is thicker than the third region and the fourth region, wherein each of the third region and the fourth region is thicker than the second region, wherein the first light-emitting layer comprises a fluorescent compound, and wherein the second light-emitting layer comprises a phosphorescent compound.

8. The light-emitting device according to claim 7, wherein the first light-emitting layer comprises a first light-emitting substance emitting light of at least one of violet, blue, and blue green, and wherein the second light-emitting layer comprises a second light-emitting substance emitting light of at least one of green, yellow green, yellow, orange, and red.

9. The light-emitting device according to claim 7, further comprising a first reflective electrode in contact with the first transparent conductive film, wherein an optical path length between the first reflective electrode and the first light-emitting layer is greater than or equal to $\tfrac{3}{4}\lambda_B$, $\lambda_B$ being a wavelength range of greater than or equal to 420 nm and less than or equal to 480 nm, and wherein the first reflective electrode comprises silver.

10. The light-emitting device according to claim 7, further comprising:

a second reflective electrode in contact with the second transparent conductive film; and a third reflective electrode in contact with the third transparent conductive film, wherein an optical path length between the second reflective electrode and the first light-emitting layer is less than $\tfrac{3}{4}\lambda_G$, $\lambda_G$ being a wavelength range of greater than or equal to 500 nm and less than 550 nm, wherein an optical path length between the third reflective electrode and the first light-emitting layer is less than $\tfrac{3}{4}\lambda_R$, $\lambda_R$ being a wavelength range of greater than or equal to 600 nm and less than or equal to 740 nm, wherein the second reflective electrode comprises silver, and wherein the third reflective electrode comprises silver.

11. The light-emitting device according to claim 7, further comprising:

a second reflective electrode in contact with the second transparent conductive film; and a third reflective electrode in contact with the third transparent conductive film, wherein an optical path length between the second reflective electrode and the second light-emitting layer is around $\tfrac{3}{4}\lambda_G$, $\lambda_G$ being a wavelength range of greater than or equal to 500 nm and less than 550 nm, wherein an optical path length between the third reflective electrode and the second light-emitting layer is around $\tfrac{3}{4}\lambda_R$, $\lambda_R$ being a wavelength range of greater than or equal to 600 nm and less than or equal to 740 nm, wherein the second reflective electrode comprises silver, and wherein the third reflective electrode comprises silver.

12. An electronic device comprising:

the light-emitting device according to claim 7, and at least one of a housing and a touch sensor.

* * * * *